US012744016B2

(12) United States Patent
Umezaki

(10) Patent No.: US 12,744,016 B2
(45) **Date of Patent: *Sep. 22, 2026**

(54) LIQUID CRYSTAL DISPLAY DEVICE AND ELECTRONIC DEVICE INCLUDING THE SAME

(71) Applicant: Semiconductor Energy Laboratory Co., Ltd., Kanagawa-ken (JP)

(72) Inventor: Atsushi Umezaki, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 3 days.

This patent is subject to a terminal disclaimer.

(21) Appl. No.: 18/639,746

(22) Filed: Apr. 18, 2024

(65) Prior Publication Data

US 2025/0372058 A1 Dec. 4, 2025

Related U.S. Application Data

(63) Continuation of application No. 18/234,752, filed on Aug. 16, 2023, now Pat. No. 12,027,133, which is a (Continued)

(30) Foreign Application Priority Data

Jan. 16, 2009 (JP) ................................ 2009-007419

(51) Int. Cl.
*G09G 3/36* (2006.01)
*G02F 1/1345* (2006.01)
(Continued)

(52) U.S. Cl.
CPC ....... *G09G 3/3674* (2013.01); *G02F 1/13454* (2013.01); *G02F 1/136286* (2013.01);
(Continued)

(58) Field of Classification Search
CPC ......... G09G 2310/0286; G09G 3/3677; G09G 2310/0267; G09G 3/3674; G09G 3/36;
(Continued)

(56) References Cited

U.S. PATENT DOCUMENTS 5,002,367 A 3/1991 Nicholas
5,003,356 A 3/1991 Wakai et al.
(Continued)

FOREIGN PATENT DOCUMENTS

CN 101154343 A 4/2008
CN 101303896 A 11/2008
(Continued)

OTHER PUBLICATIONS

Taiwanese Office Action (Application No. 113133292) Dated Aug. 4, 2025.
(Continued)

*Primary Examiner* — Sanjiv D. Patel
(74) *Attorney, Agent, or Firm* — Husch Blackwell LLP

(57) ABSTRACT

A driver circuit includes first to third transistors, a first circuit, and a second circuit. In the first transistor, a first terminal is electrically connected to a second wiring, a second terminal is electrically connected to a first wiring, and a gate is electrically connected to the second circuit and a first terminal of the third transistor. In the second transistor, a first terminal is electrically connected to the first wiring, a second terminal is electrically connected to a sixth wiring, a gate is electrically connected to the first circuit and a gate of the third transistor. A second terminal of the third transistor is electrically connected to the sixth wiring. The first circuit is electrically connected to a third wiring, a fourth wiring, a fifth wiring, and the sixth wiring. The second circuit is electrically connected to the first wiring, the second wiring, and the sixth wiring.

14 Claims, 34 Drawing Sheets

Related U.S. Application Data continuation of application No. 17/961,062, filed on Oct. 6, 2022, now Pat. No. 11,735,133, which is a continuation of application No. 17/502,352, filed on Oct. 15, 2021, now Pat. No. 11,468,857, which is a continuation of application No. 16/985,586, filed on Aug. 5, 2020, now Pat. No. 11,151,953, which is a continuation of application No. 16/447,357, filed on Jun. 20, 2019, now Pat. No. 10,741,138, which is a continuation of application No. 15/807,119, filed on Nov. 8, 2017, now Pat. No. 10,332,610, which is a continuation of application No. 14/285,819, filed on May 23, 2014, now abandoned, which is a continuation of application No. 13/742,662, filed on Jan. 16, 2013, now Pat. No. 8,736,539, which is a continuation of application No. 12/685,439, filed on Jan. 11, 2010, now Pat. No. 8,363,000.

(51) Int. Cl.

| | |
|---|---|
| ***G02F 1/1362*** | (2006.01) |
| ***G11C 19/28*** | (2006.01) |
| ***H10D 30/67*** | (2025.01) |
| ***H10W 20/43*** | (2026.01) |
| *G02F 1/136* | (2006.01) |
| *H10D 86/40* | (2025.01) |
| *H10D 86/60* | (2025.01) |

(52) U.S. Cl.

CPC ........... *G09G 3/3677* (2013.01); *G11C 19/28* (2013.01); *H10D 30/67* (2025.01); *H10W 20/43* (2026.01); *G02F 1/13606* (2021.01); *G02F 2201/124* (2013.01); *G09G 3/3688* (2013.01); *G09G 2300/0408* (2013.01); *G09G 2300/0417* (2013.01); *G09G 2310/0286* (2013.01); *H10D 30/6755* (2025.01); *H10D 86/40* (2025.01); *H10D 86/60* (2025.01)

(58) Field of Classification Search

CPC ..... G11C 19/184; G11C 19/00; G11C 19/287; G11C 19/28

See application file for complete search history.

(56) References Cited

U.S. PATENT DOCUMENTS 5,032,883 A 7/1991 Wakai et al.
5,055,899 A 10/1991 Wakai et al.
5,166,085 A 11/1992 Wakai et al.
5,229,644 A 7/1993 Wakai et al.
5,327,001 A 7/1994 Wakai et al.
5,610,414 A 3/1997 Yoneda et al.
5,701,136 A 12/1997 Huq et al.
6,055,034 A 4/2000 Zhang et al.
6,246,460 B1 6/2001 Young
6,249,333 B1 6/2001 Zhang et al.
6,304,243 B1 10/2001 Kondo et al.
6,498,596 B1 12/2002 Nakamura et al.
6,549,184 B1 4/2003 Koyama et al.
6,563,174 B2 5/2003 Kawasaki et al.
6,690,347 B2 2/2004 Jeon et al.
6,737,306 B2 5/2004 Yamazaki et al.
6,756,816 B2 6/2004 Miyake
6,787,807 B2 9/2004 Yamazaki et al.
6,803,886 B2 10/2004 Kondo et al.
6,834,095 B2 12/2004 Yu
6,845,140 B2 1/2005 Moon et al.
6,855,954 B1 2/2005 Zhang
6,891,916 B2 5/2005 Park et al.
6,906,385 B2 6/2005 Moon et al.
6,922,217 B2 7/2005 Kim
6,956,235 B2 10/2005 Yamazaki et al.
7,002,545 B2 2/2006 Osame
7,023,410 B2 4/2006 Lee et al.
7,061,014 B2 6/2006 Hosono et al.
7,068,076 B2 6/2006 Azami
7,084,668 B2 8/2006 Miyake
7,142,273 B1 11/2006 Zhang et al.
7,161,179 B2 1/2007 Yamazaki et al.
7,230,601 B2 6/2007 Yamazaki et al.
7,233,308 B2 6/2007 Park
7,289,096 B2 10/2007 Jeon et al.
7,289,593 B2 10/2007 Tobita et al.
7,298,447 B1 11/2007 Zhang et al.
7,304,625 B2 12/2007 Koyama et al.
7,315,296 B2 1/2008 Koyama et al.
7,317,779 B2 1/2008 Moon et al.
7,379,148 B2 5/2008 Kim
7,403,038 B2 7/2008 Azami
7,403,586 B2 7/2008 Tobita et al.
7,405,716 B2 7/2008 Lee et al.
7,486,268 B2 2/2009 Jang et al.
7,486,269 B2 2/2009 Moon
7,499,518 B2 3/2009 Tobita et al.
7,528,820 B2 5/2009 Yoon et al.
7,535,027 B2 5/2009 Moon et al.
7,576,723 B2 8/2009 Lee et al.
7,589,708 B2 9/2009 Osame
7,646,841 B2 1/2010 Moon et al.
7,667,817 B2 2/2010 Zhang et al.
7,670,925 B2 3/2010 Kitada et al.
7,674,650 B2 3/2010 Akimoto et al.
7,679,594 B2 3/2010 Jang et al.
7,687,808 B2 3/2010 Umezaki
7,692,617 B2 4/2010 Kim et al.
7,696,974 B2 4/2010 Moon et al.
7,704,859 B2 4/2010 Sato
7,732,819 B2 6/2010 Akimoto et al.
7,745,824 B2 6/2010 Yamazaki et al.
7,844,026 B2 11/2010 Chiang et al.
7,859,510 B2 12/2010 Umezaki
7,910,490 B2 3/2011 Akimoto et al.
7,932,521 B2 4/2011 Akimoto et al.
7,936,332 B2 5/2011 Lee et al.
7,964,876 B2 6/2011 Umezaki
7,978,274 B2 7/2011 Umezaki et al.
7,990,514 B2 8/2011 Zhang et al.
8,008,690 B2 8/2011 Moon et al.
8,023,610 B2 9/2011 Miyayama et al.
8,054,270 B2 11/2011 Koyama et al.
8,054,279 B2 11/2011 Umezaki et al.
8,089,446 B2 1/2012 Pak et al.
8,093,601 B2 1/2012 Miyamoto et al.
8,102,340 B2 1/2012 Lee et al.
8,154,493 B2 4/2012 Kimura et al.
8,194,057 B2 6/2012 Lee et al.
8,274,077 B2 9/2012 Akimoto et al.
8,310,432 B2 11/2012 Lee et al.
8,319,277 B2 11/2012 Kitada et al.
8,330,492 B2 12/2012 Umezaki
8,334,964 B2 12/2012 Zhang et al.
8,363,000 B2 1/2013 Umezaki
8,373,631 B2 2/2013 Koyama et al.
8,456,396 B2 6/2013 Umezaki
8,462,100 B2 6/2013 Umezaki
8,466,463 B2 6/2013 Akimoto et al.
8,493,524 B2 7/2013 Her et al.
8,520,159 B2 8/2013 Umezaki et al.
8,598,591 B2 12/2013 Umezaki
8,605,027 B2 12/2013 Pak et al.
8,610,179 B2 12/2013 Moon et al.
8,619,207 B2 12/2013 Kim
8,629,069 B2 1/2014 Akimoto et al.
8,629,823 B2 1/2014 Koyama et al.
8,643,586 B2 2/2014 Umezaki
8,669,550 B2 3/2014 Akimoto et al.
8,736,539 B2 5/2014 Umezaki
8,742,811 B2 6/2014 Umezaki
8,743,044 B2 6/2014 Umezaki et al.
8,790,959 B2 7/2014 Akimoto et al.
8,796,069 B2 8/2014 Akimoto et al.

(56) References Cited

U.S. PATENT DOCUMENTS

| | | | |
|---|---|---|---|
| 8,902,145 B2 | 12/2014 | Umezaki et al. | |
| 9,070,593 B2 | 6/2015 | Umezaki | |
| 9,099,562 B2 | 8/2015 | Akimoto et al. | |
| 9,184,183 B2 | 11/2015 | Umezaki | |
| 9,214,473 B2 | 12/2015 | Umezaki | |
| 9,245,891 B2 | 1/2016 | Umezaki | |
| 9,310,657 B2 | 4/2016 | Kim et al. | |
| 9,335,599 B2 | 5/2016 | Umezaki | |
| 9,454,049 B2 | 9/2016 | Kim | |
| 9,536,903 B2 | 1/2017 | Umezaki et al. | |
| 9,583,513 B2 | 2/2017 | Umezaki | |
| 9,684,215 B2 | 6/2017 | Umezaki | |
| 9,842,861 B2 | 12/2017 | Umezaki et al. | |
| 9,874,794 B2 | 1/2018 | Kim et al. | |
| 10,025,149 B2 | 7/2018 | Kim et al. | |
| 10,062,716 B2 | 8/2018 | Umezaki | |
| 10,088,725 B2 | 10/2018 | Umezaki | |
| 10,134,775 B2 | 11/2018 | Umezaki | |
| 10,216,053 B2 | 2/2019 | Kim | |
| 10,297,618 B2 | 5/2019 | Umezaki et al. | |
| 10,304,962 B2 | 5/2019 | Akimoto et al. | |
| 10,332,610 B2 | 6/2019 | Umezaki | |
| 10,338,443 B2 | 7/2019 | Kim | |
| 10,401,699 B2 | 9/2019 | Umezaki | |
| 10,553,618 B2 | 2/2020 | Umezaki | |
| 10,606,140 B2 | 3/2020 | Umezaki | |
| 10,741,138 B2 | 8/2020 | Umezaki | |
| 10,930,683 B2 | 2/2021 | Umezaki et al. | |
| 11,151,953 B2 | 10/2021 | Umezaki | |
| 11,194,203 B2 | 12/2021 | Umezaki | |
| 11,468,857 B2 | 10/2022 | Umezaki | |
| 11,967,598 B2 | 4/2024 | Umezaki et al. | |
| 12,183,832 B2 | 12/2024 | Akimoto et al. | |
| 2001/0022644 A1 | 9/2001 | Hinata | |
| 2003/0160752 A1 | 8/2003 | Park | |
| 2003/0189542 A1 | 10/2003 | Lee et al. | |
| 2003/0222311 A1 | 12/2003 | Kim | |
| 2004/0109526 A1 | 6/2004 | Park et al. | |
| 2004/0234020 A1 | 11/2004 | Yu | |
| 2005/0008114 A1 | 1/2005 | Moon | |
| 2005/0088386 A1 | 4/2005 | Kao et al. | |
| 2005/0156858 A1 | 7/2005 | Ahn et al. | |
| 2005/0220262 A1 | 10/2005 | Moon | |
| 2005/0264507 A1 | 12/2005 | Jang et al. | |
| 2006/0001637 A1 | 1/2006 | Pak et al. | |
| 2006/0007085 A1 | 1/2006 | Kim et al. | |
| 2006/0017681 A1 | 1/2006 | Jang et al. | |
| 2006/0022201 A1 | 2/2006 | Kim et al. | |
| 2006/0056267 A1 | 3/2006 | Kim et al. | |
| 2006/0151745 A1 | 7/2006 | Kim et al. | |
| 2006/0220587 A1 | 10/2006 | Tobita et al. | |
| 2006/0238482 A1 | 10/2006 | Jang et al. | |
| 2006/0244107 A1 | 11/2006 | Sugihara et al. | |
| 2006/0279511 A1 | 12/2006 | Uh et al. | |
| 2007/0035505 A1 | 2/2007 | Lin et al. | |
| 2007/0040793 A1 | 2/2007 | Kim et al. | |
| 2007/0046327 A1 | 3/2007 | Wei et al. | |
| 2007/0089000 A1 | 4/2007 | Shin | |
| 2007/0274433 A1 | 11/2007 | Tobita | |
| 2007/0296662 A1 | 12/2007 | Lee et al. | |
| 2008/0007296 A1 | 1/2008 | Umezaki | |
| 2008/0012816 A1 | 1/2008 | Moon | |
| 2008/0018572 A1 | 1/2008 | Shin et al. | |
| 2008/0042965 A1 | 2/2008 | Cheng et al. | |
| 2008/0056430 A1 | 3/2008 | Chang et al. | |
| 2008/0062112 A1 | 3/2008 | Umezaki | |
| 2008/0068326 A1* | 3/2008 | Chen .................... | G09G 3/3677 345/100 |
| 2008/0079001 A1 | 4/2008 | Umezaki et al. | |
| 2008/0079685 A1 | 4/2008 | Umezaki et al. | |
| 2008/0088564 A1 | 4/2008 | Chang et al. | |
| 2008/0123799 A1 | 5/2008 | Otose | |
| 2008/0150586 A1 | 6/2008 | Kitada et al. | |
| 2008/0150875 A1 | 6/2008 | Leong et al. | |
| 2008/0211760 A1 | 9/2008 | Baek et al. | |
| 2008/0217618 A1 | 9/2008 | Deane | |
| 2008/0231617 A1 | 9/2008 | Miyake et al. | |
| 2008/0246716 A1 | 10/2008 | Miyake et al. | |
| 2008/0297495 A1 | 12/2008 | Jung et al. | |
| 2008/0308805 A1 | 12/2008 | Akimoto et al. | |
| 2008/0316414 A1 | 12/2008 | Nakagawa et al. | |
| 2009/0027083 A1 | 1/2009 | Kimura et al. | |
| 2009/0032812 A1 | 2/2009 | Herman et al. | |
| 2009/0051639 A1 | 2/2009 | Liu et al. | |
| 2009/0224245 A1 | 9/2009 | Umezaki | |
| 2009/0230389 A1 | 9/2009 | Chen et al. | |
| 2010/0179679 A1 | 7/2010 | Liao | |
| 2011/0104851 A1 | 5/2011 | Akimoto et al. | |
| 2011/0121290 A1 | 5/2011 | Akimoto et al. | |
| 2011/0122988 A1 | 5/2011 | Miyayama et al. | |
| 2013/0293800 A1 | 11/2013 | Her et al. | |
| 2013/0341616 A1 | 12/2013 | Umezaki et al. | |
| 2014/0110731 A1 | 4/2014 | Umezaki | |
| 2014/0191934 A1 | 7/2014 | Koyama et al. | |
| 2014/0254744 A1 | 9/2014 | Umezaki | |
| 2015/0137118 A1 | 5/2015 | Umezaki et al. | |
| 2016/0111452 A1 | 4/2016 | Umezaki | |
| 2016/0238916 A1 | 8/2016 | Umezaki | |
| 2019/0051759 A1 | 2/2019 | Akimoto et al. | |
| 2019/0288011 A1 | 9/2019 | Umezaki | |
| 2019/0326444 A1 | 10/2019 | Akimoto et al. | |
| 2021/0320128 A1 | 10/2021 | Umezaki et al. | |
| 2022/0091467 A1 | 3/2022 | Umezaki | |
| 2022/0328529 A1 | 10/2022 | Umezaki et al. | |
| 2024/0153963 A1 | 5/2024 | Umezaki et al. | |

FOREIGN PATENT DOCUMENTS

| | | | |
|---|---|---|---|
| EP | 0317011 | A | 5/1989 |
| EP | 0593266 | A | 4/1994 |
| EP | 1231594 | A | 8/2002 |
| EP | 1280162 | A | 1/2003 |
| EP | 1445862 | A | 8/2004 |
| EP | 1770788 | A | 4/2007 |
| EP | 1870877 | A | 12/2007 |
| EP | 1881365 | A | 1/2008 |
| EP | 1895545 | A | 3/2008 |
| EP | 1901277 | A | 3/2008 |
| EP | 1906414 | A | 4/2008 |
| EP | 1995787 | A | 11/2008 |
| EP | 1998373 | A | 12/2008 |
| EP | 1998374 | A | 12/2008 |
| EP | 1998375 | A | 12/2008 |
| EP | 2071555 | A | 6/2009 |
| EP | 2337033 | A | 6/2011 |
| EP | 3223283 | A | 9/2017 |
| EP | 3614442 | A | 2/2020 |
| JP | 64-082674 | A | 3/1989 |
| JP | 01-166020 | A | 6/1989 |
| JP | 04-221830 | A | 8/1992 |
| JP | 05-090427 | A | 4/1993 |
| JP | 06-013376 | A | 1/1994 |
| JP | 06-202160 | A | 7/1994 |
| JP | 10-010578 | A | 1/1998 |
| JP | 2001-160299 | A | 6/2001 |
| JP | 2001-176288 | A | 6/2001 |
| JP | 2002-083974 | A | 3/2002 |
| JP | 2002-196697 | A | 7/2002 |
| JP | 2002-258819 | A | 9/2002 |
| JP | 2002-530719 | | 9/2002 |
| JP | 2002-328617 | A | 11/2002 |
| JP | 2003-043976 | A | 2/2003 |
| JP | 2003-167543 | A | 6/2003 |
| JP | 2004-078172 | A | 3/2004 |
| JP | 2004-246358 | A | 9/2004 |
| JP | 2004-274050 | A | 9/2004 |
| JP | 2004-348940 | A | 12/2004 |
| JP | 2005-050502 | A | 2/2005 |
| JP | 2005-134780 | A | 5/2005 |
| JP | 2005-143068 | A | 6/2005 |
| JP | 2005-522734 | | 7/2005 |
| JP | 2005-222688 | A | 8/2005 |
| JP | 2005-251348 | A | 9/2005 |
| JP | 2005-352455 | A | 12/2005 |

(56) References Cited

FOREIGN PATENT DOCUMENTS

| | | | |
|---|---|---|---|
| JP | 2006-003889 | A | 1/2006 |
| JP | 2006-024350 | A | 1/2006 |
| JP | 2006-039524 | A | 2/2006 |
| JP | 2006-079041 | A | 3/2006 |
| JP | 2006-189762 | A | 7/2006 |
| JP | 2006-191026 | A | 7/2006 |
| JP | 2006-277860 | A | 10/2006 |
| JP | 2006-351171 | A | 12/2006 |
| JP | 2007-123861 | A | 5/2007 |
| JP | 2007-151092 | A | 6/2007 |
| JP | 2007-179660 | A | 7/2007 |
| JP | 2007-180110 | A | 7/2007 |
| JP | 2007-207413 | A | 8/2007 |
| JP | 2007-316110 | A | 12/2007 |
| JP | 2007-317288 | A | 12/2007 |
| JP | 2008-003602 | A | 1/2008 |
| JP | 2008-009393 | A | 1/2008 |
| JP | 2008-009396 | A | 1/2008 |
| JP | 2008-026865 | A | 2/2008 |
| JP | 2008-058939 | A | 3/2008 |
| JP | 2008-077051 | A | 4/2008 |
| JP | 2008-083692 | A | 4/2008 |
| JP | 2008-089874 | A | 4/2008 |
| JP | 2008-089915 | A | 4/2008 |
| JP | 2008-107807 | A | 5/2008 |
| JP | 2008-146079 | A | 6/2008 |
| JP | 2008-159608 | A | 7/2008 |
| JP | 2008-193545 | A | 8/2008 |
| JP | 2008-251094 | A | 10/2008 |
| JP | 2020-187818 | A | 11/2020 |
| KR | 2003-0091571 | A | 12/2003 |
| KR | 2004-0061210 | A | 7/2004 |
| KR | 2005-0109222 | A | 11/2005 |
| KR | 2007-0002470 | A | 1/2007 |
| KR | 2007-0065770 | A | 6/2007 |
| KR | 2007-0082414 | A | 8/2007 |
| KR | 2008-0021557 | A | 3/2008 |
| KR | 2008-0029807 | A | 4/2008 |
| TW | 459267 | | 10/2001 |
| TW | 541704 | | 7/2003 |
| TW | 564430 | | 12/2003 |
| TW | 594113 | | 6/2004 |
| TW | I228615 | | 3/2005 |
| TW | 200622971 | | 7/2006 |
| TW | I277934 | | 4/2007 |
| TW | I292137 | | 1/2008 |
| TW | I293444 | | 2/2008 |
| TW | 200820171 | | 5/2008 |
| TW | 200826052 | | 6/2008 |
| TW | 200828237 | | 7/2008 |
| WO | WO-2000/031581 | | 6/2000 |
| WO | WO-2002/065062 | | 8/2002 |
| WO | WO-2003/087921 | | 10/2003 |
| WO | WO-2003/100511 | | 12/2003 |
| WO | WO-2003/107314 | | 12/2003 |
| WO | WO-2007/013009 | | 2/2007 |
| WO | WO-2007/080813 | | 7/2007 |
| WO | WO-2008/038635 | | 4/2008 |

OTHER PUBLICATIONS

Moon.S et al., “46.1: Invited Paper: Integrated a-Si:H TFT Gate Driver Circuits on Large Area TFT-LCDs”, SID Digest ’07 : SID International Symposium Digest of Technical Papers, May 22, 2007, vol. 38, pp. 1478-1481.

Taiwanese Office Action (Application No. 98145497) Dated Sep. 10, 2014.

Korean Office Action (Application No. 2014-0060331) Dated Feb. 23, 2015.

Taiwanese Office Action (Application No. 105133890) Dated Feb. 17, 2017.

Taiwanese Office Action (Application No. 106121117) Dated Nov. 22, 2017.

Taiwanese Office Action (Application No. 108121453) Dated Apr. 8, 2020.

Taiwanese Office Action (Application No. 111150949) Dated Nov. 20, 2023.

* cited by examiner

FIG. 2A PERIOD T1
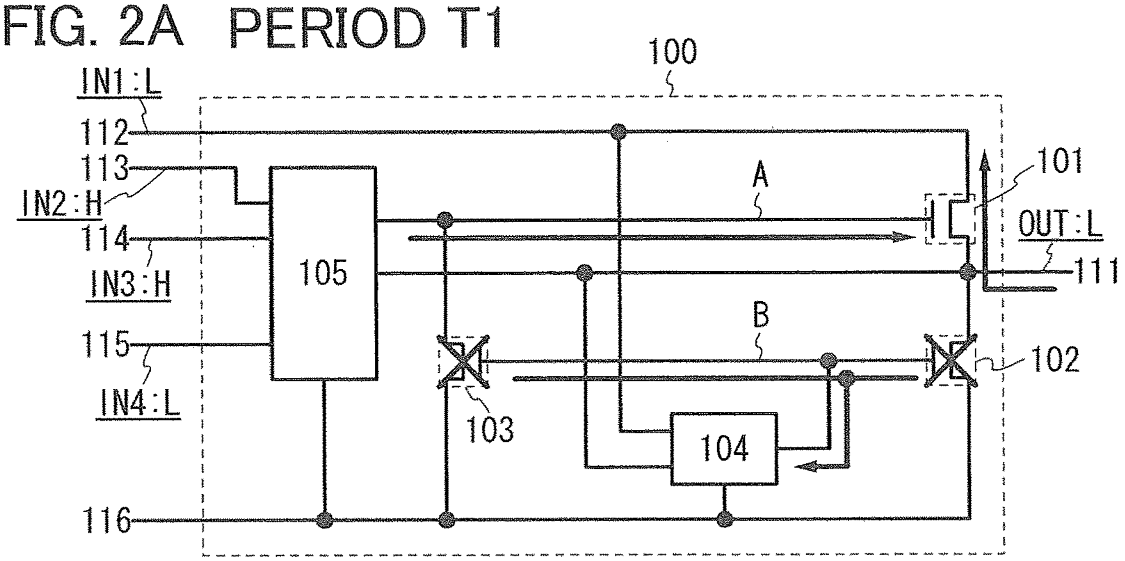
FIG. 2B PERIOD T2
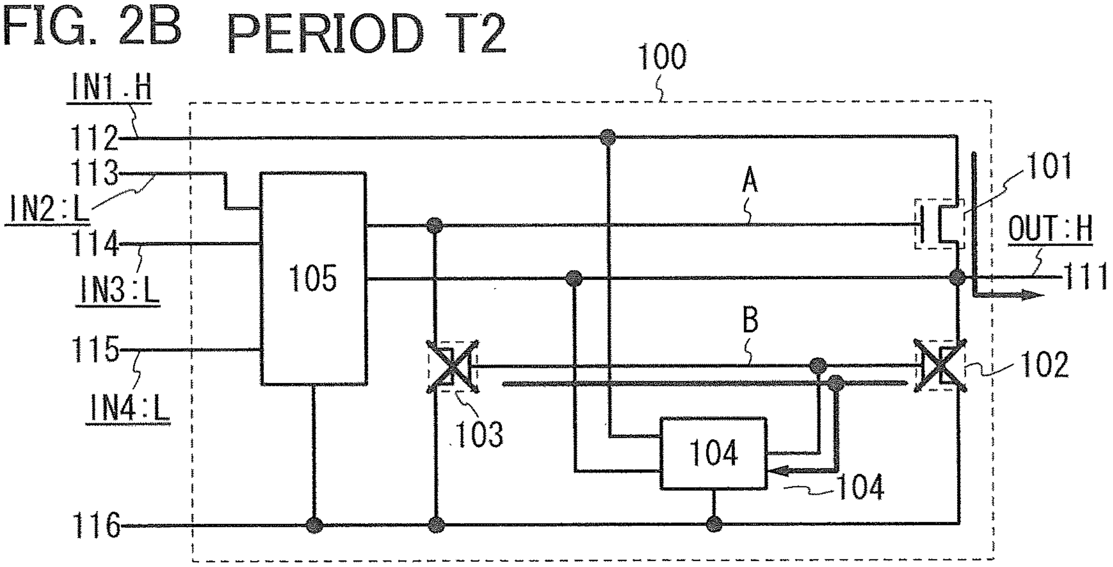
FIG. 2C PERIOD T3
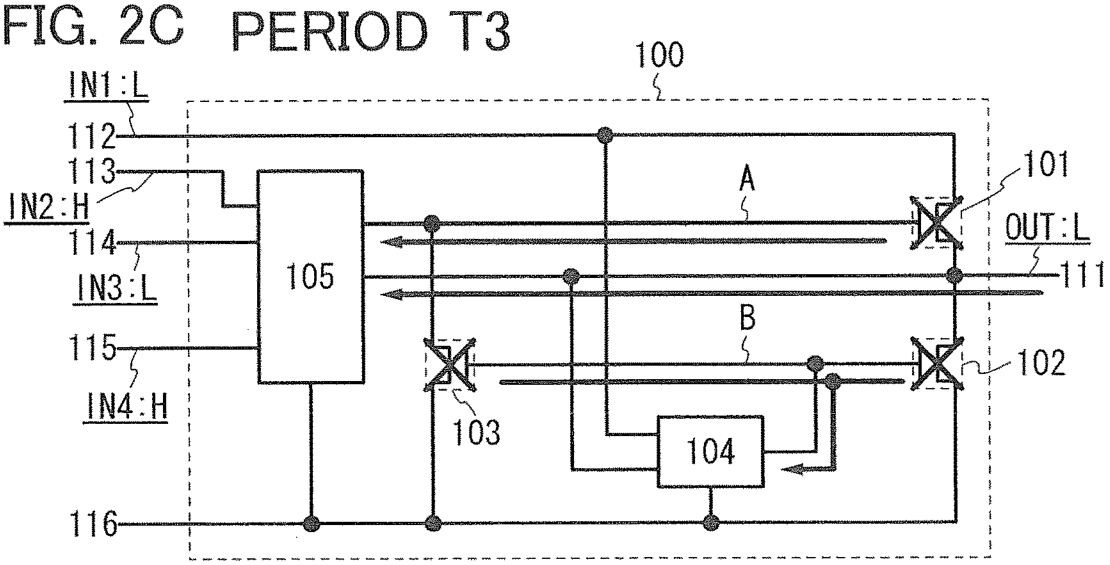

PERIOD T4

PERIOD T5

121
112
105a
101
113
105e
A
114
105
111
105b
105f
B
115
102
104a
104d
105c
103
105d
104
104b
116
104c

PERIOD T1

PERIOD T2

PERIOD T3

PERIOD T4

PERIOD T5

FIG. 12A
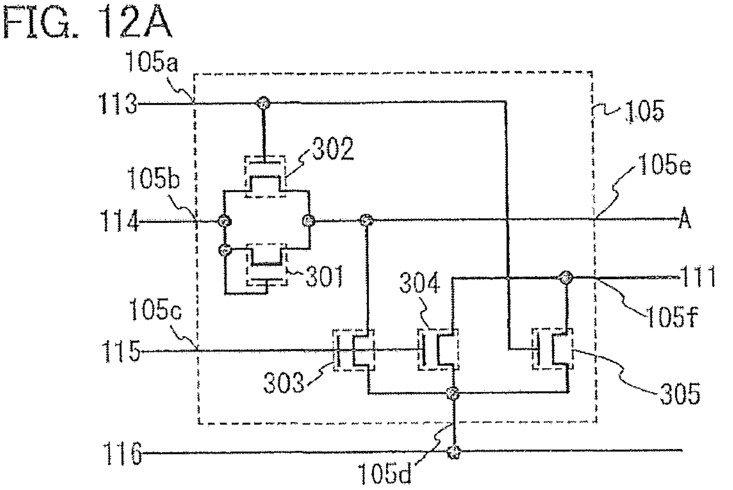
FIG. 12B PERIOD T1
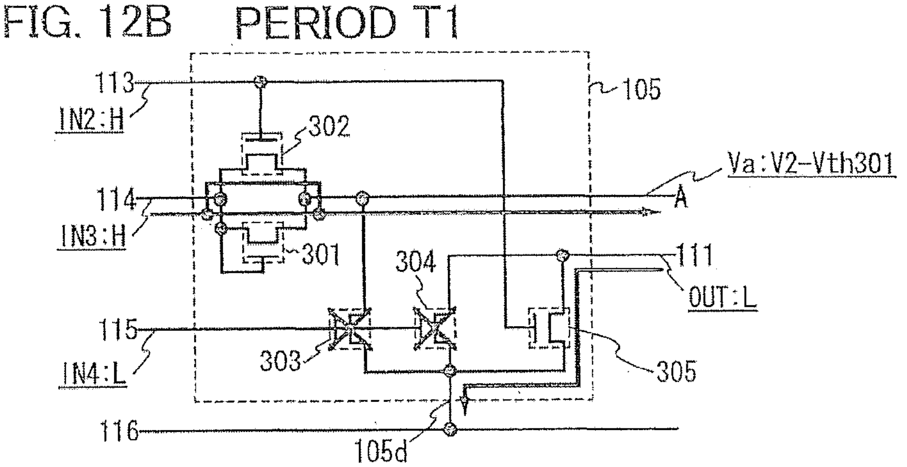
FIG. 12C PERIOD T2
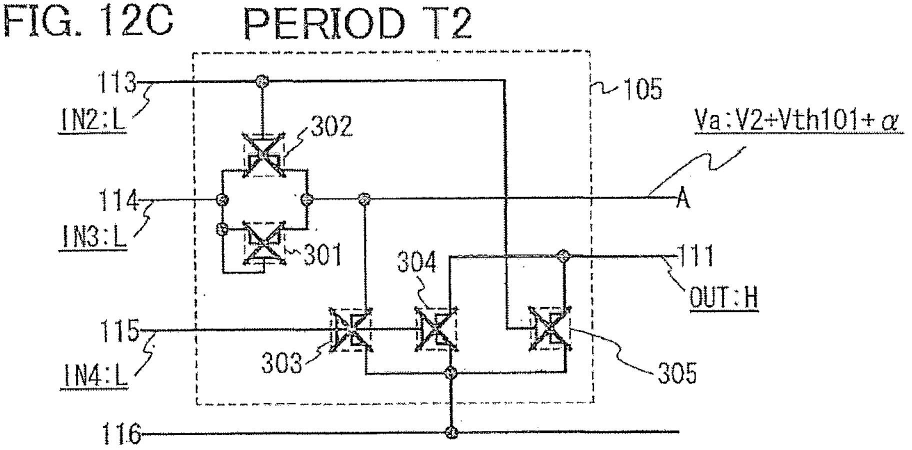

FIG. 13A PERIOD T3
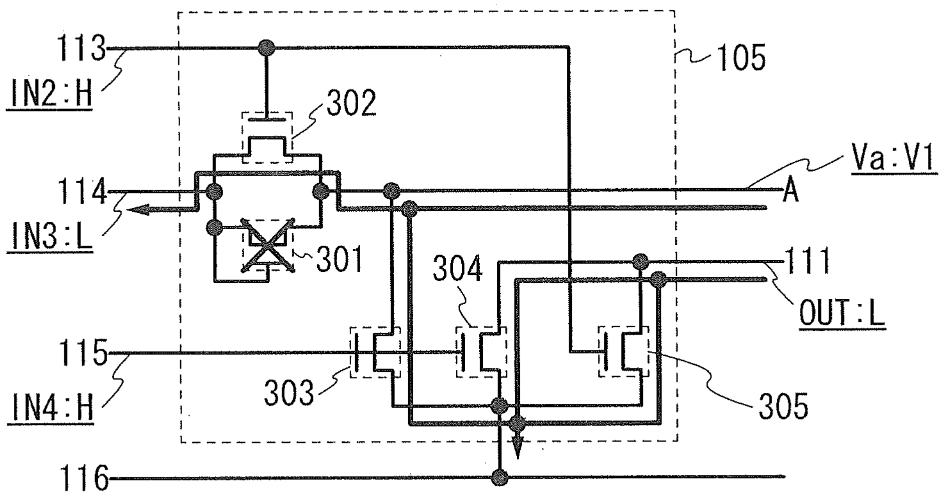
FIG. 13B PERIOD T4
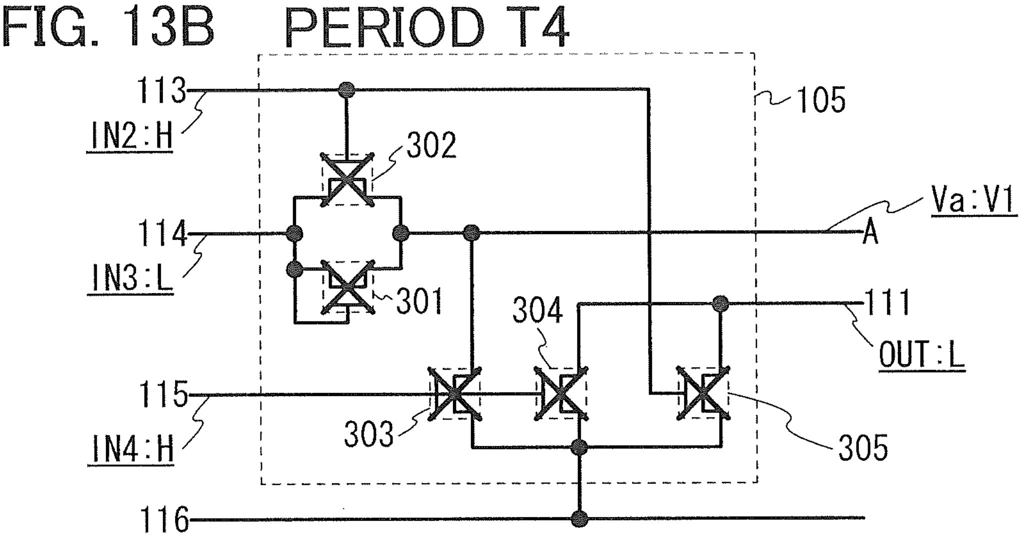
FIG. 13C PERIOD T5
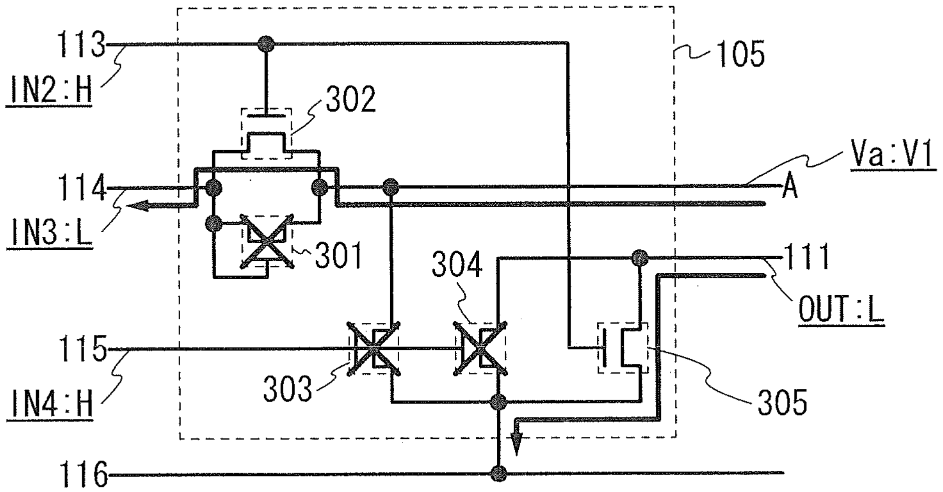

100
105
112
113
105a
302
105e
101
105f
114
105b
304
305
111
301
102
115
303
103
105c
104
105d
104a
104d
116
104b
104c 100
105
112
113
105a
302
105e
101
105f
114
105b
304
305
111
301
203
201
102
115
303
103
105c
105d
104a
104a
104b
202
116
104
204
104c 412
413
415
416
414
113
112
401_1
101
105
411_1
114
115
103
104
102
431
116
417_1
401_2
411_2
417_2
401_3
411_3
417_3
401_N-1
411_N-1
417_N-1
401_N
411_N
417_N 5361
5381
5362
5380
5363_1
5364
5363_2

5361
5362
5381
5380
5363_1
5364
5363_2

5361
5362
5362b
5381
5362a
5380
5363_1
5364
5363_2

5380
5361
5381
5362
5363_1
5364
5363_2

5361b
5361
5381
5361a
5362
5380
5363
5364
5363

A
B
5391
5393
5392

5408
5409
5410
5392
5407
5403b
5403a
5401
5404
5406
5405
5402
5400

5408
5409
5410
5392
5407
5403b
5403a
5401
5404
5406
5405
5402
5400

113
112
401_i
631
632
411_i-1
411_i
411_i+1
101
102
103
201
202
203
204
301
302
303
304
305
116
601
602
603
604
605

LIQUID CRYSTAL DISPLAY DEVICE AND ELECTRONIC DEVICE INCLUDING THE SAME

This application is a continuation of application Ser. No. 18/234,752 filed on Aug. 16, 2023 which is a continuation of application Ser. No. 17/961,062 filed on Oct. 6, 2022 (now U.S. Pat. No. 11,735,133 issued Aug. 22, 2023) which is a continuation of application Ser. No. 17/502,352 filed on Oct. 15, 2021 (now U.S. Pat. No. 11,468,857 issued Oct. 11, 2022) which is a continuation of application Ser. No. 16/985,586 filed on Aug. 5, 2020 (now U.S. Pat. No. 11,151,953 issued Oct. 19, 2021) which is a continuation of application Ser. No. 16/447,357 filed on Jun. 20, 2019 (now U.S. Pat. No. 10,741,138 issued Aug. 11, 2020) which is a continuation of application Ser. No. 15/807,119 filed on Nov. 8, 2017 (now U.S. Pat. No. 10,332,610 issued Jun. 25, 2019) which is a continuation of application Ser. No. 14/285,819 filed on May 23, 2014 (now abandoned) which is a continuation of application Ser. No. 13/742,662 filed on Jan. 16, 2013 (now U.S. Pat. No. 8,736,539 issued May 27, 2014) which is a continuation of application Ser. No. 12/685,439 filed on Jan. 11, 2010 (now U.S. Pat. No. 8,363,000 issued Jan. 29, 2013), which are all incorporated herein by reference.

BACKGROUND OF THE INVENTION

1. Field of the Invention

The present invention relates to a semiconductor device, a display device, a liquid crystal display device, a driving method thereof, or a producing method thereof. Specifically, the present invention relates to a semiconductor device, a display device, or a liquid crystal display device including a driver circuit formed over the same substrate as a pixel portion, or a driving method of the devices. Alternatively, the present invention relates to an electronic device including the semiconductor device, the display device, or the liquid crystal display device.

2. Description of the Related Art

In recent years, with the increase of large display devices such as liquid crystal televisions, display devices have been actively developed. Specifically, a technique of forming a driver circuit such as a gate driver over the same substrate as a pixel portion by using a transistor formed using a non-single-crystal semiconductor has been actively developed because the technique makes a great contribution for reduction in cost and improvement in reliability.

Deterioration such as increase in threshold voltage or decrease in mobility is caused in the transistor formed using the non-single-crystal semiconductor in some cases. As the deterioration of the transistor advances, there is a problem in that the driver circuit becomes hard to operate and an image cannot be displayed. Accordingly, Patent Document 1 discloses a shift register which can suppress the deterioration of the transistor. Specifically, in FIG. 7 in Patent Document 1, two transistors are used for suppression of the deterioration in characteristics of the transistors. One transistor is connected between an output terminal of a flip-flop and a wiring to which VSS (hereinafter referred to as negative power supply) is supplied. The other transistor is connected between the output terminal of the flip-flop and a gate of a pull-up transistor. Then, during a period in which an output signal from the flip-flop is in an L level, the two transistors are alternately turned on. When the one transistor is turned on, VSS is supplied to the output terminal of the flip-flop through the one transistor. When the other transistor is turned on, VSS which is supplied to the gate of the pull-up transistor is supplied to the output terminal of the flip-flop through the other transistor. In this manner, the deterioration of the transistor can be suppressed. Further, since VSS is always supplied to the output terminal of the flip-flop, the output signal from the flip-flop is easily maintained as the L level.

REFERENCE

Patent Document

[Patent Document 1] Japanese Published Patent Application No. 2005-50502

SUMMARY OF THE INVENTION

In a structure disclosed by Patent Document 1, since the other transistor is turned on for a while during a period in which the output signal from the flip-flop is in an H level, the gate of the pull-up transistor and the output terminal of the flip-flop are brought into electrical conduction for a while. At that time, the gate of the pull-up transistor has high potential, and the output terminal of the flip-flop has low potential. According to one embodiment of the present invention, it is an object to increase the potential of the gate of the pull-up transistor.

Alternatively, when the potential of the gate of the pull-up transistor is decreased, the pull-up transistor is turned off in some cases. According to one embodiment of the present invention, it is an object to prevent malfunction of a shift register.

Alternatively, even if the pull-up transistor is turned on and the shift register can normally operates, the potential of the gate of the pull-up transistor is decreased. According to one embodiment of the present invention, it is an object to increase a potential difference (Vgs) between the gate and a source of the pull-up transistor.

Alternatively, if Vgs of the pull-up transistor is reduced, the on-resistance of the pull-up transistor is increased. According to one embodiment of the present invention, it is an object to reduce the size of a display device. Alternatively, according to one embodiment of the present invention, it is an object to obtain a high-definition display device.

Alternatively, if Vgs of the pull-up transistor is reduced, a rising time or a falling time of an output signal from the flip-flop becomes long. According to one embodiment of the present invention, it is an object to prevent a false signal (e.g., a video signal to a pixel which belongs to a different row) from being written to a pixel and to improve display quality.

Alternatively, if Vgs of the pull-up transistor is reduced, the channel width of the pull-up transistor needs to be large. In addition, if the channel width of the pull-up transistor is increased, the channel width of another transistor also needs to be large. According to one embodiment of the present invention, it is an object to reduce a layout area. Alternatively, according to one embodiment of the present invention, it is an object to reduce the size of a frame of a display device.

Alternatively, if the channel width of a transistor is increased, a gate and a source or drain of the transistor are easily short-circuited. According to one embodiment of the present invention, it is an object to improve yield. Alternatively, according to one embodiment of the present invention, it is an object to reduce cost.

Alternatively, if the channel width of the transistor is increased, the parasitic capacitance of the shift register is increased. According to one embodiment of the present invention, it is an object to reduce distortion, delay, or the like of a signal to be input to the shift register. Alternatively, according to one embodiment of the present invention, it is an object to reduce power consumption. In order to solve this, as a circuit which supplies a signal, voltage, or the like to the shift register, a circuit with high current capability needs to be used. According to one embodiment of the present invention, it is an object to reduce the size of an external circuit. Alternatively, according to one embodiment of the present invention, it is an object to reduce the size of a display device.

Note that description of the above-described objects does not interrupt the existence of another object.

According to one embodiment of the present invention, a liquid crystal display device includes a driver circuit including a first transistor, a second transistor, a third transistor, a first circuit, and a second circuit, and a pixel including a liquid crystal element. A first terminal of the first transistor is electrically connected to a second wiring functioning as a signal line or a clock signal line, a second terminal of the first transistor is electrically connected to a first wiring functioning as a signal line, a gate line, a scan line, or an output signal line, and a gate of the first transistor is electrically connected to the second circuit and a first terminal of the third transistor. A first terminal of the second transistor is electrically connected to the first wiring, a second terminal of the second transistor is electrically connected to a sixth wiring functioning as a power supply line or a ground line, and a gate of the second transistor is electrically connected the first circuit and a gate of the third transistor. A second terminal of the third transistor is electrically connected to the sixth wiring. The second circuit is electrically connected to a third wiring functioning as a signal line or a clock signal line, a fourth wiring functioning as a signal line, a fifth wiring functioning as a signal line, and the sixth wiring. The first circuit is electrically connected to the first wiring, the second wiring, and the sixth wiring.

According to one embodiment of the present invention, the first transistor may function as a bootstrap transistor for controlling timing when a signal of the second wiring is supplied to the first wiring in accordance with the potential of the gate of the first transistor.

According to one embodiment of the present invention, the second transistor may function as a switch for controlling an electrical conduction state of the sixth wiring and the first wiring in accordance with an output signal from the first circuit or the potential of the gate of the second transistor.

According to one embodiment of the present invention, the third transistor may function as a switch for controlling an electrical conduction state of the sixth wiring and the gate of the first transistor in accordance with an output signal from the first circuit.

According to one embodiment of the present invention, the first circuit may have a function of increasing, decreasing, and maintaining the potential of the gate of the second transistor or function as a controlling circuit for making the gate of the second transistor go into a floating state by controlling timing when the voltage of the sixth wiring is supplied to the gate of the second transistor in accordance with a signal from the first wiring or a signal from the second wiring.

According to one embodiment of the present invention, the second circuit may have a function of increasing, decreasing, and maintaining the potential of the gate of the first transistor or function as a controlling circuit for making the gate of the first transistor go into a floating state by controlling timing when a signal is supplied to the fourth wiring or when the voltage of the sixth wiring is supplied to the gate of the first transistor in accordance with a signal supplied to the third wiring, a signal supplied to the fourth wiring, or a signal supplied to the fifth wiring.

According to one embodiment of the present invention, the first circuit includes a fourth transistor, a fifth transistor, a sixth transistor, and a seventh transistor. A first terminal of the fourth transistor is electrically connected to the second wiring and a second terminal of the fourth transistor is electrically connected to the gate of the second transistor. A first terminal of the fifth transistor is electrically connected to the sixth wiring, a second terminal of the fifth transistor is electrically connected to the gate of the second transistor, and a gate of the fifth transistor is electrically connected to the first wiring. A first terminal of the sixth transistor is electrically connected to the second wiring, a second terminal of the sixth transistor is electrically connected to the gate of the fourth transistor, and a gate of the sixth transistor is electrically connected to the second wiring. A first terminal of the seventh transistor is electrically connected to the sixth wiring, a second terminal of the seventh transistor is electrically connected to the gate of the fourth transistor, and a gate of the seventh transistor is electrically connected to the first wiring.

According to one embodiment of the present invention, the second circuit includes an eighth transistor, a ninth transistor, a tenth transistor, an eleventh transistor, and a twelfth transistor. A first terminal of the eighth transistor is electrically connected to the fourth wiring, a second terminal of the eighth transistor is electrically connected to the gate of the first transistor, and a gate of the eighth transistor is electrically connected to the third wiring. A first terminal of the ninth transistor is electrically connected to the gate of the first transistor, a second terminal of the ninth transistor is electrically connected to the fourth wiring, and a gate of the ninth transistor is electrically connected to the fourth wiring. A first terminal of the tenth transistor is electrically connected to the gate of the first transistor, a second terminal of the tenth transistor is electrically connected to the sixth wiring, and a gate of the tenth transistor is electrically connected to the fifth wiring. A first terminal of the eleventh transistor is electrically connected to the first wiring, a second terminal of the eleventh transistor is electrically connected to the sixth wiring, and a gate of the eleventh transistor is electrically connected to the fifth wiring. A first terminal of the twelfth transistor is electrically connected to the first wiring, a second terminal of the twelfth transistor is electrically connected to the sixth wiring, and a gate of the twelfth transistor is electrically connected to the third wiring. According to one embodiment of the present invention, the driver circuit may be formed over the same substrate as the pixel.

According to one embodiment of the present invention, the channel width of the first transistor may be larger than that of the second transistor and the third transistor.

Note that a variety of switches can be used as a switch. For example, an electrical switch, a mechanical switch, or the like can be used. That is, any element can be used as long as it can control a current flow, without limitation to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), or the like can be used as a switch. Alternatively, a logic circuit in which such elements are combined can be used as a switch.

An example of a mechanical switch is a switch formed using a MEMS (micro electro mechanical system) technology, such as a digital micromirror device (DMD).

Note that a CMOS switch may be used as a switch by using both an n-channel transistor and a p-channel transistor.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

For example, in the case where A and B are electrically connected, one or more elements which enable electrical connection between A and B (e.g., a switch, a transistor, a capacitor, an inductor, a resistor, and/or a diode) may be connected between A and B. Alternatively, in the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) may be connected between A and B. For example, in the case where a signal output from A is transmitted to B even when another circuit is interposed between A and B, A and B are functionally connected.

Note that when it is explicitly described that "A and B are electrically connected", the case where A and B are electrically connected (i.e., the case where A and B are connected with another element or another circuit interposed therebetween), the case where A and B are functionally connected (i.e., the case where A and B are functionally connected with another circuit interposed therebetween), and the case where A and B are directly connected (i.e., the case where A and B are connected without another element or another circuit interposed therebetween) are included therein. That is, when it is explicitly described that "A and B are electrically connected", the description is the same as the case where it is explicitly only described that "A and B are connected".

Note that a display element, a display device which is a device including a display element, a light-emitting element, and a light-emitting device which is a device including a light-emitting element can employ various modes and can include various elements. For example, a display medium, whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube can be used as a display element, a display device, a light-emitting element, or a light-emitting device.

A liquid crystal element is an element which controls transmission or non-transmission of light by an optical modulation action of liquid crystals and includes a pair of electrodes and liquid crystals. The optical modulation action of liquid crystals is controlled by an electric field applied to the liquid crystal (including a lateral electric field, a vertical electric field and a diagonal electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, a blue phase mode, and the like. Note that the present invention is not limited to this, and various liquid crystal elements and driving methods can be used as a liquid crystal element and a driving method thereof.

Note that electroluminescence, a cold cathode fluorescent lamp, a hot cathode fluorescent lamp, an LED, a laser light source, a mercury lamp, or the like can be used as a light source. Note that the present invention is not limited to this, and a variety of light sources can be used as a light source.

Note that the structure of a transistor can be a variety of structures, without limitation to a certain structure. For example, a multi-gate structure having two or more gate electrodes can be used. By using the multi-gate structure, a structure where a plurality of transistors are connected in series is provided because channel regions are connected in series.

As another example, a structure where gate electrodes are formed above and below a channel can be used.

A structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be used. Alternatively, a structure where a source electrode or a drain electrode overlaps with a channel region (or part of it) can be used. Further, an LDD region may be provided.

Note that when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B is an object (e.g., a device, an element, a circuit, a wiring, an electrode, a terminal, a conductive film, or a layer).

Accordingly, for example, when it is explicitly described that “a layer B is formed on (or over) a layer A”, it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., a layer C or a layer D) may be a single layer or a plurality of layers.

In a similar manner, when it is explicitly described that “B is formed above A”, it does not necessarily mean that B is formed in direct contact with A, and another object may be interposed therebetween. Thus, for example, when it is described that “a layer B is formed above a layer A”, it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., a layer C or a layer D) may be a single layer or a plurality of layers.

Note that when it is explicitly described that “B is formed on A”, “B is formed over A”, or “B is formed above A”, it includes the case where B is formed obliquely over/above A.

Note that the same can be said when it is described that “B is formed below A” or “B is formed under A”.

Note that when an object is explicitly described in a singular form, the object is preferably singular. Note that the present invention is not limited to this, and the object can be plural. In a similar manner, when an object is explicitly described in a plural form, the object is preferably plural. Note that the present invention is not limited to this, and the object can be singular.

Note that size, the thickness of layers, or regions in diagrams are exaggerated for simplicity in some cases. Therefore, the present invention is not necessarily limited to the scale.

Note that diagrams are schematic views of ideal examples, and shapes or values are not limited to those illustrated in the diagrams. For example, it is possible to include variations in shape due to a manufacturing technique or an error, variations in signals, voltage values, or current values due to noise or a difference in timing.

Note that a technical term is used in order to describe a particular embodiment or example or the like in many cases, and is not limited to this.

Note that terms which are not defined (including terms used for science and technology, such as technical terms or academic parlance) can be used as terms which have meaning equal to general meaning that an ordinary person skilled in the art understands. It is preferable that terms defined by dictionaries or the like be construed as consistent meaning with the background of related art.

Note that terms such as “first”, “second”, “third”, and the like are used for distinguishing various elements, members, regions, layers, and areas from others. Therefore, the terms such as “first”, “second”, “third”, and the like do not limit the number of the elements, members, regions, layers, areas, or the like. Further, for example, “first” can be replaced with “second”, “third”, or the like.

According to one embodiment of the present invention, the potential of a transistor can be increased. Alternatively, according to one embodiment of the present invention, malfunction can be prevented. Alternatively, according to one embodiment of the present invention, Vgs of a transistor can be increased. Alternatively, according to one embodiment of the present invention, the on-resistance of a transistor can be made low. Alternatively, according to one embodiment of the present invention, the channel width of a transistor can be reduced. Alternatively, according to one embodiment of the present invention, the deterioration of a transistor can be suppressed or eased. Alternatively, according to one embodiment of the present invention, a layout area can be reduced. Alternatively, according to one embodiment of the present invention, a falling time or a rising time of an output signal of a flip-flop, a shift register, or a driver circuit such as a scan line driver circuit can be shortened. Alternatively, according to one embodiment of the present invention, the size of a display device can be increased. Alternatively, according to one embodiment of the present invention, a high-definition display device can be obtained. Alternatively, according to one embodiment of the present invention, a frame of a display device can be narrowed. Alternatively, according to one embodiment of the present invention, a correct signal can be written to a pixel. Alternatively, according to one embodiment of the present invention, display quality can be improved. Alternatively, according to one embodiment of the present invention, yield can be increased. Alternatively, according to one embodiment of the present invention, cost can be reduced. Alternatively, according to one embodiment of the present invention, distortion or delay of a signal to be input to a shift register can be reduced. Alternatively, according to one embodiment of the present invention, power consumption can be reduced. Alternatively, according to one embodiment of the present invention, the current capability of an external circuit can be reduced. Alternatively, according to one embodiment of the present invention, the size of an external circuit or the size of a display device including the external circuit can be reduced.

BRIEF DESCRIPTION OF THE DRAWINGS

FIGS. 2A to 2C are schematic views illustrating a driving method of a semiconductor device.

FIG. 12A is a schematic view illustrating a circuit diagram of a semiconductor device and FIGS. 12B and 12C are schematic views illustrating a driving method of the semiconductor device.

FIGS. 13A to 13C are schematic views illustrating the driving method of the semiconductor device.

DETAILED DESCRIPTION OF THE INVENTION

Figure 1A:
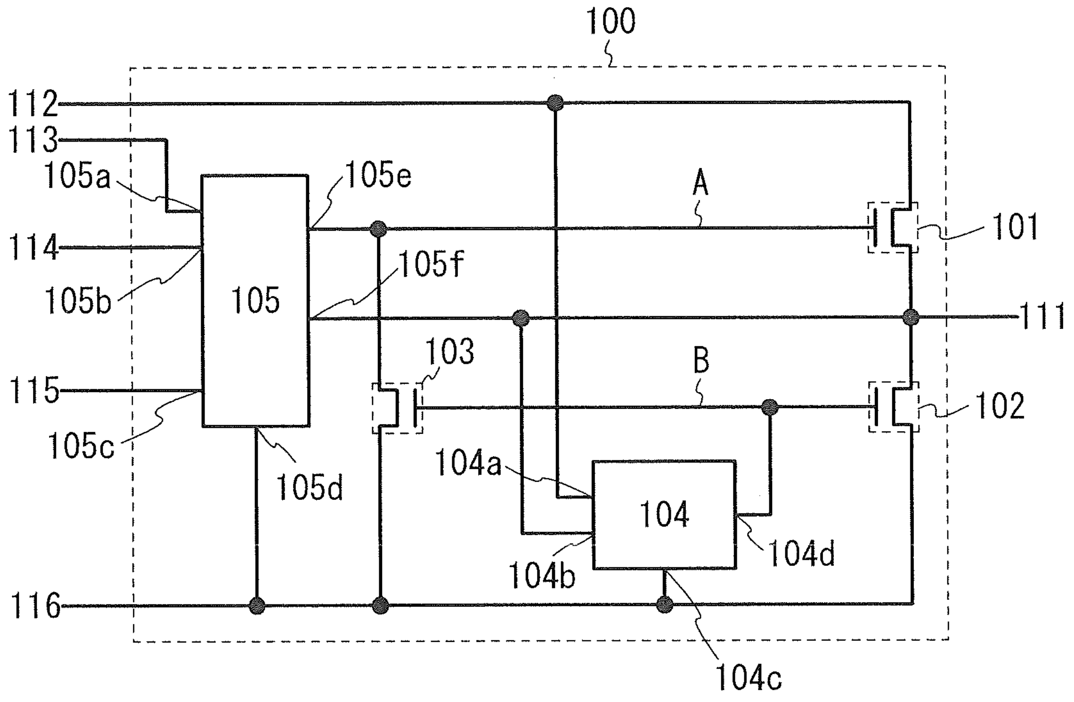
FIG. 1A is a circuit diagram of a semiconductor device and FIG. 1B is a timing chart illustrating a driving method of the semiconductor device.

Hereinafter, embodiments of the present invention are described with reference to the drawings. However, embodiments can be carried out in many different modes, and it is easily understood by those skilled in the art that the mode and detail of the present invention can be modified in various ways without departing from the spirit and scope thereof. Therefore, the present invention should not be construed as being limited to the description of embodiments. Note that in structures of the present invention described below, reference numerals denoting similar components are used in common in different drawings, and detailed description of the same portions or portions having similar functions is omitted.

Note that a content (or may be part of the content) described in one embodiment may be applied to, combined with, or replaced by a different content (or may be part of the different content) described in the same embodiment and/or a content (or may be part of the content) described in one or a plurality of different embodiments.

Note that in each embodiment, a content described in the embodiment is a content described with reference to a variety of diagrams or a content described with a paragraph disclosed in this specification.

Note that by a combination of a diagram (or may be part of the diagram) described one embodiment with another part of the diagram, a different diagram (or may be part of the different diagram) described in the same embodiment, and/or a diagram (or may be part of the diagram) described in one or a plurality of different embodiments, much more diagrams can be formed.

Embodiment 1

In this embodiment, an example of a semiconductor device is described. The semiconductor device in this embodiment can be used for a shift register, a gate driver, a source driver, a display device, or the like, for example. Note that the semiconductor device can be referred to as a flip-flop or a driver circuit.

First, an example of the semiconductor device in this embodiment is described with reference to FIG. 1A. A circuit 100 is shown in FIG. 1A. Note that the circuit 100 can be referred to as a semiconductor device, a driver circuit, or a flip-flop.

The circuit 100 includes a transistor 101 (also referred to as a first transistor), a transistor 102 (also referred to as a second transistor), a transistor 103 (also referred to as a third transistor), a circuit 104 (also referred to as a first circuit), and a circuit 105 (also referred to as a second circuit). The circuit 104 includes a plurality of terminals: a terminal **104*a*, a terminal 104*b*, a terminal 104*c*, and a terminal 104*d*. The circuit 105 includes a plurality of terminals: a terminal 105*a*, a terminal 105*b*, a terminal 105*c*, a terminal 105*d*, a terminal 105*e*, and a terminal 105*f*. However, this embodiment is not limited to this example. Any of these transistors or any of these circuits can be eliminated or replaced with any of a variety of elements such as a capacitor, a resistor and a diode, or a circuit in which any of these elements are combined. Alternatively, a variety of elements such as a transistor, a capacitor, a resistor and a diode or a circuit in which any of these elements are combined can be additionally provided. Alternatively, a terminal can be added or eliminated depending on the structure of the circuit 104 and the circuit 105**.

Note that for example, the transistors 101 to 103 are n-channel transistors. The n-channel transistor is turned on when a potential difference (Vgs) between a gate and a source of the n-channel transistor exceeds a threshold voltage (Vth). However, this embodiment is not limited to this example. The transistors 101 to 103 can be p-channel transistors. The p-channel transistor is turned on when a potential difference (Vgs) between a gate and a source of the p-channel transistor becomes less than a threshold voltage (Vth).

Figure 28A:
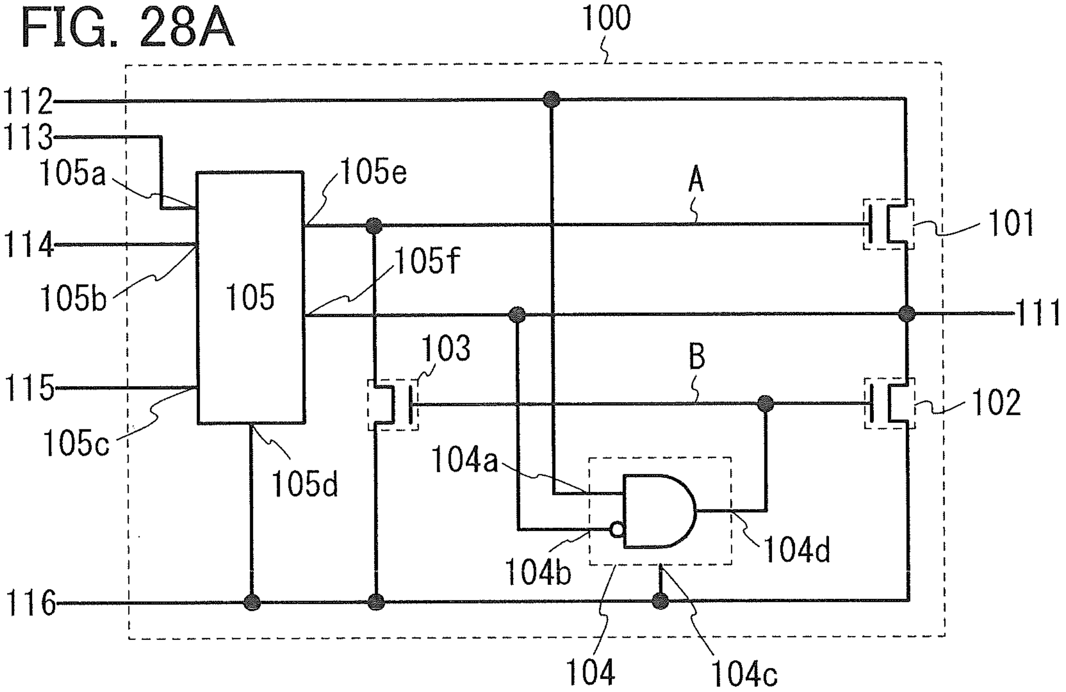
FIGS. 28A and 28B are circuit diagrams of a semiconductor device.
Figure 28B:
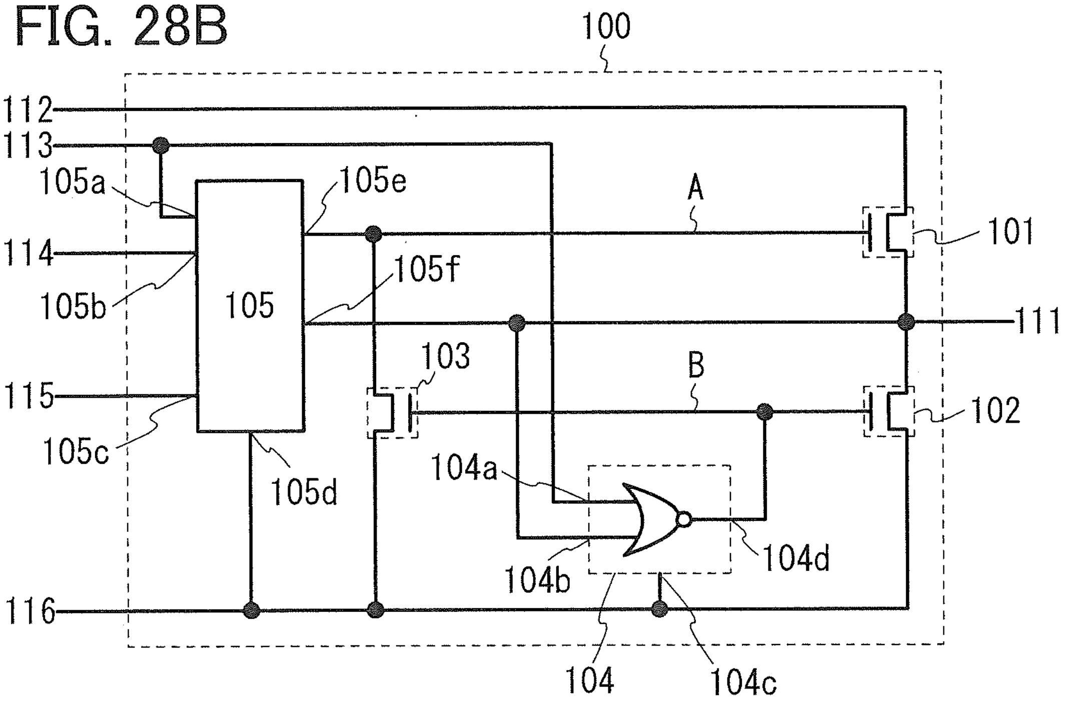

Note that for example, as shown in FIG. 28A, the circuit 104 is a two-input logic circuit in which an AND circuit and a NOT circuit are combined. This combinational logic circuit calculates logic conjunction of one input signal (e.g., a signal of a wiring 113) and an inverted signal of the other input signal (e.g., a signal of a wiring 111). However, this embodiment is not limited to this example. As the circuit 104, a two-input NOR circuit can be used as shown in FIG. 28B. Alternatively, a variety of circuits can be used as the circuit 104.

Note that for example, the circuit 104 and the circuit 105 each include one or a plurality of transistors. In addition, the polarities of these transistors are the same as those of the transistors 101 to 103. Since the polarities of the transistors in the circuit 104 and the circuit 105 are the same as those of the transistors 101 to 103, the number of manufacturing steps can be reduced, yield can be improved, reliability can be improved, and cost can be reduced. However, this embodiment is not limited to this example. The circuit 104 and the circuit 105 each can include an n-channel transistor and a p-channel transistor. That is, the circuit 104 and the circuit 105 can be CMOS circuits.

Note that for example, the terminals 104*a* to 104*c* function as input terminals and the terminal 104*d* functions as an output terminal. In addition, for example, the terminals 105*a* to 105*d* function as input terminals and the terminals 105*e* and 105*f* function as output terminals. However, this embodiment is not limited to this example.

Note that the circuit 104 and/or the circuit 105 can include even more terminals. Alternatively, some of the terminals of the circuit 104 and/or the circuit 105 can be eliminated.

Next, an example of connection relation in the circuit 100 is described. A first terminal of the transistor 101 is connected to a wiring 112 and a second terminal of the transistor 101 is connected to the wiring 111. A first terminal of the transistor 102 is connected to a wiring 116 and a second terminal of the transistor 102 is connected to the wiring 111. A first terminal of the transistor 103 is connected to the wiring 116, a second terminal of the transistor 103 is connected to a gate of the transistor 101, and a gate of the transistor 103 is connected to a gate of the transistor 102. The terminal 104*a* of the circuit 104 is connected to the wiring 112. The terminal 104*b* of the circuit 104 is connected to the wiring 111. The terminal 104*c* of the circuit 104 is connected to the wiring 116. The terminal 104*d* of the circuit 104 is connected to the gate of the transistor 102. The terminal 105*a* of the circuit 105 is connected to the wiring 113. The terminal 105*b* of the circuit 105 is connected to a wiring 114. The terminal 105*c* of the circuit 105 is connected to a wiring 115. The terminal 105*d* of the circuit 105 is connected to the wiring 116. The terminal 105*e* of the circuit 105 is connected to the gate of the transistor 101. The terminal 105*f* of the circuit 105 is connected to the wiring 111. However, this embodiment is not limited to this example. A variety of connection structures can be employed.

Note that a connection portion of the gate of the transistor 101, the second terminal of the transistor 103, or the terminal 105*e* of the circuit 105 is referred to as a node A. In addition, a connection portion of the gate of the transistor 102, the terminal 104*d* of the transistor 104, or the gate of the transistor 103 is referred to as a node B. Note that the node A and the node B each can be referred to as a wiring or a terminal.

Note that the wiring 111, the wiring 112, the wiring 113, the wiring 114, the wiring 115, and the wiring 116 each can be referred to as a terminal.

Note that as described above, a terminal can be additionally provided to the circuit 104 and/or the circuit 105. In that case, the terminal can be connected to a variety of wirings or a variety of elements.

Note that any of the wirings 111 to 116 can be eliminated and/or a wiring can be additionally provided.

Next, examples of a signal or voltage input or output to/from the wirings 111 to 116 are described. For example, a signal OUT is output from the wiring 111. The signal OUT is a digital signal with an H level and an L level in many cases and can function as an output signal, a selection signal, a transfer signal, a start signal, a reset signal, a gate signal, or a scan signal of the circuit 100. For example, a signal IN1 is input to the wiring 112. The signal IN1 is a digital signal in many cases and can function as a clock signal. For example, a signal IN2 is input to the wiring 113. The signal IN2 is out of phase with the signal IN1 by 180° or an inverted signal of the signal IN1 in many cases and can function as an inverted clock signal. For example, a signal IN3 is input to the wiring 114. The signal IN3 is a digital signal in many cases and can function as a start signal or a vertical synchronization signal. Alternatively, in the case where the circuit 100 is used for a shift register or a display device, the signal IN3 can function as a transfer signal from a different stage (e.g., the previous stage) or a signal for selecting a different row (e.g., the previous row). For example, a signal IN4 is input to the wiring 115. The signal IN4 is a digital signal in many cases and can function as a reset signal. Alternatively, in the case where the circuit 100 is used for the shift register or the display device, the signal IN4 can function as a signal for selecting a different row (e.g., the next row). For example, a voltage V1 is input to the wiring 116. The voltage V1 has approximately the same value as the signal OUT in an L level, the signal IN1 in an L level, the signal IN2 in an L level, the signal IN3 in an L level, or the signal IN4 in an L level in many cases and can function as ground voltage, power supply voltage, or negative power supply voltage. However, this embodiment is not limited to this example. A variety of signals, currents, or voltages can be input to the wirings 111 to 116. For example, a voltage such as the voltage V1 or a voltage V2 can be supplied to the wiring 112, the wiring 113, the wiring 114, and/or the wiring 115. Alternatively, a signal such as the signal OUT, the signal IN1, the signal IN2, the signal IN3, or the signal IN4 can be input to the wiring 116. Alternatively, without input of a signal, voltage, or the like, the wiring 111, the wiring 112, the wiring 113, the wiring 114, the wiring 115, and/or the wiring 116 can be set in a floating state.

Note that the term "approximately" includes a variety of errors such as an error due to noise, an error due to variations in process, an error due to variations in a manufacturing step of an element, and/or an error of measurement.

Note that the wiring 111 (also referred to as a first wiring) can function as a signal line, a gate line, a scan line, or an output signal line. The wiring 112 (also referred to as a second wiring) can function as a signal line or a clock signal line. The wiring 113 (also referred to as a third wiring) can function as a signal line or a clock signal line. The wiring 114 (also referred to as a fourth wiring) can function as a signal line. The wiring 115 (also referred to as a fifth wiring) can function as a signal line. The wiring 116 (also referred to as a sixth wiring) can function as a power supply line or a ground line. However, this embodiment is not limited to this example. The wirings 111 to 116 can function as a variety of wirings. For example, in the case where voltage is supplied to the wiring 112, the wiring 113, the wiring 114, and/or the wiring 115, these wirings can function as power supply lines. Alternatively, in the case where a signal is input to the wiring 116, the wiring 116 can function as a signal line. Alternatively, like the wiring 111, the wiring 114, and/or the wiring 115 can function as a signal line, a gate line, a scan line, or an output signal line.

Note that polyphase clock signals can be input to the circuit 100. For example, in the case of n-phase (n is a natural number) clock signals, the n-phase clock signals are n clock signals whose cycles are different by 1/n cycle. Alternatively, any two of the polyphase clock signals can be input to the respective wiring 112 and wiring 113.

Note that as the signal IN1 or the signal IN2, a balanced clock signal or an unbalanced clock signal can be used. The balanced signal is a signal in which a period in which the signal is in an H level is the same as a period in which the signal is in an L level in one cycle. The unbalanced signal is a signal in which the period in which the signal is in an H level is different from the period in which the signal is in an L level in one cycle.

Note that for example, the potential of a signal in an L level is V1 and the potential of a signal in an H level is V2. Further, the V2 is higher than V1. Furthermore, the term "voltage V2" means that the voltage V2 has approximately the same value as the signal in the H level. However, this embodiment is not limited to this example. The potential of the signal in the L level can be lower or higher than V1. Alternatively, the potential of the signal in the H level can be lower or higher than V2.

Next, an example of a function of each of the transistors 101 to 103 and the circuits 104 and 105 is described.

The transistor 101 has a function of controlling timing when the signal OUT goes into an H level by controlling timing when the signal IN1 in an H level is supplied to the wiring 111 in accordance with the potential of the node A and can function as a pull-up transistor or a bootstrap transistor. The transistor 102 has a function of controlling timing when the voltage V1 is supplied to the wiring 111 by controlling an electrical conduction state of the wiring 116 and the wiring 111 in accordance with an output signal from the circuit 104 or the potential of the node B and can function as a switch. The transistor 103 has a function of controlling timing when the voltage V1 is supplied to the node A by controlling an electrical conduction state of the wiring 116 and the node A in accordance with the output signal from the circuit 104 or the potential of the node B and can function as a switch.

The circuit 104 has a function of increasing, decreasing, or maintaining the potential of the node B or making the node B go into a floating state by controlling timing when the signal IN3 or the voltage V1 is supplied to the node B in accordance with the signal OUT or the signal IN1, and can function as a control circuit. Further, the circuit 104 can have a function of controlling an electrical conduction state of the transistor 102 and the transistor 103 by controlling the potential of the node B. For example, the circuit 104 has a function of decreasing the potential of the node B by supplying the voltage V1 or the signal IN2 in an L level to the node B when the signal IN2 goes into the L level. As another example, the circuit 104 has a function of decreasing the potential of the node B by supplying the voltage V1 or a signal in an L level to the node B when the signal OUT goes into an H level. As another example, the circuit 104 has a function of increasing the potential of the node B by supplying the voltage V2 or the signal IN2 in an H level to the node B when the signal IN2 goes into the H level in the case where the signal OUT is in an L level.

The circuit 105 has a function of increasing, decreasing, or maintaining the potential of the node A or making the node A go into a floating state by controlling timing when the signal IN3 or the voltage V1 is supplied to the node A in accordance with the signal IN2, the signal IN3, or the signal IN4, and can function as a control circuit. Alternatively, the circuit 105 has a function of decreasing or maintaining the potential of the wiring 111 or making the wiring 111 go into a floating state by controlling timing when the voltage V1 is supplied to the wiring 111 in accordance with the signal IN2, the signal IN3, or the signal IN4. For example, the circuit 105 has a function of increasing the potential of the node A by supplying the signal IN3 in an H level or the voltage V2 to the node A when the signal IN2 or the signal IN3 goes into the H level. As another example, the circuit 105 has a function of decreasing the potential of the node A or the wiring 111 by supplying the voltage V1 or a signal in an L level to the node A or the wiring 111 when the signal IN2 or the signal IN4 goes into an H level.

However, this embodiment is not limited to this example. The transistors 101 to 103 and the circuits 104 and 105 can have a variety of functions. Alternatively, it is acceptable that these elements or circuits do not have the above-described functions.

Figure 1B:
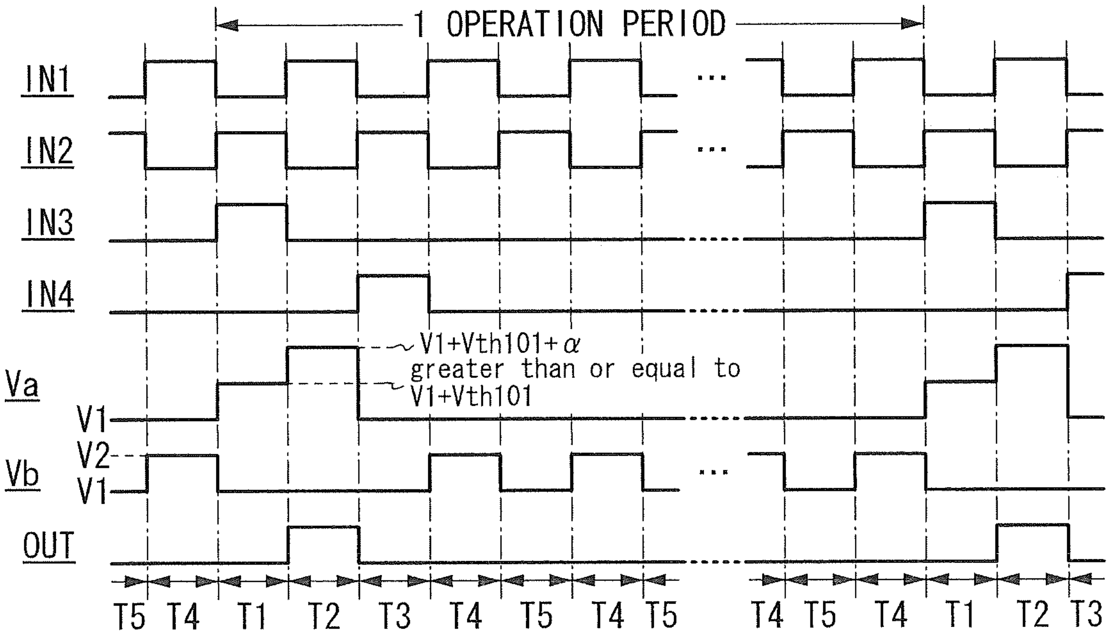
Figure 3A:
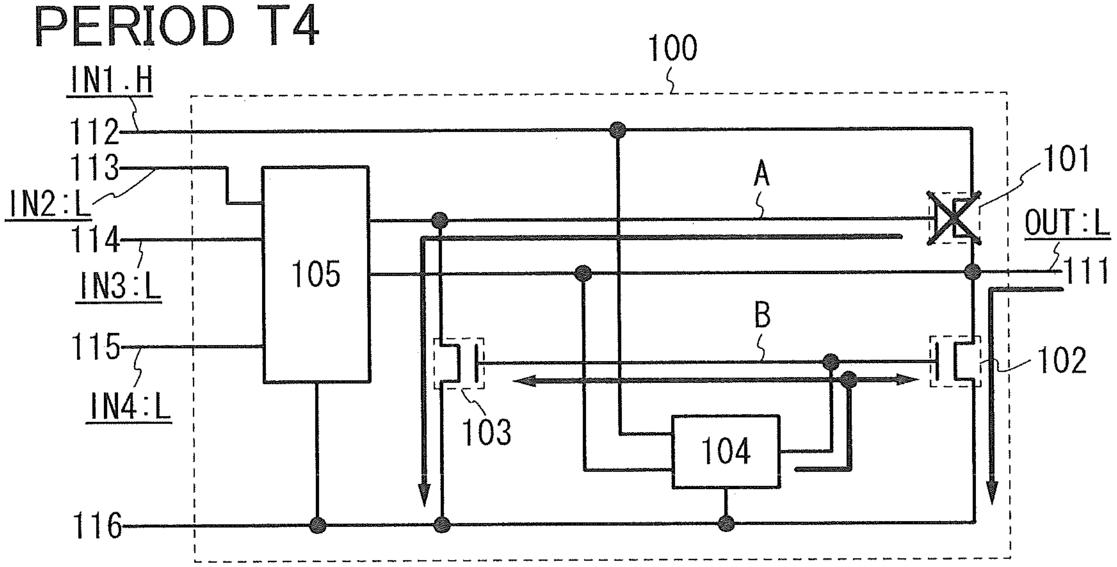
FIGS. 3A and 3B are schematic views illustrating the driving method of the semiconductor device.
Figure 3B:
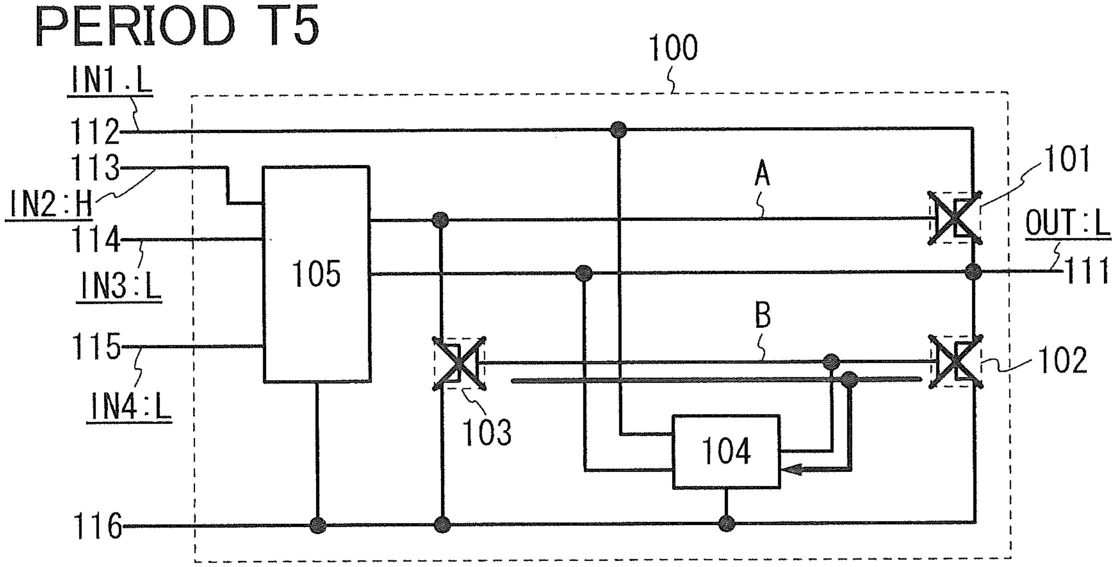

Next, operation of the semiconductor device in FIG. 1A is described with reference to FIG. 1B, FIGS. 2A to 2C, and FIGS. 3A and 3B. FIG. 1B is an example of a timing chart for describing the operation of the semiconductor device. FIG. 1B shows an example of each of the signal IN1, the signal IN2, the signal IN3, the signal IN4, a potential Va of the node A, a potential Vb of the node B, and the signal OUT in one operation period. In addition, one operation period in the timing chart in FIG. 1B includes a period T1, a period T2, a period T3, periods T4, and periods T5. FIG. 2A shows an example of a schematic view of the operation of the semiconductor device in FIG. 1A during the period T1. FIG. 2B shows an example of a schematic view of the operation of the semiconductor device in FIG. 1A during the period T2. FIG. 2C shows an example of a schematic view of the operation of the semiconductor device in FIG. 1A during the period T3. FIG. 3A shows an example of a schematic view of the operation of the semiconductor device in FIG. 1A during the period T4. FIG. 3B shows an example of a schematic view of the operation of the semiconductor device in FIG. 1A during the period T5.

Note that for example, when the signal IN3 goes into an H level, the semiconductor device in FIG. 1A sequentially performs operation of the period T1, operation of the period T2, and operation of the period T3. Then, after that, the semiconductor device in FIG. 1A repeats alternately operation of the period T4 and the operation of the period T5 until the signal IN3 goes into the H level again. However, this embodiment is not limited to this example. The semiconductor device in FIG. 1A can perform the operations of the periods T1 to T5 in a variety of orders.

First, in the period T1, the signal IN1 goes into an L level, the signal IN2 goes into an H level, the signal IN3 goes into an H level, and the signal IN4 goes into an L level. Since the signal IN3 goes into the H level, the circuit 105 starts to raise the potential of the node A. At that time, since the signal IN1 goes into the L level, the circuit 104 starts to decrease the potential of the node B to V1. Accordingly, since the transistor 102 and the transistor 103 are turned off, the wiring 116 and the wiring 111 are brought out of electrical conduction, whereby the wiring 116 and the node A are brought out of electrical conduction. After that, when the potential of the node A becomes equal to the sum of the potential of the wiring 112 (V1) and the threshold voltage of the transistor 101 (Vth101), (V1+Vth101), the transistor 101 is turned on. Then, since the wiring 112 and the wiring 111 are brought into electrical conduction, the signal IN1 in the L level is supplied to the wiring 111 from the wiring 112 through the transistor 101. Accordingly, since the potential of the wiring 111 becomes V1, the signal OUT goes into an L level. After that, the circuit 105 continues to further raise the potential of the node A. In addition, the circuit 105 stops supply of a signal or voltage to the node A when the potential of the node A is raised to a certain value (at least greater than or equal to V1+Vth101). Accordingly, the node A goes into a floating state while maintaining the potential at that time (e.g., greater than or equal to V1+Vth101).

Note that in the period T1, the circuit 105 supplies the voltage V1 or a signal in an L level to the wiring 111 in many cases. However, this embodiment is not limited to this example. If the circuit 105 does not supply the voltage, signal, or the like to the wiring 111, the circuit 105 and the wiring 111 can be brought out of electrical conduction.

Next, in the period T2, the signal IN1 goes into an H level, the signal IN2 goes into an L level, the signal IN3 goes into an L level and the signal IN4 is kept as the L level. Since the circuit 105 does not supply voltage, signal, or the like to the node A in many cases, the node A is kept in the floating state while maintaining the potential in the period T1 (greater than or equal to V1+Vth101). Accordingly, since the transistor 101 is kept on, the wiring 112 and the wiring 111 are kept in electrical conduction. At that time, since the level of the signal IN1 is raised to an H level from the L level, the potential of the wiring 111 starts to rise from V1. Then, since the node A is in the floating state, the potential of the node A is raised by the parasitic capacitance between the gate and the second terminal of the transistor 101; so-called bootstrap operation is performed. In this manner, the potential of the node A is raised to (V2+Vth101+a) (a is a positive number). Then, the potential of the wiring 111 rises to the potential of the signal IN2 in the H level, that is, V2, whereby the signal OUT goes into an H level. At that time, since the signal OUT goes into the H level, the circuit 104 maintains the potential of the node B as V1 by supplying the voltage V1 or a signal in an L level to the node B. Accordingly, since the transistor 102 and the transistor 103 are kept off, the wiring 116 and the wiring 111 are kept out of electrical conduction, whereby the wiring 116 and the node A are kept out of electrical conduction.

Note that in the period T2, if the circuit 104 does not supply the signal, voltage, or the like to the node B, the circuit 104 and the node B can be brought out of electrical conduction. Then, the circuit 104 can make the node B go into a floating state. In that case too, since the node B goes into the floating state, the potential of the node B is maintained as V1 in many cases.

Note that if the circuit 105 does not supply the voltage, signal, or the like to the wiring 111 in the period T2, the circuit 105 and the wiring 111 can be brought out of electrical conduction. However, this embodiment is not limited to this example. The circuit 105 can supply the voltage V2, a signal in an H level, or the like to the wiring 111.

Next, in the period T3, the signal IN1 goes into the L level, the signal IN2 goes into the H level, the signal IN3 is kept at the L level, and the signal IN4 goes into an H level. Since the signal IN4 goes into the H level, the circuit 105 decreases the potential of the node A to V1. Therefore, since the transistor 101 is turned off, the wiring 112 and the wiring 111 are brought out of electrical conduction. Here, since the potential of the node A is controlled by voltage or a signal supplied through the circuit 105, timing when the transistor 101 is turned off comes later than timing when the signal IN1 goes into the L level in many cases. That is, when the transistor 101 is on, the signal IN1 goes into the L level in some cases. In that case, the signal IN1 in the L level is supplied to the wiring 111 from the wiring 112 through the transistor 101. Accordingly, since the potential of the wiring 111 is V1, the signal OUT goes into the L level. At that time, since the signal IN1 is in the L level, the circuit 104 keeps the potential of the node B as V1 by supplying the signal IN2 in the L level or the voltage V1 to the node B. Accordingly, since the transistor 102 and the transistor 103 are kept off, the wiring 116 and the wiring 111 are kept out of electrical conduction, whereby the wiring 116 and the node A are kept out of electrical conduction.

Note that in the period T3, if the circuit 104 does not supply the signal, voltage, or the like to the node B, the circuit 104 and the node B can be brought out of electrical conduction. Then, the circuit 104 can make the node B go into a floating state. In that case too, since the node B goes into the floating state, the potential of the node B is maintained as V1 in many cases.

Note that in the period T2, the circuit 105 can supply the voltage V1 or a signal in an L level to the wiring 111. Alternatively, if the circuit 105 does not supply the voltage, signal, or the like to the wiring 111, the circuit 105 and the wiring 111 can be brought out of electrical conduction.

Next, in the period T4, the signal IN1 goes into the H level, the signal IN2 goes into the L level, the signal IN3 is kept at the L level, and the signal IN4 goes into the L level. Since the signal OUT is kept at the L level while the signal IN1 goes into the H level, by supplying the signal IN1 in the H level or the voltage V2 to the node B, the circuit 104 raises the potential of the node B to V2. Then, since the transistor 102 and the transistor 103 are turned on, the wiring 116 and the wiring 111 are brought into electrical conduction, whereby the wiring 116 and the node A are brought into electrical conduction. Accordingly, since the voltage V1 is supplied to the wiring 111 from the wiring 116 through the transistor 102, the potential of the wiring 111 is maintained as V1. Then, since the voltage V1 is supplied to the node A from the wiring 116 through the transistor 103, the potential of the node A is maintained as V1. In this manner, the signal OUT is kept at the L level.

Note that the circuit 105 can supply the voltage V1, a signal in an L level, or the like to the wiring 111 or the node A. Alternatively, if the circuit 105 does not supply the voltage, signal, or the like to the wiring 111 or the node A, the circuit 105 and the node A can be brought out of electrical conduction and the circuit 105 and the wiring 111 can be brought out of electrical conduction.

Next, in the period T5, the signal IN1 goes into the L level, the signal IN2 goes into the H level, the signal IN3 is kept at the L level, and the signal IN4 is kept at the L level. Since the signal IN1 goes into the L level, the circuit 104 decreases the potential of the node B to V1 by supplying the signal IN1 in the L level or the voltage V1 to the node B. Accordingly, since the transistor 102 and the transistor 103 are turned off, the wiring 116 and the wiring 111 are brought out of electrical conduction, whereby the wiring 116 and the node A are brought out of electrical conduction. Here, if the circuit 105 supplies the voltage V1, a signal in an L level, or the like to the wiring 111 or the node A, the potential of the wiring 111 or the node A is maintained as V1. However, even in the case where the circuit 105 does not supply the voltage, signal, or the like to the wiring 111 or the node A, the potential of the wiring 111 or the node A is maintained as V1. This is because, since the wiring 111 and the node A go into a floating state, the potential in the period T4 (V1) is maintained. In this manner, the signal OUT is kept at the L level.

The above is the description of the operation of the semiconductor device in FIG. 1A. In the semiconductor device in FIG. 1A, decrease in the potential of the node A can be prevented in the period T2. In a conventional technique, the node A and the wiring 111 are in electrical conduction until the potential of the wiring 111 is raised to a certain value in the period T2. Accordingly, the potential of the node A is decreased. However, in the semiconductor device in FIG. 1A, the node A and the wiring 111 are not brought into electrical conduction in the period T2. Therefore, decrease in the potential of the node A can be prevented. As a result, decrease in Vgs of the transistor 101 can be prevented. Alternatively, Vgs of the transistor 101 can be increased. Alternatively, malfunction due to too much decrease in the potential of the node A can be prevented. Alternatively, since the decrease in Vgs of the transistor 101 can be prevented, the channel width (W) of the transistor 101 can be reduced. Accordingly, reduction in a layout area can be achieved. Alternatively, since Vgs of the transistor 101 can be increased, the on-resistance of the transistor 101 can be reduced. Therefore, a falling time or a rising time of the signal OUT can be shortened or delay of the signal OUT can be reduced.

Alternatively, all the transistors in the semiconductor device in FIG. 1A can be n-channel transistors or all the transistors in the semiconductor device in FIG. 1A can be p-channel transistors. Accordingly, reduction in the number of steps, improvement in yield, improvement in reliability, or reduction in cost can be achieved. Specifically, if all the transistors are n-channel transistors, non-single-crystal semiconductors, microcrystalline semiconductors, organic semiconductors, oxide semiconductors, or the like can be used for semiconductor layers of the transistors. Accordingly, reduction in the number of steps, improvement in yield, improvement in reliability, or reduction in cost can be achieved. However, this embodiment is not limited to this example. The semiconductor device in FIG. 1A can include a CMOS circuit which includes a p-channel transistor and an n-channel transistor. Moreover, single crystal semiconductors or polycrystalline semiconductors can be used for the semiconductor layers of the transistors.

Alternatively, in the semiconductor device in FIG. 1A, the transistors 101 to 103 are turned off in at least one of the period T4 and the period T5. Therefore, since the transistor stays in an off state during one operation period, deterioration of characteristics of the transistor, such as increase in threshold voltage or decrease in mobility, can be suppressed. Specifically, if a non-single-crystal semiconductor, a microcrystalline semiconductor, an organic semiconductor, an oxide semiconductor, or the like is used for a semiconductor layer of the transistor, the characteristics of the transistor obviously deteriorates in many cases. However, in the semiconductor device in FIG. 1A, a non-single-crystal semiconductor, a microcrystalline semiconductor, an organic semiconductor, an oxide semiconductor, or the like can be easily used for the semiconductor layer of the transistor because deterioration of characteristics of the transistor can be suppressed. However, this embodiment is not limited to this example. A polycrystalline semiconductor or a single crystal semiconductor can be used for the semiconductor layer.

Note that the period T2 can be referred to as a selection period and the other periods (the period T1, the period T3, the period T4, and the period T5) can be referred to as non-selection periods. Alternatively, the period T1, the period T2, the period T3, the period T4, and the period T5 can be referred to as a set period, an output period, a reset period, a first non-selection period, and a second non-selection period, respectively.

Figure 4A:
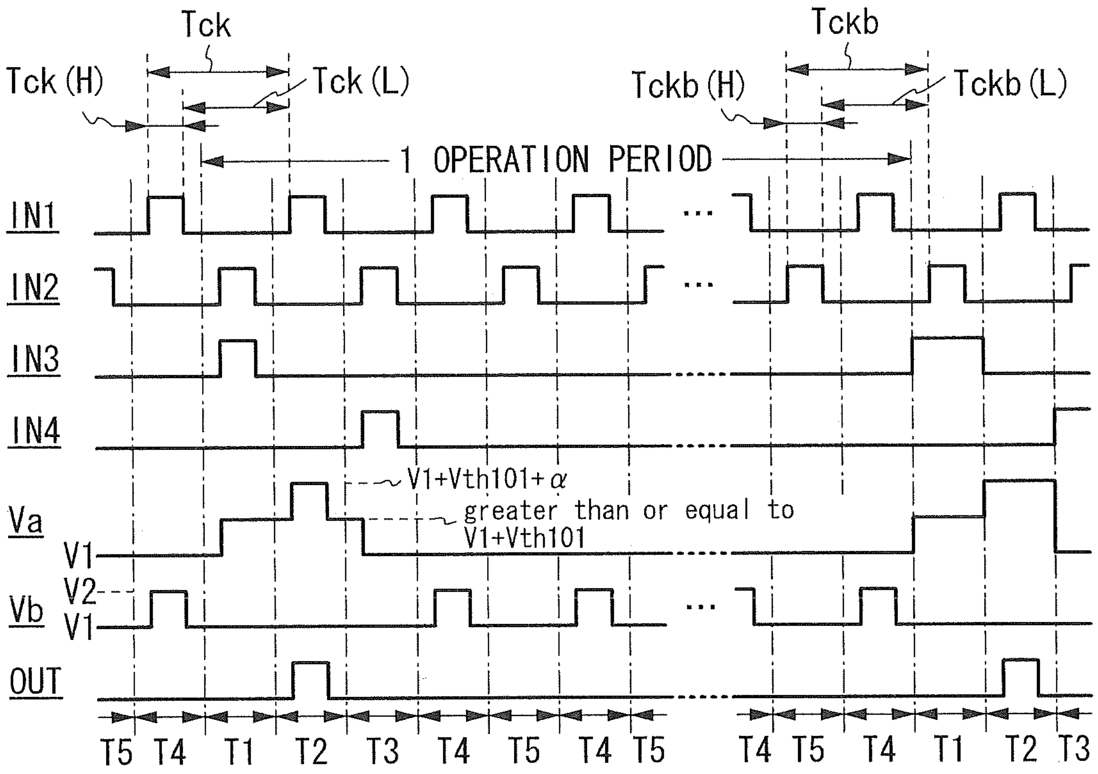
FIGS. 4A and 4B are timing charts each illustrating a driving method of a semiconductor device.
Figure 4B:
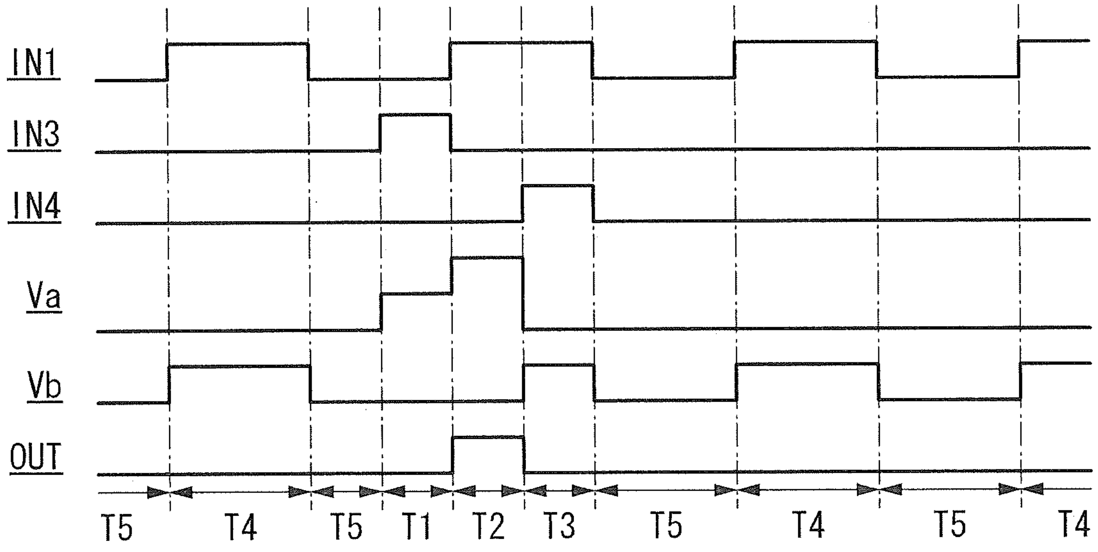

Note that although one example of the timing chart in FIG. 1B shows the case where the signal IN1 and the signal IN2 are balanced signals, this embodiment is not limited to this example. As described above, the signal IN1 and the signal IN2 can be unbalanced signals. Alternatively, although the timing chart in FIG. 1B shows the case where a period in which the signal IN1 (or the signal IN2) is in the H level and a period in which the signal IN1 (or the signal IN2) is in the L level are approximately equal, that is, the case where the duty ratio of the signal IN1 and the signal IN2 is approximately 50%, this embodiment is not limited to this example. The duty ratio of the signal IN1 and the signal IN2 can be greater than or equal to 50% or less than or equal to 50%. FIG. 4A shows a timing chart in the case where the signal IN1 and the signal IN2 are unbalanced signals and the duty ratio of the signal IN1 and the signal IN2 is not 50%. In the timing chart in FIG. 4A, in the period T2, when the signal IN1 goes into an H level, the potential of the node A is raised by bootstrap operation and the signal OUT goes into an H level. After that, the signal IN1 goes into an L level. In the timing chart in FIG. 1B, the potential of the node A is decreased to V1 at the same time as or little later than the time when the signal IN1 goes into the L level. That is, the transistor 101 is turned off at the same time as or little later than the time when the signal IN1 goes into the L level. However, in the timing chart in FIG. 4A, the potential of the node A is kept high until the signal IN4 goes into an H level or the signal IN2 goes into an H level. That is, even after the signal IN1 goes into the L level, the transistor 101 is kept on. Accordingly, since the wiring 112 and the wiring 111 are kept in electrical conduction, the signal IN1 in the L level is supplied to the wiring 111 from the wiring 112 through the transistor 101. Accordingly, since the channel width (W) of the transistor 101 is large in many cases, the potential of the wiring 111 is immediately decreased to V1. Therefore, a falling time of the signal OUT can be shortened.

Note that in FIG. 4A, one cycle of the signal IN is referred to as a period Tck. In addition, a period in which the signal IN1 is in an H level in one cycle is referred to as a period Tck(H) and a period in which the signal IN1 is in an L level in one cycle is referred to as a period Tck(L). Similarly, one cycle of the signal IN2 is referred to as a period Tckb. In addition, a period in which the signal IN2 is in the H level in one cycle is referred to as a period Tckb(H) and a period in which the signal IN2 is in the L level in one cycle is referred to as a period Tckb(L). The relation between the period Tck and the period Tckb is shown by the formula, $Tck \approx Tckb$ in many cases. The relation between the period Tck(H) and the period Tckb(H) is shown by the formula, $Tck(H) \approx Tckb(H)$ in many cases. The relation between the period Tck(L) and the Tckb(L) is shown by the formula, $Tck(L) \approx Tckb(L)$ in many cases. However, this embodiment is not limited to this example.

Note that the relation between the period Tck(H) and the period Tck(L) is preferably shown by the formula, $Tck(H) < Tck(L)$ in FIG. 4A. Similarly, the relation between the period Tckb(H) and the period Tckb(L) is preferably shown by the formula, $Tckb(H) < Tckb(L)$. In this manner, as described above, the falling time of the signal OUT can be shortened. However, this embodiment is not limited to this example. The relation between the period Tck(H) and the period Tck(L) can be shown by the formula, $Tck(H) > Tck(L)$ and the relation between the period Tckb(H) and the period Tckb(L) can be shown by the formula, $Tckb(H) > Tckb(L)$.

Note that as shown by the timing chart in FIG. 4A, the signal OUT can go into an L level in the course of the period T2. In order to achieve this, the signal IN4 goes into an H level in the course of the period T2. Then, the circuit 100 in FIG. 1A is forced to start operation in the period T3 or operation which is substantially the same as the operation in the period T3. First, since the signal IN4 goes into the H level, the circuit 105 decreases the potential of the node A and the wiring 111 to V1 by supplying the V1 or a signal in an L level to the node A and the wiring 111. Accordingly, the signal OUT goes into the L level. In addition, since the signal OUT is in the L level and the signal IN1 is kept at the H level, the circuit 104 makes the potential of the node B V2 by supplying the signal IN1 in the H level to the node B like in the period T4. Accordingly, since the transistor 102 and the transistor 103 are turned on, the wiring 116 and the wiring 111 are brought into electrical conduction and the wiring 116 and the node A are brought into electrical conduction. Therefore, since the voltage V1 is supplied to the wiring 111 from the wiring 116 through the transistor 102, the potential of the wiring 111 is maintained as V1. On the other hand, since the voltage V1 is supplied to the node A from the wiring 116 through the transistor 103, the potential of the node A is maintained as V1. At that time, since the potential of the node A is V1, the transistor 101 is turned off. Therefore, the wiring 112 and the wiring 111 are brought out of electrical conduction. In this manner, the period in which the signal OUT is in the H level can be shorter than the period in which the signal IN1 is in the H level. As a result, the driving frequency becomes low as compared to the case where the period in which the signal IN1 is in the H level is approximately equal to the period in which the signal OUT is in the H level. Therefore, power consumption can be reduced.

Note that for example, the transistor 101 preferably has the largest channel width among the transistors 101 to 103 or the transistors included in the semiconductor device in FIG. 1A. In this manner, the on-resistance of the transistor 101 is reduced, whereby the rising time or the falling time of the signal OUT can be shortened. However, this embodiment is not limited to this example. The channel width of the transistor 101 can be smaller than that of any of the transistors included in the semiconductor device in FIG. 1A.

Note that the term "the channel width of a transistor" can also be referred to as the W/L (W is channel width and L is channel length) ratio of a transistor.

Note that for example, the channel width of the transistor 102 is preferably larger than that of the transistor 103. This is because, since the wiring 111 is connected to a gate line, a pixel, or the like in many cases, the load of the wiring 111 is heavier than that of the node A in many cases. In addition, another reason is that the transistor 102 has a function of supplying the voltage V1 to the wiring 111 and the transistor 103 has a function of supplying the voltage V1 to the node A. However, this embodiment is not limited to this example. The channel width of the transistor 102 can be smaller than that of the transistor 103.

Note that for example, the parasitic capacitance between the gate and the second terminal of the transistor 101 is preferably higher than the parasitic capacitance between the gate and the first terminal of the transistor 101. This is because the potential of the node A is easily increased by bootstrap operation in the period T2. Therefore, an area where a conductive layer which functions as a gate and a conductive layer which functions as a source or drain on the second terminal side is preferably larger than that on the first terminal side. However, this embodiment is not limited to this example.

Figure 5A:
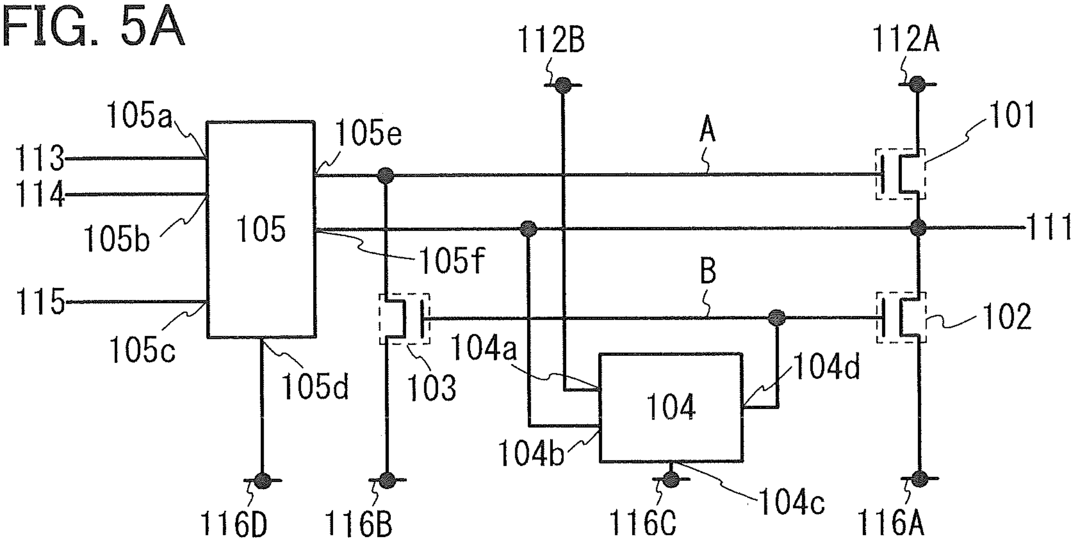
FIGS. 5A and 5B are circuit diagrams of a semiconductor device.

Note that the wiring can be divided into a plurality of wirings. In addition, the same signal or voltage or different signals or voltages can be input to the plurality of wirings. Alternatively, the plurality of wirings can be connected to the same wiring or element or different wirings or elements. One example in FIG. 5A illustrates a structure in the case where the wiring 112 is divided into a plurality of wirings of wirings 112A and 112B and the wiring 116 is divided into a plurality of wirings of wirings 116A to 116D. The first terminal of the transistor 101 is connected to the wiring 112A and the terminal 104*a* of the circuit 104 is connected to the wiring 112B. The first terminal of the transistor 102 is connected to the wiring 116A and the first terminal of the transistor 103 is connected to the wiring 116B. The terminal 104*c* of the circuit 104 is connected to the wiring 116C and the terminal 105*d* of the circuit 105 is connected to the wiring 116D. However, this embodiment is not limited to this example. The wiring 111, the wiring 113, the wiring 114, and/or the wiring 115 each can be divided into a plurality of wirings. Alternatively, only one of the wiring 112 and the wiring 116 can be divided into a plurality of wirings.

Note that in FIG. 5A, the wirings 112A and 112B correspond to the wiring 112 in FIG. 1A. Therefore, the signal IN1 can be input to the wirings 112A and 112B and the wirings 112A and 112B can function as signal lines or clock signal lines. However, this embodiment is not limited to this example. Voltages such as the voltage V1 and the voltage V2 can be supplied to the wirings 112A and 112B and the wirings 112A and 112B can function as power supply lines. Alternatively, different signals or voltages can be input to the wirings 112A and 112B. Alternatively, other than above, a variety of signals, voltages, or currents can be input to the wirings 112A and 112B.

Note that in FIG. 5A, the wirings 116A to 116D correspond to the wiring 116 in FIG. 1A. Therefore, the voltage V1 can be supplied to the wirings 116A to 116D and the wirings 116A to 116D can function as power supply lines. However, this embodiment is not limited to this example. A signal such as the signal OUT, the signal IN1, the signal IN2, the signal IN3, or the signal IN4 can be input to the wirings 116A to 116D and the wirings 116A to 116D can function as signal lines. Alternatively, different signals or voltages can be input to the wirings 116A to 116D. Alternatively, other than above, a variety of signals, voltages, or currents can be input to the wirings 116A to 116D.

Figure 5B:
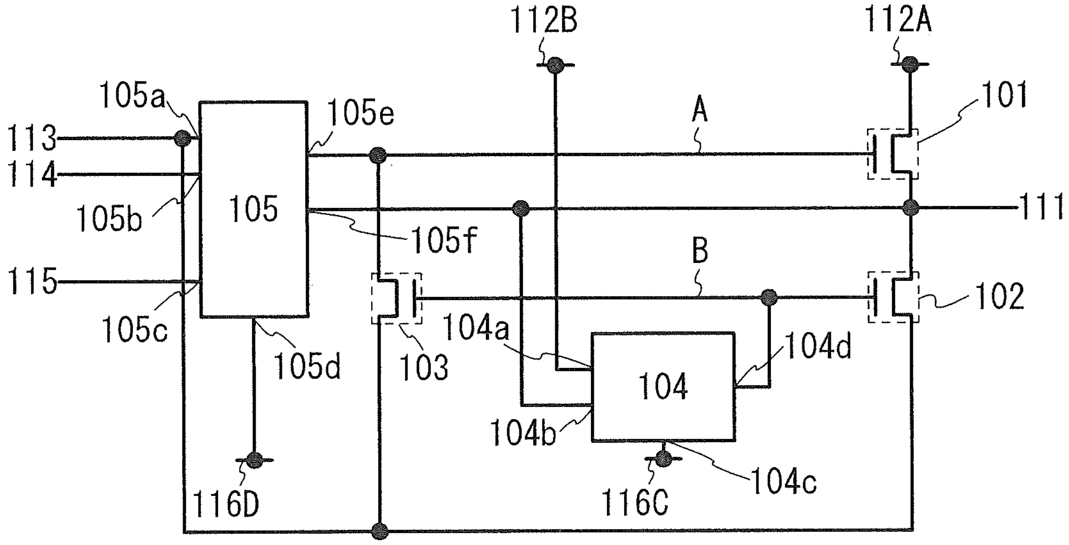

Note that in FIG. 5A, a signal in an L level in the period T4 can be input to the wirings 116A and 116B. For example, the signal IN2 can be input to the wirings 116A and 116B. In that case, as shown in FIG. 5B, the first terminal of the transistor 102 and the first terminal of the transistor 103 can be connected to the wiring 113. In this manner, since backward bias can be applied to the transistor 102 and the transistor 103, deterioration of characteristics of the transistor 102 and the transistor 103 can be eased. However, this embodiment is not limited to this example. The signal IN2 can be input to one of the wirings 116A and 116B and only one of the wirings 116A and 116B can be connected to the wiring 113. Alternatively, the signal OUT, the signal IN3, the signal IN4, or another signal can be input to the wiring 116A and/or the wiring 116B. In that case, the first terminal of the transistor 103 and/or the first terminal of the transistor 102 can be connected to the wiring 111, the wiring 114, or the wiring 115. Alternatively, the signal OUT, the signal IN2, the signal IN3, the signal IN4, or another signal can be input to the wiring 116C and/or the wiring 116D. In that case, the terminal 104*c* of the circuit 104 and/or the terminal 105*d* of the circuit 105 can be connected to the wiring 111, the wiring 113, the wiring 114, or the wiring 115.

Figure 6A:
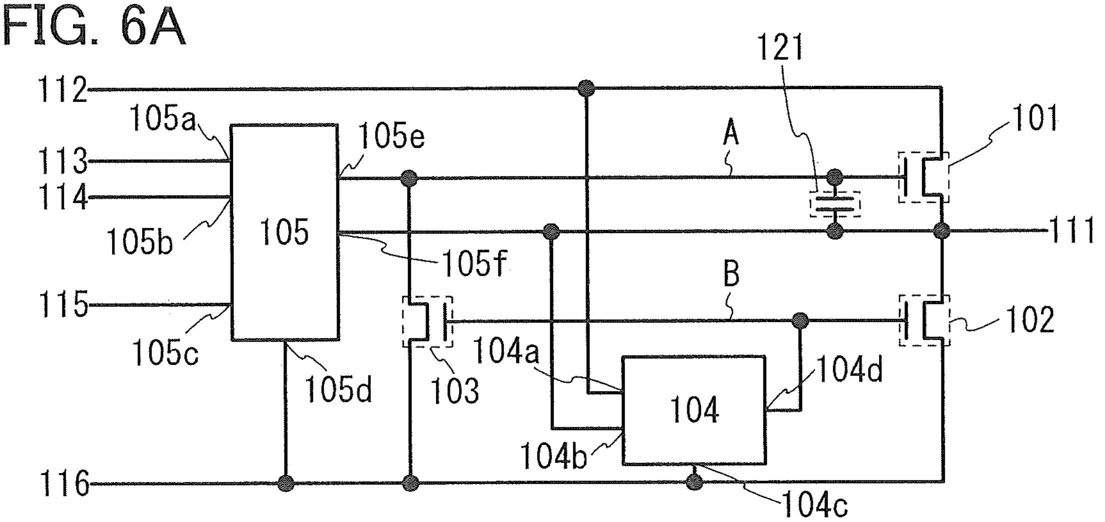
FIGS. 6A to 6C are circuit diagrams of a semiconductor device.

Note that as shown in FIG. 6A, a capacitor 121 can be additionally connected between the gate and the second terminal of the transistor 101. In this manner, the potential of the node A can be made high in the bootstrap operation in the period T2. Accordingly, since Vgs of the transistor 101 is increased, the falling time or rising time of the signal OUT can be shortened. However, this embodiment is not limited to this example. A transistor can be used as a MOS capacitor of the capacitor 121. In that case, in order to increase the capacitance value of the transistor used as the MOS capacitor, it is preferable that the gate of the transistor be connected to the node A and the first terminal or the second terminal of the transistor be connected to the wiring 111.

Note that like in FIG. 6A, the capacitor 121 can be additionally connected between the gate and the second terminal of the transistor 101 in FIGS. 5A and 5B. Alternatively, a transistor whose first terminal and second terminal are connected to the wiring 111 and whose gate is connected to the node A can be additionally provided.

Figure 6B:
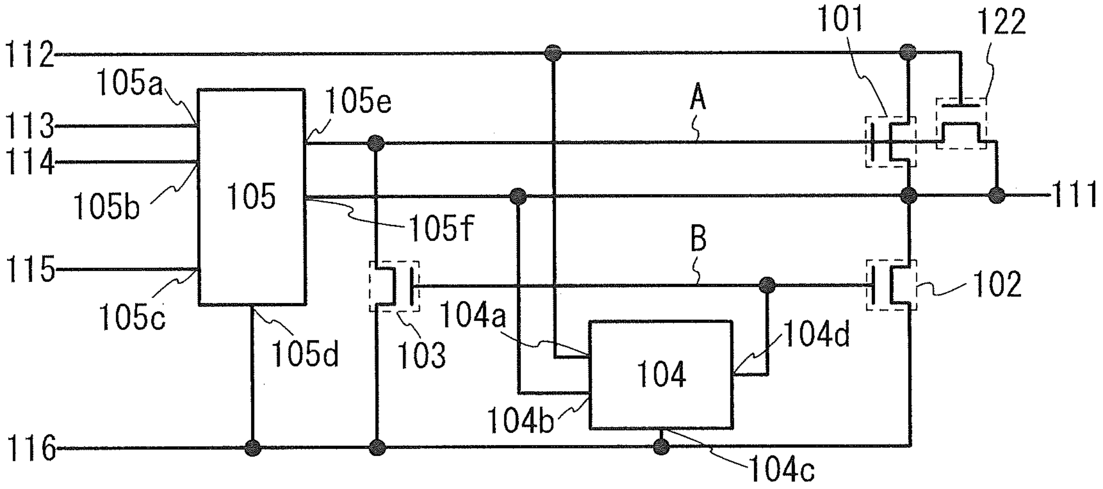

Note that as shown in FIG. 6B, a transistor 122 whose first terminal is connected to the wiring 111, whose second terminal is connected to the node A, and whose gate is connected to the wiring 112 can be additionally provided. The transistor 122 preferably has the same polarity as the transistors 101 to 103 and is an n-channel transistor in many cases. However, this embodiment is not limited to this example. The transistor 122 can be a p-channel transistor. The transistor 122 has a function of controlling timing when the node A and the wiring 111 are brought into electrical conduction in accordance with the signal IN2 and can function as a switch. The transistor 122 is turned on in the period T4 and brings the node A and the wiring 111 into electrical conduction.

Note that as shown in FIG. 6B, the transistor 122 whose first terminal is connected to the wiring 111, whose second terminal is connected to the node A, and whose gate is connected to the wiring 112 can be additionally provided in FIGS. 5A and 5B and FIG. 6A.

Figure 6C:
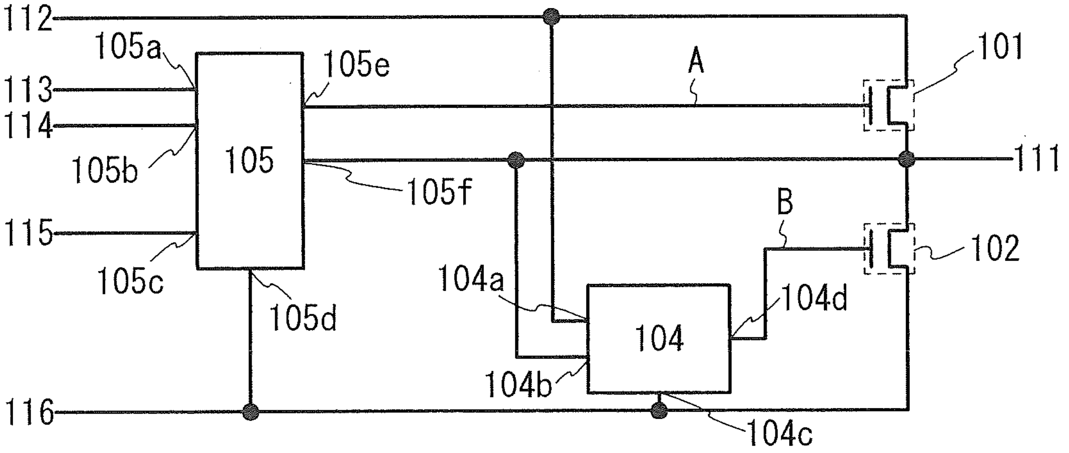

Note that as shown in FIG. 6C, the transistor 103 can be eliminated. In that case, the node A is in a floating state in the period T4 in many cases. However, this embodiment is not limited to this example. The transistor 102 can be eliminated. In that case, the wiring 111 is in a floating state in the period T4 in many cases. In this manner, by elimination of one of the transistor 102 and the transistor 103, the number of transistors can be reduced. Therefore, reduction in a layout area, improvement in yield, or the like can be achieved.

Note that like in FIG. 6C, the transistor 102 or the transistor 103 can be eliminated in FIGS. 5A and 5B and FIGS. 6A and 6B. Specifically in FIG. 6B, one of the transistor 102 and the transistor 103 is preferably eliminated. This is because, since the node A and the wiring 111 are brought into electrical conduction in the period T4, the node A or the wiring 111 does not go into a floating state.

Figure 7A:
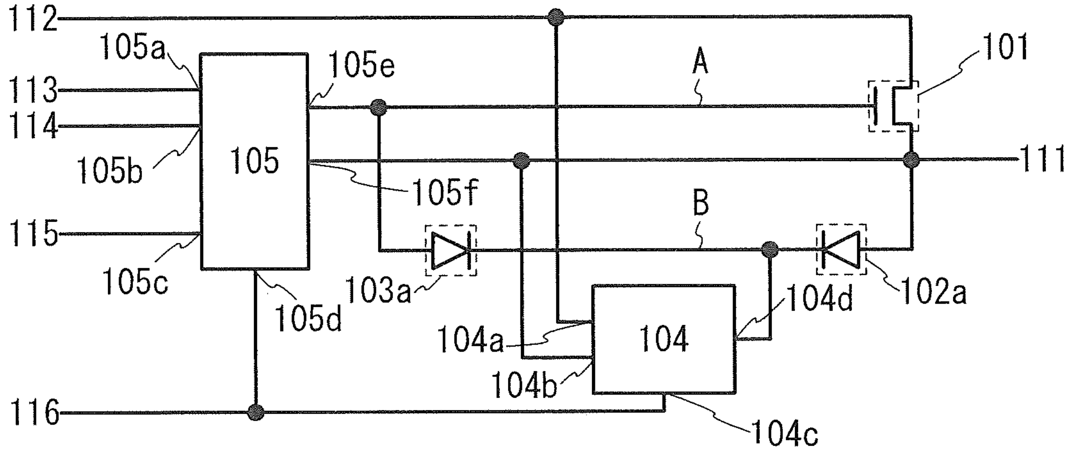
FIGS. 7A to 7C are circuit diagrams of a semiconductor device.

Note that as shown in FIG. 7A, the transistor 102 can be replaced with a diode 102*a* one terminal (also referred to as a positive electrode) of which is connected to the wiring 111 and the other terminal (also referred to as a negative electrode) of which is connected to the node B. In addition, the transistor 103 can be replaced with a diode 103*a* one terminal (also referred to as a positive electrode) of which is connected to the node A and the other terminal (also referred to as a negative electrode) of which is connected to the node B. In that case, the circuit 104 can decrease the potential of the node B to V1 in the period T4 and increase the potential of the node B to V2 in the period T1, the period T2, and the period T5. However, this embodiment is not limited to this example. Only one of the transistor 102 and the transistor 103 can be replaced with a diode. Alternatively, the diode 102*a* and/or the diode 103*a* can be additionally provided.

Note that like in FIG. 7A, the transistor 102 can be replaced with the diode 102*a* one terminal of which is connected to the wiring 111 and the other terminal of which is connected to the node B in FIGS. 5A and 5B and FIGS. 6A to 6C. Alternatively, the transistor 103 can be replaced with the diode 103*a* one terminal of which is connected to the node A and the other terminal of which is connected to the node B. Alternatively, the diode 102*a* and/or the diode 103*a* can be additionally provided.

Note that although not shown, the transistor 102 or the transistor 103 can be diode-connected in FIG. 1A, FIGS. 5A and 5B, FIGS. 6A to 6C, and FIG. 7A. In that case, the first terminal of the transistor 102 is connected to the node B, the second terminal of the transistor 102 is connected to the wiring 111, and the gate of the transistor 102 is connected to the node B or the wiring 111. The first terminal of the transistor 103 is connected to the node B, the second terminal of the transistor 103 is connected to the node A, and the gate of the transistor 103 is connected to the node A or the node B. However, this embodiment is not limited to this example. Only one of the transistor 102 and the transistor 103 can be diode-connected.

Figure 7B:
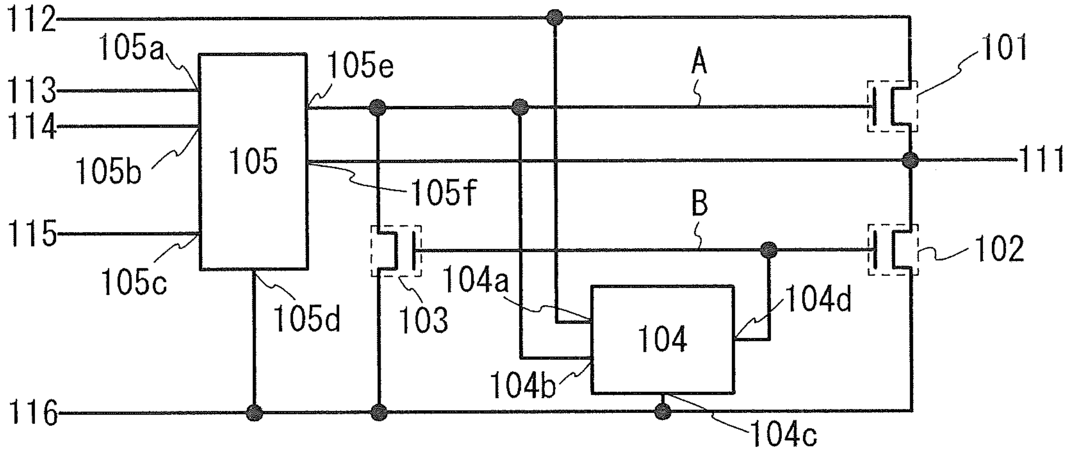

Note that as shown in FIG. 7B, the terminal 104*b* of the circuit 104 can be connected to the node A. In this manner, since a signal in an L level can be prevented from being input to the terminal 104*b* of the circuit 104 in the period T2, the potential of the node B is easily maintained as V1. Therefore, the transistor 102 and the transistor 103 can be prevented from being turned on because of an instant increase in the potential of the node B.

Note that like in FIG. 7B, the terminal 104*b* of the circuit 104 can be connected to the node A in FIGS. 5A and 5B, FIG. 6A to 6C, and FIG. 7A.

Figure 7C:
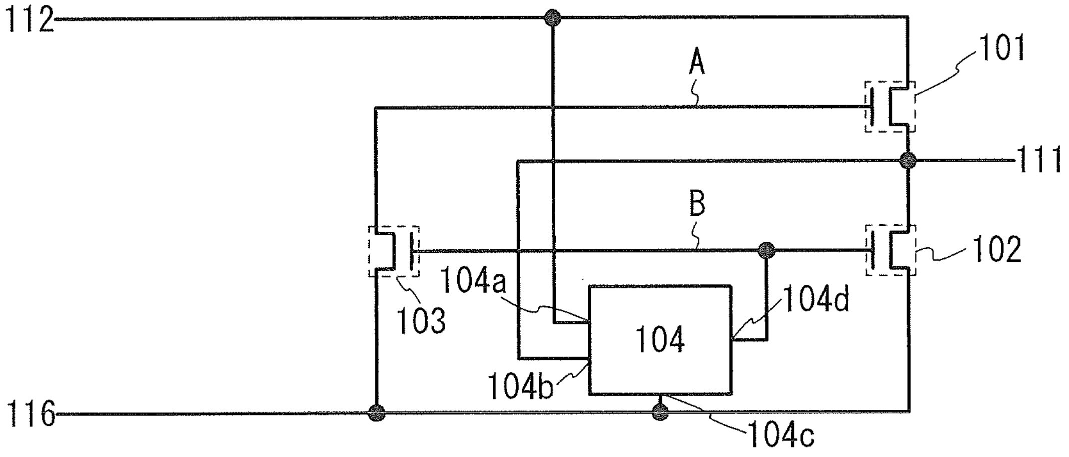

Note that as shown in FIG. 7C, the circuit 105 can be eliminated.

Note that like in FIG. 7C, the circuit 105 can be eliminated in FIGS. 5A and 5B, FIG. 6A to 6C, and FIGS. 7A and 7B.

Note that as shown in FIG. 28B, the terminal 104*a* of the circuit 104 can be connected to the wiring 113. However, this embodiment is not limited to this example. The terminal 104*a* of the circuit 104 can be connected to a variety of wirings, terminals, or nodes. Note that like in FIG. 28B, the terminal 104*a* of the circuit 104 can be connected to the wiring 113 in FIGS. 5A and 5B, FIGS. 6A to 6C, and FIGS. 7A and 7B.

Figure 8A:
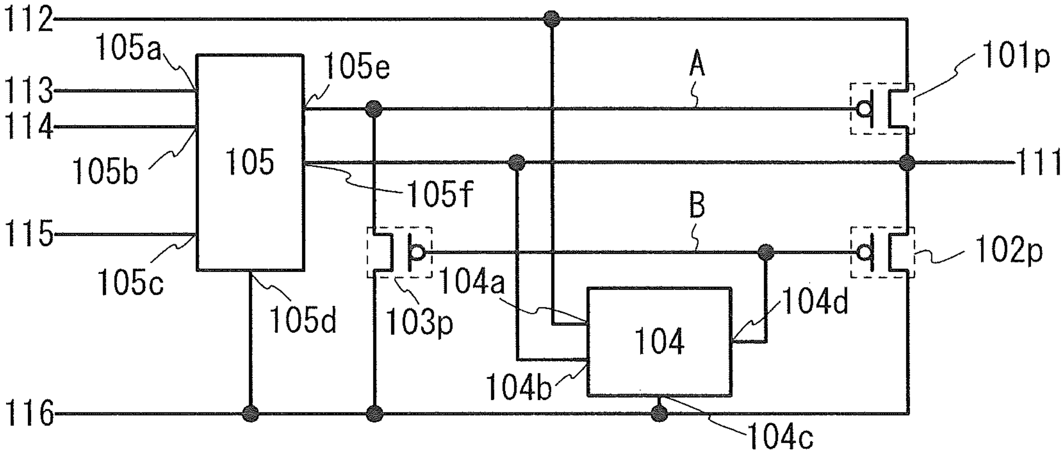
FIG. 8A is a circuit diagram of a semiconductor device and FIG. 8B is a timing chart illustrating a driving method of the semiconductor device.

Note that as shown in FIG. 8A, p-channel transistors can be used as the transistors 101 to 103. A transistor 101*p*, a transistor 102*p*, and a transistor 103*p* corresponds to the transistor 101, the transistor 102, and the transistor 103, respectively, and are p-channel transistors. In addition, as shown in FIG. 8B, in the case where transistors are p-channel transistors, the voltage V2 is supplied to the wiring 116 and the signal OUT, the signal IN1, the signal IN2, the signal IN3, the signal IN4, the potential of the node A, and the potential of the node B are inverted signals and potentials of those in the timing chart in FIG. 1B.

Note that in FIG. 8A, the transistors included in the circuit 104 and the circuit 105 are preferably p-channel transistors. However, this embodiment is not limited to this example. The transistors included in the circuit 104 and the circuit 105 can be n-channel transistors.

Figure 8B:
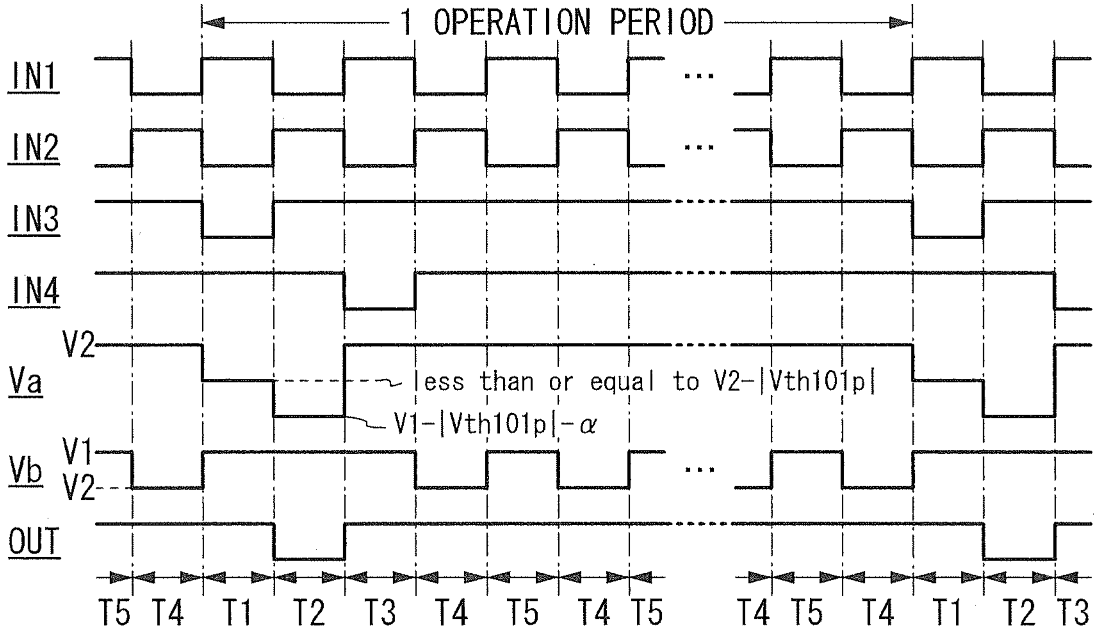

Note that like in FIGS. 8A and 8B, p-channel transistors can be used as the transistors 101 to 103 in FIGS. 5A and 5B, FIGS. 6A to 6C, and FIGS. 7A to 7C.

Embodiment 2

In this embodiment, a specific example of the circuit 104 described in Embodiment 1 is described. Note that the circuit 104 can be referred to as a semiconductor device, a driver circuit, or a gate driver. Note that description of the content described in Embodiment 1 is omitted. Note that the content described in Embodiment 1 can be freely combined with a content described in this embodiment.

First, one example of the circuit 104 is described with reference to FIG. 9A. In the example in FIG. 9A, the circuit 104 includes a transistor 201 (also referred to as a fourth transistor), a transistor 202 (also referred to as a fifth transistor), a transistor 203 (also referred to as a sixth transistor), and a transistor 204 (also referred to as a seventh transistor). However, this embodiment is not limited to this example. Any of these transistors can be eliminated. Alternatively, any of these transistors can be replaced with any of a variety of elements such as a capacitor, a resistor and a diode, or a circuit in which any of these elements are combined. Alternatively, a variety of elements such as a transistor, a capacitor, a resistor and a diode or a circuit in which any of these elements are combined can be additionally provided.

Note that for example, the transistors 201 to 204 are n-channel transistors. Specifically, in the case where the transistors 101 to 103 in Embodiment 1 are n-channel transistors, it is preferable that the transistors 201 to 204 be n-channel transistors. Accordingly, all the transistors can be n-channel transistors. However, this embodiment is not limited to this example. The transistors 201 to 204 can be p-channel transistors.

Next, an example of a connection relation of the circuit 104 is described. A first terminal of the transistor 201 is connected to the wiring 112 and a second terminal of the transistor 201 is connected to the node B. A first terminal of the transistor 202 is connected to the wiring 116, a second terminal of the transistor 202 is connected to the node B, and a gate of the transistor 202 is connected to the wiring 111. A first terminal of the transistor 203 is connected to the wiring 112, a second terminal of the transistor 203 is connected to a gate of the transistor 201, and a gate of the transistor 203 is connected to the wiring 112. A first terminal of the transistor 204 is connected to the wiring 116, a second terminal of the transistor 204 is connected to the gate of the transistor 201, and a gate of the transistor 204 is connected to the wiring 111. However, this embodiment is not limited to this example. A variety of connection structures can be employed.

Note that a connection portion of the gate of the transistor 201, the second terminal of the transistor 203, or the second terminal of the transistor 204 is referred to as a node C. Note that the node C can be referred to as a wiring or a terminal.

Note that as described in Embodiment 1, a variety of signals, voltages, or currents can be input to the wiring 111, the wiring 112, or the wiring 116. Here, for example, the signal OUT described in Embodiment 1 is input to the wiring 111. For example, the signal IN1 described in Embodiment 1 is input to the wiring 112. For example, the voltage V1 described in Embodiment 1 is supplied to the wiring 116. However, this embodiment is not limited to this example.

Next, examples of functions of the transistors 201 to 204 are described. The transistor 201 has a function of controlling timing when the signal IN2 is supplied to the node B in accordance with the potential of the node C and can function as a bootstrap transistor or a switch. The transistor 202 has a function of controlling timing when the voltage V1 is supplied to the node B by controlling the electrical conduction state of the wiring 116 and the node B in accordance with the potential (the signal OUT) of the wiring 111 and can function as a switch. The transistor 203 has a function of making the node C go into a floating state after increasing the potential of the node C and can function as a diode. The transistor 204 has a function of controlling timing when the voltage V1 is supplied to the node C by controlling the electrical conduction state of the wiring 116 and the node C in accordance with the potential (the signal OUT) of the wiring 111 and can function as a switch. However, this embodiment is not limited to this example. The transistors 201 to 204 can have a variety of functions other than above. Alternatively, it is acceptable that these elements or circuits do not have the above-described functions.

Next, operation of the circuit 104 is described with reference to FIG. 1B and FIGS. 9B to 9F. FIG. 9B is an example of a schematic view of the operation of the circuit 104 in the period T1. FIG. 9C is an example of a schematic view of the operation of the circuit 104 in the period T2. FIG. 9D is an example of a schematic view of the operation of the circuit 104 in the period T3. FIG. 9E is an example of a schematic view of the operation of the circuit 104 in the period T4. FIG. 9F is an example of a schematic view of the operation of the circuit 104 in the period T5.

First, for convenience, the operation is described in order from the operation in the period T2. In the period T2, the signal IN2 goes into an H level and the signal OUT goes into an H level. Since the signal OUT goes into the H level, the transistor 202 and the transistor 204 are turned on. Then, the wiring 116 and the node B are brought into electrical conduction and the wiring 116 and the node C are brought into electrical conduction. Accordingly, since the voltage V1 is supplied to the node B from the wiring 116 through the transistor 202, the potential of the node B is decreased to V1. Then, since the voltage V1 is supplied to the node C from the wiring 116 through the transistor 204, the potential of the node C is decreased. The potential of the node C at that time is determined by operating points of the transistor 203 and the transistor 204. Here, for example, the potential of the node C has a value smaller than the sum of the voltage V1 and the threshold voltage of the transistor 201 (Vth201), (V1+Vth201). Therefore, the transistor 201 is turned off, whereby the wiring 112 and the node B are brought out of electrical conduction.

Next, in the period T3, the signal IN1 goes into an L level and the signal OUT goes into an L level. Since the signal OUT goes into the L level, the transistor 202 and the transistor 203 are turned off. Therefore, the wiring 116 and the node B are brought out of electrical conduction and the wiring 116 and the node C are brought out of electrical conduction. Then, since the signal IN1 goes into the L level, the transistor 203 is turned off. Accordingly, the node C goes into a floating state, whereby the potential in the period T2 is maintained. Therefore, the transistor 201 is kept off.

Next, in the period T4, the signal IN1 goes into the H level and the signal OUT is kept at the L level. Since the signal OUT is kept at the L level, the transistor 202 and the transistor 203 are kept off. Therefore, the wiring 116 and the node B are kept out of electrical conduction and the wiring 116 and the node C are kept out of electrical conduction. At that time, the signal IN1 is in the H level. Accordingly, the transistor 203 is turned on, whereby the wiring 112 and the node C are brought into electrical conduction. Therefore, since the signal IN1 in the H level is supplied to the node C from the wiring 112 through the transistor 203, the potential of the node C starts to increase. After that, when the potential of the node C becomes equal to (V1+Vth201), the transistor 201 is turned on. Then, the wiring 112 and the node B are brought into electrical conduction. Therefore, since the signal IN1 in the H level is supplied to the node B from the wiring 112 through the transistor 201, the potential of the node B starts to increase. After that, when the potential of the node C becomes equal to the value obtained by subtracting the threshold voltage of the transistor 203 (Vth203) from the potential of the signal IN1 in the H level (V2), the transistor 203 is turned off. Therefore, the wiring 112 and the node C are brought out of electrical conduction. Then, the node C goes into a floating state, whereby the potential of the node C continues to increase by capacitive coupling of the parasitic capacitance between the gate and the second terminal of the transistor 201, that is, bootstrap operation. Then, if the potential of the node C gets higher than (V2+Vth201), the potential of the node B increases up to V2.

Next, in the period T5 or the period T1, the signal IN1 goes into the L level and the signal OUT is kept at the L level. Since the signal OUT is kept at the L level, the transistor 202 and the transistor 203 are kept off. Therefore, the wiring 116 and the node B are kept out of electrical conduction and the wiring 116 and the node C are kept out of electrical conduction. Then, the signal IN1 goes into the L level. Accordingly, the transistor 203 is turned off, whereby the wiring 112 and the node C are kept out of electrical conduction. Therefore, since the potential of the node C goes into a floating state, the node C maintains potential which exceeds (V2+Vth201). As a result, the transistor 201 is kept on, whereby the wiring 112 and the node B are kept in electrical conduction. Therefore, since the signal IN1 in the L level is supplied to the node B from the wiring 112 through the transistor 201, the potential of the node B is decreased to V1. At that time, the node C is in the floating state, whereby the potential of the node C is decreased by capacitive coupling of the parasitic capacitance between the gate and the second terminal of the transistor 201 in many cases. Further, the potential of the node C is decreased by a value of an increase in the potential due to the bootstrap operation in the period T4 in many cases.

Figure 9A:
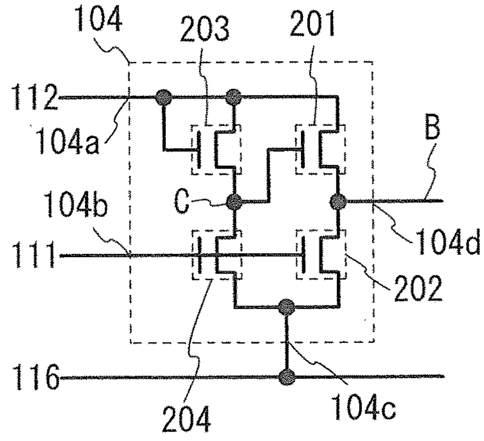
FIGS. 9A to 9F are schematic views illustrating a driving method of a semiconductor device.
Figure 9B:
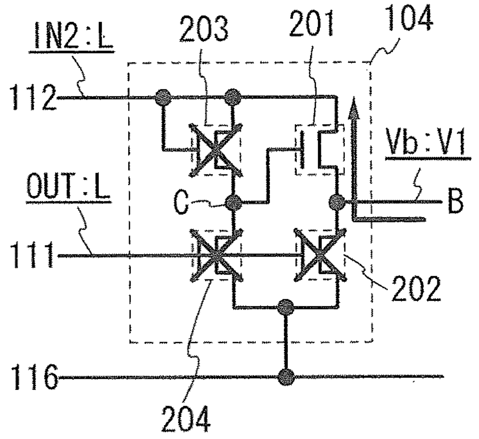
Figure 9C:
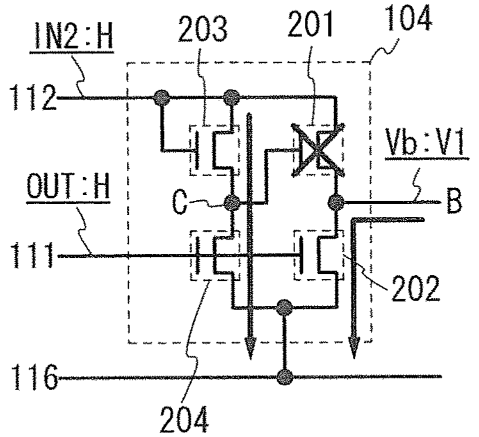
Figure 9D:
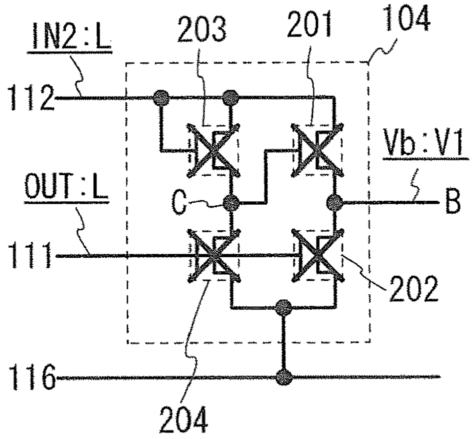
Figure 9E:
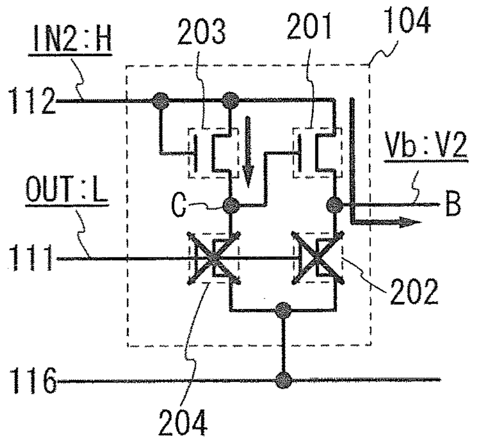
Figure 9F:
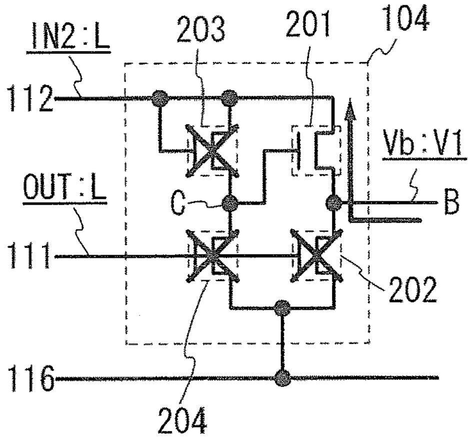

The above is the description of the circuit 104 in FIG. 9A. The circuit 104 in FIG. 9A can increase the potential of the node B to V2 by the bootstrap operation. Therefore, Vgs of the transistor 102 and the transistor 103 in Embodiment 1 can be increased. As a result, since the channel width of the transistor 102 and the transistor 103 can be reduced, reduction in a layout area can be achieved. Alternatively, even if the threshold voltages of the transistor 102 and the transistor 103 are increased, the transistors can be easily turned on. Alternatively, since the on-resistances of the transistor 102 and the transistor 103 are reduced, the potential of the node A and the potential of the wiring 111 can be easily maintained as V1.

Alternatively, all the transistors in the circuit 104 in FIG. 9A can be n-channel transistors or all the transistors in the circuit 104 in FIG. 9A can be p-channel transistors. Accordingly, reduction in the number of steps, improvement in yield, improvement in reliability, or reduction in cost can be achieved. Specifically, if all the transistors are n-channel transistors, non-single-crystal semiconductors, microcrystalline semiconductors, organic semiconductors, or oxide semiconductors can be used for semiconductor layers of the transistors. Accordingly, reduction in the number of steps, improvement in yield, improvement in reliability, or reduction in cost can be achieved. However, this embodiment is not limited to this example. The circuit 104 in FIG. 9A can include a CMOS circuit which includes a p-channel transistor and an n-channel transistor. Moreover, single crystal semiconductors or polycrystalline semiconductors can be used for the semiconductor layers of the transistors.

Alternatively, in the circuit 104 in FIG. 9A, the transistors 202 to 204 are turned off in at least one of the period T4 and the period T5. Therefore, since the transistor stays in an off state in one operation period, deterioration of characteristics of the transistor such as increase in threshold voltage or decrease in mobility can be suppressed. Alternatively, an increase and a decrease in the potential of the node C are repeated in the period T4 and the period T5. Accordingly, since pulses are input to the transistor 201, the deterioration of characteristics of the transistor such as increase in threshold voltage or decrease in mobility can be suppressed. Specifically, if a non-single-crystal semiconductor, a microcrystalline semiconductor, an organic semiconductor, an oxide semiconductor, or the like is used for a semiconductor layer of the transistor, the characteristics of the transistor obviously deteriorates in many cases. However, in the semiconductor device in FIG. 9A, a non-single-crystal semiconductor, a microcrystalline semiconductor, an organic semiconductor, an oxide semiconductor, or the like can be easily used for the semiconductor layer of the transistor because deterioration of characteristics of the transistor can be suppressed. However, this embodiment is not limited to this example. A polycrystalline semiconductor or a single crystal semiconductor can be used for the semiconductor layer.

Note that for example, the channel width of the transistor 203 is preferably smaller than that of the transistor 204. This is because the potential of the node C is made low when the transistor 203 and the transistor 204 are turned on in the period T2. From a similar reason, for example, the channel length of the transistor 203 is preferably smaller than that of the transistor 204. However, this embodiment is not limited to this example. The channel width of the transistor 203 can be larger than that of the transistor 204. Alternatively, the channel width of the transistor 203 can be smaller than that of the transistor 204.

Note that for example, the channel width of the transistor 204 is preferably smaller than that of the transistor 202. This is because the load of the node B is heavier than that of the node C in many cases. From a similar reason, for example, the channel width of the transistor 203 is preferably shorter than that of the transistor 201. However, this embodiment is not limited to this example. The channel width of the transistor 204 can be larger than that of the transistor 202. Alternatively, the channel width of the transistor 203 can be larger than that of the transistor 201.

Note that for example, it is preferable that the channel width of the transistor 201 be approximately equal to that of the transistor 202. This is because both of the transistor 201 and the transistor 202 control the potential of the node C and have the same polarity. However, this embodiment is not limited to this example. The channel width of the transistor 201 can be larger or smaller than that of the transistor 202.

Note that for example, the channel width of the transistor 201, the transistor 202, the transistor 203, or the transistor 204 is preferably smaller than that of the transistor 101, the transistor 102, or the transistor 103 in Embodiment 1. However, this embodiment is not limited to this example. The channel width of any of the transistors 201 to 204 can be larger than that of the transistor 101, the transistor 102, or the transistor 103 in FIG. 1A.

Note that for example, like in the case of the transistor 101 in Embodiment 1, the parasitic capacitance between the gate and the second terminal of the transistor 201 is preferably higher than the parasitic capacitance between the gate and the first terminal of the transistor 201. This is because the potential of the node C is easily increased by the bootstrap operation in the period T4. Therefore, an area where a conductive layer which functions as a gate and a conductive layer which functions as a source or drain on the second terminal side is preferably larger than that on the first terminal side. However, this embodiment is not limited to this example.

Note that a signal whose potential in an L level is lower than V1 can be input to the terminal 104*b*. In this manner, since backward bias can be applied to the transistor 202 and the transistor 204, deterioration of characteristics of the transistor 202 and the transistor 204 can be eased. Alternatively, a signal whose potential in an H level is lower than V2 can be input to the terminal 104*b*. In this manner, since Vgs can be decreased when the transistor 202 and the transistor 204 are on, the deterioration of the characteristics of the transistor 202 and the transistor 204 can be suppressed. In such a case, a signal whose potential in an L level is lower than V1, a signal whose potential in an H level is lower than V2, or a signal whose potential in an L level is lower than V1 and whose potential in an H level is lower than V2 can be input to the wiring 111. However, this embodiment is not limited to this example. The terminal 104*b* can be connected to a different wiring from the wiring 111 and the signal whose potential in the L level is lower than V1, the signal whose potential in the H level is lower than V2, or the signal whose potential in the L level is lower than V1 and whose potential in the H level is lower than V2 can be input to the different wiring.

Figure 10A:
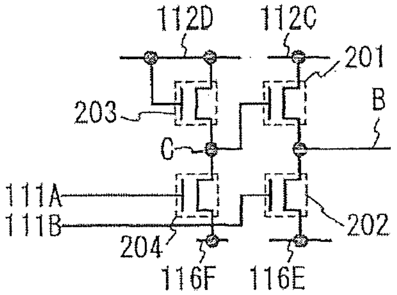
FIGS. 10A to 10F are circuit diagrams of a semiconductor device.

Note that like in Embodiment 1, a wiring can be divided into a plurality of wirings. In addition, the same signal or voltage or different signals or voltages can be input to the plurality of wirings. Alternatively, the plurality of wirings can be connected to the same wiring or element or different wirings or elements. One example in FIG. 10A illustrates a structure in the case where the wiring 111 is divided into a plurality of wirings of wirings 111A and 111B, the wiring 112 is divided into a plurality of wirings of wirings 112C and 112D, and the wiring 116 is divided into a plurality of wirings of wirings 116E and 116F. In addition, the gate of the transistor 204 is connected to the wiring 111A and the gate of the transistor 202 is connected to the wiring 111B. The first terminal of the transistor 201 is connected to the wiring 112C and the first terminal and the gate of the transistor 203 are connected to the wiring 112D. The first terminal of the transistor 202 is connected to the wiring 116E and the first terminal of the transistor 204 is connected to the wiring 116F. However, this embodiment is not limited to this example. Any one or two of the wiring 111, the wiring 112, and the wiring 116 can be divided into a plurality of wirings. Alternatively, different signals or voltages can be input to the gate and the first terminal of the transistor 203. In that case, the gate and the first terminal of the transistor 203 can be connected to different wirings.

Note that in FIG. 10A, the wirings 111A and 111B correspond to the wiring 111 in FIG. 9A. Therefore, like in the case of the wiring 111, the signal OUT can be input to the wirings 111A and 111B and the wirings 111A and 111B can function as signal lines. However, this embodiment is not limited to this example. Voltages such as the voltage V1 and the voltage V2 can be supplied to the wirings 111A and 111B and the wirings 111A and 111B can function as power supply lines. Alternatively, different signals or voltages can be input to the wirings 111A and 111B. Alternatively, a variety of signals, voltages, or currents other than above can be input to the wirings 111A and 111B.

Note that in FIG. 10A, the wirings 112C and 112D correspond to the wiring 112 in FIG. 9A. Therefore, like in the case of the wiring 112, the signal IN1 can be input to the wirings 112C and 112D and the wirings 112C and 112D can function as signal lines. However, this embodiment is not limited to this example. Voltages such as the voltage V1 and the voltage V2 can be supplied to the wirings 112C and 112D and the wirings 112C and 112D can function as power supply lines. Alternatively, different signals or voltages can be input to the wirings 112C and 112D. Alternatively, a variety of signals, voltages, or currents other than above can be input to the wirings 112C and 112D.

Note that in FIG. 10A, the wirings 116E and 116F correspond to the wiring 116 in FIG. 9A. Therefore, like in the case of the wiring 116, the voltage V1 can be supplied to the wirings 116E and 116F and the wirings 116E and 116F can function as power supply lines. However, this embodiment is not limited to this example. A signal such as the signal OUT, the signal IN1, the signal IN2, the signal IN3, or signal IN4 can be input to the wirings 116E and 116F so that the wirings 116E and 116F can function as signal lines. Alternatively, different signals or voltages can be supplied to the wirings 116E and 116F. Alternatively, a variety of signals, voltages, or currents other than above can be input to the wirings 116E and 116F.

Note that in FIG. 10A, a signal in an L level in the period T2 can be input to the wirings 116E and 116F. For example, the signal IN2 can be input to the wirings 116E and 116F. In that case, the wirings 116E and 116F can be connected to the wiring 113 described in Embodiment 1. In this manner, since backward bias is applied to the transistor 202 and the transistor 204, deterioration of characteristics of the transistor 202 and the transistor 204 can be eased. However, this embodiment is not limited to this example. The signal IN2 can be input to only one of the wirings 116E and 116F. In that case, only one of the wirings 116E and 116F can be connected to the wiring 113. Alternatively, the signal IN3 or the signal IN4 can be input to the wiring 116E and/or the wiring 116F. In that case, the wiring 116E and/or the wiring 116F can be connected to the wiring 114 or the wiring 115 described in Embodiment 1.

Note that in FIG. 10A, the signal IN2 can be input to the wiring 112D. In that case, the gate and the first terminal of the transistor 203 can be connected to the wiring 113. In this manner, in the period T3, the potential of the node C becomes equal to a value obtained by subtracting the threshold voltage of the transistor 203 (Vth203) from the potential of the signal IN2 in an H level (V2), (V2−Vth203). After that, in the period T4, since the signal IN1 goes into an H level, the potential of the node C is further increased from (V2−Vth203) by bootstrap operation. Accordingly, since the potential of the node C is increased, Vgs of the transistor 201 can be increased. As a result, a falling time and a rising time of an output signal (the potential of the node B) from the circuit 104 can be shortened. Alternatively, delay of the output signal from the circuit 104 can be suppressed. However, this embodiment is not limited to this example. The voltage V2 can be supplied to the wiring 112D.

Figure 10B:
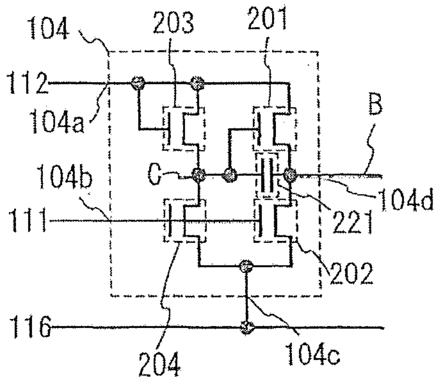

Note that as shown in FIG. 10B, a capacitor 221 can be additionally connected between the gate and the second terminal of the transistor 201. In this manner, like in FIG. 6A, the potential of the node C can be increased. However, this embodiment is not limited to this example. Like in FIG. 6A, for the capacitor 221, a transistor whose first terminal and second terminal are connected to the node B and whose gate is connected to the node C can be used as a MOS capacitor.

Note that like in FIG. 10B, the capacitor 221 can be additionally connected between the gate and the second terminal of the transistor 201 in FIG. 10A. Alternatively, a transistor whose first terminal and second terminal are connected to the node B and whose gate is connected to the node C can be additionally provided.

Figure 10C:
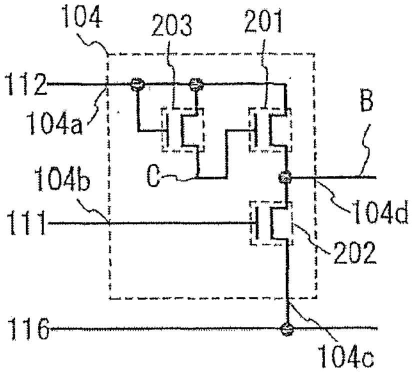
Figure 10D:
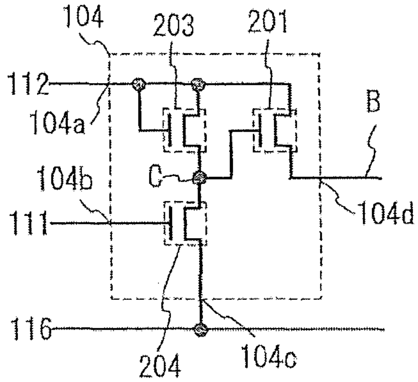

Note that as shown in FIG. 10C, the transistor 204 can be eliminated. Alternatively, as shown in FIG. 10D, the transistor 202 can be eliminated. In this manner, the number of transistors can be reduced. Therefore, reduction in a layout area, improvement in yield, or the like can be achieved. However, this embodiment is not limited to this example. Both of the transistor 202 and the transistor 204 can be eliminated.

Note that like in FIG. 10C or FIG. 10D, the transistor 202 and/or the transistor 204 can be eliminated in FIGS. 10A and 10B.

Figure 10E:
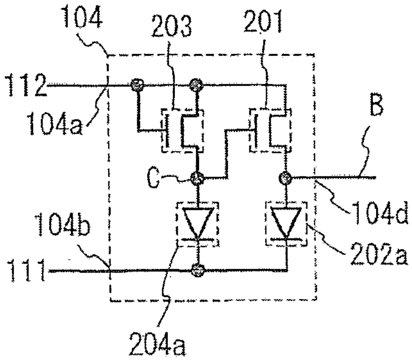

Note that as shown in FIG. 10E, the transistor 202 can be replaced with a diode 202*a* one terminal (also referred to as a positive electrode) of which is connected to the node B and the other terminal (also referred to as a negative electrode) of which is connected to the wiring 111. Alternatively, the transistor 203 can be replaced with a diode 203*a* one terminal (also referred to as a positive electrode) of which is connected to the node C and the other terminal (also referred to as a negative electrode) of which is connected to the wiring 111. In that case, an inverted signal of the signal OUT or an inverted signal of the potential of the node A can be input to the terminal 104*b* of the circuit 104. In order to achieve this, the wiring 111 or the node A can be connected to the terminal 104*b* of the circuit 104 through a circuit which has a function of inverting and outputting an input signal, such as an inverter circuit, a NAND circuit, or a NOR circuit. However, this embodiment is not limited to this example. One of the transistor 202 and the transistor 204 can be replaced with a diode. Alternatively, the diode 202*a* and/or the diode 203*a* can be additionally provided.

Note that like in FIG. 10E, the transistor 202 can be replaced with the diode 202*a* one terminal of which is connected to the node B and the other terminal of which is connected to the wiring 111 in FIGS. 10A to 10D. Alternatively, the transistor 203 can be replaced with the diode 203*a* one terminal of which is connected to the node C and the other terminal of which is connected to the wiring 111. Alternatively, the diode 202*a* and/or the diode 203*a* can be additionally provided.

Note that although not shown, the first terminal of the transistor 202 is connected to the wiring 111, the second terminal of the transistor 202 is connected to the node B, and the gate of the transistor 202 is connected to the wiring 111 or the node B, whereby the transistor 202 can be diode-connected. Alternatively, the first terminal of the transistor 204 is connected to the wiring 111, the second terminal of the transistor 204 is connected to the node C, and the gate of the transistor 204 is connected to the wiring 111 or the node C, whereby the transistor 204 can be diode-connected. However, this embodiment is not limited to this example. One of the transistor 202 and the transistor 204 can be diode-connected.

Figure 10F:
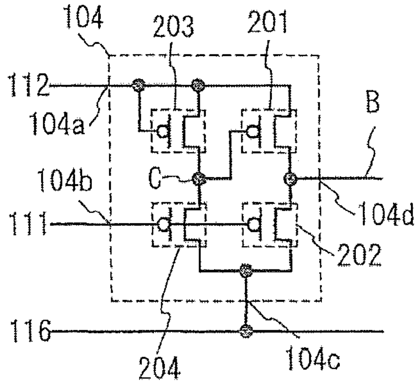

Note that as shown in FIG. 10F, p-channel transistors can be used as the transistors 201 to 204. Specifically in the case where p-channel transistors are used as the transistors 101 to 103 in FIG. 1A, p-channel transistors are preferably used as the transistors 201 to 204. A transistor 201*p*, a transistor 202*p*, a transistor 203*p*, and a transistor 204*p* correspond to the transistor 201, the transistor 202, the transistor 203, and the transistor 204, respectively, and are p-channel transistors.

Note that like in FIG. 10F, p-channel transistors can be used as the transistors 201 to 204 in FIGS. 10A to 10E.

Figure 11:
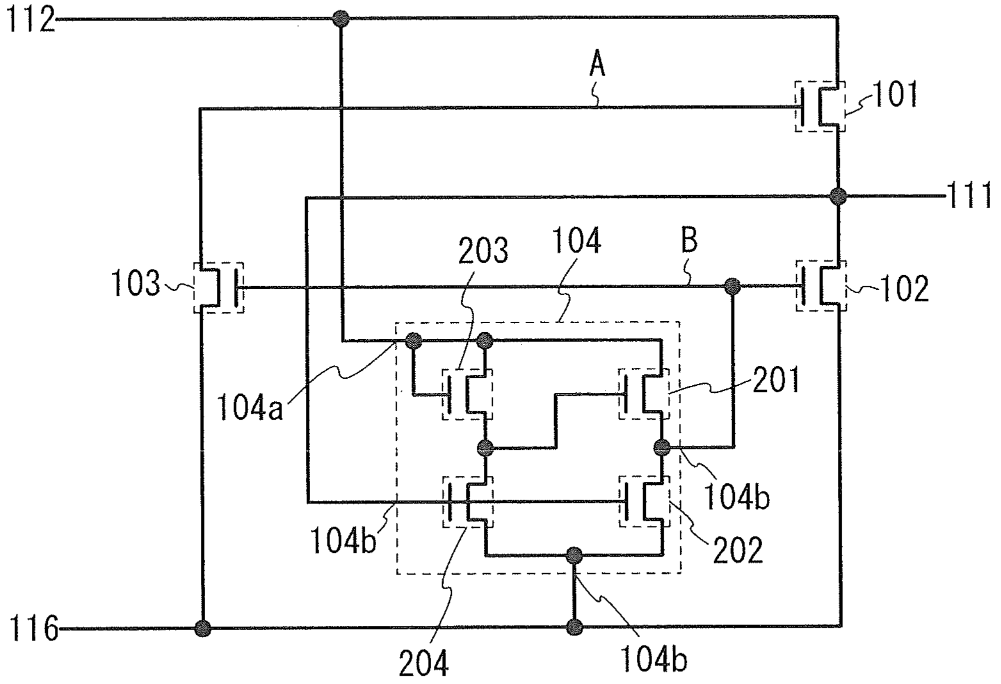
FIG. 11 is a circuit diagram of a semiconductor device.

Note that as described above, the structure of the circuit 104 in this embodiment can be applied to the circuit 104 included in the circuit 100 in Embodiment 1. FIG. 11 illustrates a structure in the case where one example of the circuit 104 in FIG. 9A is applied to the circuit 104 included in the circuit 100 in FIG. 7C, for example. However, this embodiment is not limited to this example. The circuit 104 in the case of FIG. 9A, FIG. 10A, FIG. 10B, FIG. 10C, FIG. 10D, FIG. 10E, or FIG. 10F, or a combination thereof can be used as the circuit 104 included in the circuit 100 in the case of FIG. 1A, FIG. 5A, FIG. 5B, FIG. 6A, FIG. 6B, FIG. 6C, FIG. 7A, FIG. 7B, or FIG. 8A, or a combination thereof.

Embodiment 3

In this embodiment, a specific example of the circuit 105 is described. Note that the circuit 105 can be referred to as a semiconductor device, a driver circuit, or a gate driver. Note that description of the content described in Embodiment 1 or 2 is omitted. Note that the content described in Embodiment 1 or 2 can be freely combined with a content described in this embodiment.

First, one example of the circuit 105 is described with reference to FIG. 12A. In the example in FIG. 9A, the circuit 105 includes a transistor 301 (also referred to as an eighth transistor), a transistor 302 (also referred to as a ninth transistor), a transistor 303 (also referred to as a tenth transistor), a transistor 304 (also referred to as an eleventh transistor), and a transistor 305 (also referred to as a twelfth transistor). However, this embodiment is not limited to this example. Any of these transistors can be eliminated. Alternatively, any of these transistors can be replaced with any of a variety of elements such as a capacitor, a resistor and a diode, or a circuit in which these elements are combined. Alternatively, a variety of elements such as a transistor, a capacitor, a resistor, and a diode or a circuit in which these elements are combined can be additionally provided.

Note that for example, the transistors 301 to 305 are n-channel transistors. Specifically, in the case where the transistors 101 to 103 in Embodiment 1 and the transistors 201 to 204 in Embodiment 2 are n-channel transistors, it is preferable that the transistors 301 to 305 be n-channel transistors. Accordingly, all the transistors can have the same polarity. However, this embodiment is not limited to this example. The transistors 301 to 305 can be p-channel transistors.

Next, an example of a connection relation of the circuit 105 in FIG. 12A is described. A first terminal of the transistor 301 is connected to the wiring 114, a second terminal of the transistor 301 is connected to the node A, and a gate of the transistor 301 is connected to the wiring 114. A first terminal of the transistor 302 is connected to the wiring 114, a second terminal of the transistor 302 is connected to the node A, and a gate of the transistor 302 is connected to the wiring 113. A first terminal of the transistor 303 is connected to the wiring 116, a second terminal of the transistor 303 is connected to the node A, and a gate of the transistor 303 is connected to the wiring 115. A first terminal of the transistor 304 is connected to the wiring 116, a second terminal of the transistor 304 is connected to the wiring 111, and a gate of the transistor 304 is connected to the wiring 115. A first terminal of the transistor 305 is connected to the wiring 116, a second terminal of the transistor 305 is connected to the wiring 111, and a gate of the transistor 305 is connected to the wiring 113. However, this embodiment is not limited to this example. A variety of connection structures other than above can be employed.

Note that as described in Embodiment 1, a variety of signals, voltages, or currents can be input to the wiring 113, the wiring 114, the wiring 115, or the wiring 116. Here, for example, the signal IN2 described in Embodiment 1 is input to the wiring 113; the signal IN3 described in Embodiment 1 is input to the wiring 114; the signal IN4 shown in FIG. 1B or FIG. 3A is input to the wiring 115; and the voltage V1 is supplied to the wiring 116. However, this embodiment is not limited to this example.

Next, examples of functions of the transistors 301 to 305 are described. The transistor 301 controls timing when the signal IN2 in an H level is supplied to the node A in accordance with the signal IN3 and can function as a diode. Alternatively, the transistor 301 has a function of controlling timing when the signal IN3 is supplied to the node A by controlling the electrical conduction state of the wiring 114 and the node A in accordance with the potential of the node A. The transistor 302 has a function of controlling timing when the signal IN3 is supplied to the node A by controlling the electrical conduction state of the wiring 114 and the node A in accordance with the signal IN2 and can function as a switch. The transistor 303 has a function of supplying the voltage V1 to the node A by controlling the electrical conduction state of the wiring 116 and the node A in accordance with the signal IN4 and can function as a switch. The transistor 304 has a function of supplying the voltage V1 to the wiring 111 by controlling the electrical conduction state of the wiring 116 and the wiring 111 in accordance with the signal IN4 and can function as a switch. The transistor 305 has a function of supplying the voltage V1 to the wiring 111 by controlling the electrical conduction state of the wiring 116 and the wiring 111 in accordance with the signal IN2 and can function as a switch. However, this embodiment is not limited to this example. The transistors 301 to 305 can have a variety of functions. Alternatively, it is acceptable that these elements or circuits do not have the above-described functions.

Next, operation of the circuit 105 is described with reference to FIG. 1B, FIGS. 12B and 12C, and FIGS. 13A to 13C. FIG. 12B is an example of a schematic view of the operation of the circuit 105 in the period T1. FIG. 12C is an example of a schematic view of the operation of the circuit 105 in the period T2. FIG. 13A is an example of a schematic view of the operation of the circuit 105 in the period T3. FIG. 13B is an example of a schematic view of the operation of the circuit 105 in the period T4. FIG. 13C is an example of a schematic view of the operation of the circuit 105 in the period T5.

First, in the period T1, the signal IN2 goes into an H level, the signal IN3 goes into an H level, and the signal IN4 goes into an L level. Since the signal IN3 is in the H level, the transistor 301 is turned on. At the same time, since the signal IN2 is in the H level, the transistor 302 and the transistor 305 are turned on. Then, the wiring 114 and the node A are brought into electrical conduction, whereby the signal IN3 is supplied to the node A from the wiring 114 through the transistor 301 and the transistor 302. Therefore, the potential of the node A starts to increase. Similarly, since the wiring 116 and the wiring 111 are brought into electrical conduction, the voltage V1 is supplied to the wiring 111 from the wiring 116 through the transistor 305. Therefore, the potential of the wiring 111 becomes V1. At that time, since the signal IN4 is in the L level, the transistor 303 and the transistor 304 are turned off. Therefore, the wiring 116 and the node A are brought out of electrical conduction, whereby the wiring 116 and the wiring 111 are brought out of electrical conduction. After that, when the potential of the node A becomes equal to a value obtained by subtracting the threshold voltage of the transistor 301 (Vth301) from the potential of the wiring 114 (V2), (V2−Vth301), the transistor 301 is turned off. Similarly, when the potential of the node A becomes equal to a value obtained by subtracting the threshold voltage of the transistor 302 (Vth302) from the potential of the wiring 113 (V2), (V2−Vth302), the transistor 302 is turned off. Therefore, the wiring 114 and the node A are brought out of electrical conduction. Here, for example, when the potential of the node A becomes equal to (V2−Vth301), the transistor 301 and the transistor 302 are turned off. Therefore, the node A goes into a floating state while the potential is maintained as (V2−Vth301).

Next, in the period T2, the signal IN3 goes into an L level, the signal IN4 goes into an L level, and the signal IN5 is kept at the L level. Since the signal IN3 is in the L level, the transistor 301 is kept off. At the same time, since the signal IN2 is in the L level, the transistor 302 is kept off and the transistor 303 is turned off. Therefore, the wiring 114 and the node A are kept out of electrical conduction and the wiring 116 and the wiring 111 are brought out of electrical conduction. At that time, since the signal IN4 is kept at the L level, the transistor 303 and the transistor 304 are kept off. Accordingly, the wiring 116 and the node A are kept out of electrical conduction and the wiring 116 and the wiring 111 are kept out of electrical conduction.

Next, in the period T3, the signal IN2 goes into an H level, the signal IN3 is kept at the L level, and the signal IN4 goes into an H level. Since the signal IN3 is kept at the L level, the transistor 301 is kept off. Then, since the signal IN2 is in the H level, the transistor 302 and the transistor 304 are turned on. Then, the wiring 114 and the node A are brought into electrical conduction, whereby the signal IN3 in the L level is supplied to the node A from the wiring 114 through the transistor 302. Similarly, since the wiring 116 and the wiring 111 are brought into electrical conduction, the voltage V1 is supplied to the wiring 111 from the wiring 116 through the transistor 305. At that time, since the signal IN4 is in the H level, the transistor 303 and the transistor 304 are turned on. Then, the wiring 116 and the node A are brought into electrical conduction, whereby the voltage V1 is supplied to the node A from the wiring 116 through the transistor 303. Similarly, since the wiring 116 and the wiring 111 are brought into electrical conduction, the voltage V1 is supplied to the wiring 111 from the wiring 116 through the transistor 304. Therefore, the potential of the node A decreases to V1 and the potential of the wiring 111 decreases to V1.

Next, in the period T4, the signal IN2 goes into the L level, the signal IN3 is kept at the L level, and the signal IN4 goes into the L level. Since the signal IN3 is kept at the L level, the transistor 301 is kept off. In addition, since the signal IN2 is in the L level, the transistor 302 and the transistor 305 are turned off. Therefore, the wiring 114 and the node A are kept out of electrical conduction and the wiring 116 and the wiring 111 are brought out of electrical conduction. At the same time, since the signal IN4 is in the L level, the transistor 303 and the transistor 304 are turned off. Accordingly, the wiring 116 and the node A are kept out of electrical conduction and the wiring 116 and the wiring 111 are kept out of electrical conduction. In this manner, in the period T4, a signal, voltage, or the like is not supplied to the node A or the wiring 111 from the circuit 105 in many cases.

Next, in the period T5, the signal IN2 goes into the H level, the signal IN3 is kept at the L level, and the signal IN4 is kept at the L level. Since the signal IN4 is kept at the L level, the transistor 303 and the transistor 304 are tuned off. Therefore, the wiring 116 and the node A are kept out of electrical conduction and the wiring 116 and the wiring 111 are kept out of electrical conduction. Similarly, since the signal IN3 is kept at the L level, the transistor 301 is kept off. At that time, since the signal IN2 is in the H level, the transistor 302 and the transistor 305 are turned on. Then, the wiring 114 and the node A are brought into electrical conduction, whereby the signal IN3 in the L level is supplied to the node A from the wiring 114 through the transistor 302. Therefore, the potential of the node A is maintained as V1. Similarly, since the wiring 116 and the wiring 111 are brought into electrical conduction, the voltage V1 is supplied to the wiring 111 from the wiring 116 through the transistor 305. Therefore, the potential of the wiring 111 is maintained as V1.

The above is the description of the circuit 105 in FIG. 12A. In FIG. 12A, all the transistors in the circuit 105 can be n-channel transistors or all the transistors in the circuit 105 can be p-channel transistors. Accordingly, reduction in the number of steps, improvement in yield, improvement in reliability, or reduction in cost can be achieved. Specifically, if all the transistors are n-channel transistors, non-single-crystal semiconductors, microcrystalline semiconductors, organic semiconductors, oxide semiconductors, or the like can be used for semiconductor layers of the transistors. Accordingly, reduction in the number of steps, improvement in yield, improvement in reliability, or reduction in cost can be achieved. However, this embodiment is not limited to this example. The circuit 105 in FIG. 12A can include a CMOS circuit which includes a p-channel transistor and an n-channel transistor. Alternatively, single crystal semiconductors or polycrystalline semiconductors can be used for the semiconductor layers of the transistors.

Alternatively, in the circuit 105 in FIG. 12A, the transistors 301 to 305 are turned off in at least one of the period T4 and the period T5. Therefore, since the transistor stays in an off state in one operation period, deterioration of characteristics of the transistor, such as increase in threshold voltage or reduction in mobility, can be suppressed. Specifically, if a non-single-crystal semiconductor, a microcrystalline semiconductor, an organic semiconductor, an oxide semiconductor, or the like is used for a semiconductor layer of the transistor, the characteristics of the transistor obviously deteriorates in many cases. However, in the circuit 105 in FIG. 12A, a non-single-crystal semiconductor, a microcrystalline semiconductor, an organic semiconductor, an oxide semiconductor, or the like can be easily used for the semiconductor layer of the transistor because deterioration of characteristics of the transistor can be suppressed. However, this embodiment is not limited to this example. A polycrystalline semiconductor or a single crystal semiconductor can be used for the semiconductor layer.

Note that for example, the channel width of the transistor 305 is preferably larger than that of the transistor 302. Alternatively, the channel width of the transistor 304 is preferably larger than that of the transistor 303, for example. This is because, since the load of the wiring 111 is heavier than that of the node A in many cases, the driving capability of a transistor which supplies a signal, voltage, or the like to the wiring 111 is higher than that of a transistor which supplies a signal, voltage, or the like to the node A in many cases. In addition, this is because the transistor 305 and the transistor 304 each have a function of supplying a signal or voltage to the wiring 111, and the transistor 302 and the transistor 303 each have a function of supplying a signal or voltage to the node A. However, this embodiment is not limited to this example. The channel width of the transistor 305 can be smaller than that of the transistor 302. Alternatively, for example, the channel width of the transistor 304 can be smaller than that of the transistor 303. This is because noise is easily generated in the node A by the parasitic capacitance between the first terminal and the gate of the transistor 101 in Embodiment 1; then, the transistor 101 is turned on by the noise and the potential of the wiring 111 is increased in some cases.

Note that for example, the channel width of the transistor 303 is preferably larger than that of the transistor 302. Alternatively, the channel width of the transistor 304 is preferably larger than that of the transistor 305, for example. In this manner, adverse effect of noise generated in the node A and the wiring 111 can be suppressed. However, this embodiment is not limited to this example. The channel width of the transistor 303 can be smaller than that of the transistor 302. Alternatively, the channel width of the transistor 304 can be smaller than that of the transistor 305.

Note that a signal whose potential in an L level is lower than V1 can be input to the terminals 105*a* and 105*c*. In this manner, since backward bias can be applied to the transistors 302 to 305, deterioration of characteristics of the transistors 302 to 305 can be eased. Alternatively, a signal whose potential in an H level is lower than V2 can be input to the terminals 105*a* and 105*c*. In this manner, since Vgs can be decreased when the transistors 302 to 305 are on, the deterioration of the characteristics of the transistors 302 to 305 can be suppressed. In such a case, a signal whose potential in an L level is lower than V1, a signal whose potential in an H level is lower than V2, or a signal whose potential in an L level is lower than V1 and whose potential in an H level is lower than V2 can be input to the wirings 113 and 115. However, this embodiment is not limited to this example. The signal whose potential in the L level is lower than V1, the signal whose potential in the H level is lower than V2, or the signal whose potential in the L level is lower than V1 and whose potential in the H level is lower than V2 can be input to one of the terminals 105*a* and 105*c*. In that case, the signal whose potential in the L level is lower than V1, the signal whose potential in the H level is lower than V2, or the signal whose potential in the L level is lower than V1 and whose potential in the H level is lower than V2 can be input to one of the wirings 113 and 115. Alternatively, the terminal 105*a* can be connected to a different wiring from the wiring 113 and the signal whose potential in the L level is lower than V1, the signal whose potential in the H level is lower than V2, or the signal whose potential in the L level is lower than V1 and whose potential in the H level is lower than V2 can be input to the wiring. Alternatively, the terminal 105*c* can be connected to a different wiring from the wiring 115 and the signal whose potential in the L level is lower than V1, the signal whose potential in the H level is lower than V2, or the signal whose potential in the L level is lower than V1 and whose potential in the H level is lower than V2 can be input to the wiring.

Note that a signal which goes into an L level in the period T1, the period T3, and the period T4 can be input to the terminal 105*d*. For example, the signal IN2 can be input to the terminal 105*d*. In that case, the terminal 105*d* can be connected to the wiring 113. Accordingly, since backward bias can be applied to the transistor 303, the transistor 304, or the transistor 305, deterioration of characteristics of the transistor 303, the transistor 304, or the transistor 305 can be eased.

Figure 14A:
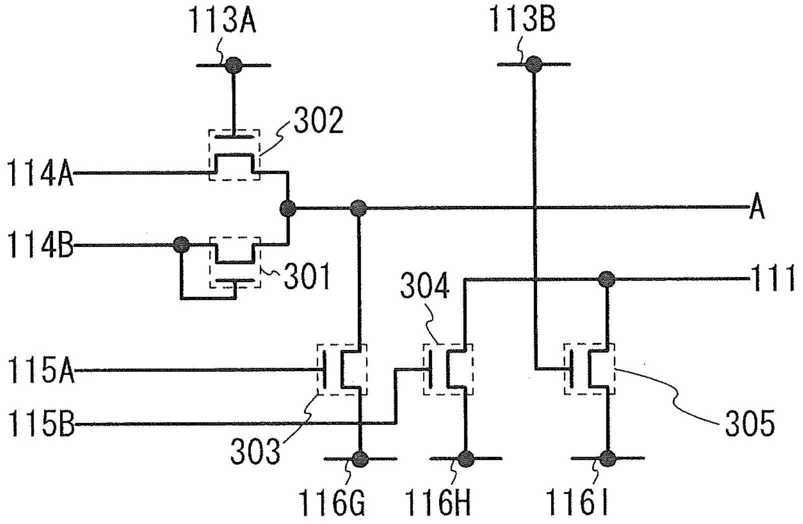
FIGS. 14A to 14C are circuit diagrams of a semiconductor device.

Note that like in Embodiment 1 or 2, the wiring can be divided into a plurality of wirings. In addition, the same signal or voltage or different signals or voltages can be input to the plurality of wirings. Alternatively, the plurality of wirings can be connected to the same wiring or element or different wirings or elements. One example in FIG. 14A illustrates a structure in the case where the wiring 113 is divided into a plurality of wirings of wirings 113A and 113B, the wiring 114 is divided into a plurality of wirings of wirings 114A and 114B, the wiring 115 is divided into a plurality of wirings of wirings 115A and 115B, and the wiring 116 is divided into a plurality of wirings of wirings 116G to 116I. In addition, the gate of the transistor 302 is connected to the wiring 113A and the gate of the transistor 305 is connected to the wiring 113B. The first terminal of the transistor 302 is connected to the wiring 114A. The first terminal and the gate of the transistor 301 are connected to the wiring 114B. The gate of the transistor 303 is connected to the wiring 115A. The gate of the transistor 304 is connected to the wiring 115B. The first terminal of the transistor 303 is connected to the wiring 116G The first terminal of the transistor 304 is connected to the wiring 116H. The first terminal of the transistor 305 is connected to the wiring 116I. However, this embodiment is not limited to this example. Any one, two, or three of the wiring 113, the wiring 114, the wiring 115, and the wiring 116 can be divided into a plurality of wirings.

Note that in FIG. 14A, the wirings 113A and 113B correspond to the wiring 113 in FIG. 12A. Therefore, like in the case of the wiring 113, the signal IN2 can be input to the wirings 113A and 113B and the wirings 113A and 113B can function as signal lines. However, this embodiment is not limited to this example. Voltage such as the voltage V1 or the voltage V2 can be supplied to the wirings 113A and 113B so that the wirings 113A and 113B can function as power supply lines. Alternatively, different signals or voltages can be input to the wirings 113A and 113B. Alternatively, a variety of signals, voltages, or currents other than above can be input to the wirings 113A and 113B.

Note that in FIG. 14A, the wirings 114A and 114B correspond to the wiring 114 in FIG. 12A. Therefore, like in the case of the wiring 114, the signal IN3 can be input to the wirings 114A and 114B and the wirings 114A and 114B can function as signal lines. However, this embodiment is not limited to this example. Voltage such as the voltage V1 or the voltage V2 can be supplied to the wirings 114A and 114B so that the wirings 114A and 114B can function as power supply lines. Alternatively, different signals or voltages can be input to the wirings 114A and 114B. Alternatively, a variety of signals, voltages, or currents other than above can be input to the wirings 114A and 114B.

Note that in FIG. 14A, the wirings 115A and 115B correspond to the wiring 115 in FIG. 12A. Therefore, like in the case of the wiring 115, the signal IN4 can be input to the wirings 115A and 115B and the wirings 115A and 115B can function as signal lines. However, this embodiment is not limited to this example. Voltage such as the voltage V1 or the voltage V2 can be supplied to the wirings 115A and 115B so that the wirings 115A and 115B can function as power supply lines. Alternatively, different signals or voltages can be supplied to the wirings 115A and 115B. Alternatively, a variety of signals, voltages, or currents can be input to the wirings 115A and 115B.

Note that in FIG. 14A, the wirings 116G to 116I correspond to the wiring 116 in FIG. 12A. Therefore, like in the case of the wiring 116, the voltage V1 can be supplied to the wirings 116G to 116I and the wirings 116G to 116I can function as power supply lines. However, this embodiment is not limited to this example. A signal such as the signal OUT, the signal IN1, the signal IN2, the signal IN3, or the signal IN4 can be input to the wirings 116G to 116I so that the wirings 116G to 116I can function as signal lines. Alternatively, different signals or voltages can be supplied to the wirings 116G to 116I. Alternatively, a variety of signals, voltages, or currents can be input to the wirings 116G to 116I.

Note that in FIG. 14A, a signal in an L level in the period T3 can be input to the wirings 116G and 116H. For example, the signal IN2 can be input to the wirings 116G and 116H. In that case, the wirings 116G and 116H can be connected to the wiring 112 described in Embodiments 1 and 2. In this manner, since backward bias can be applied to the transistor 303 and the transistor 304, deterioration of characteristics of the transistor 303 and the transistor 304 can be suppressed. However, this embodiment is not limited to this example. The signal IN2 can be input to only one of the wirings 116G and 116H. Alternatively, the signal OUT or the signal IN3 can be input to the wiring 116G and/or the wiring 116H. In that case, the wiring 116G and/or the wiring 116H can be connected to the wiring 111 or the wiring 114 described in Embodiments 1 and 2.

Note that in FIG. 14A, a signal in an L level in the period T1, the period T3, and the period T5 can be input to the wiring 116I. For example, the signal IN2 can be input to the wiring 116I. In that case, the wiring 116I can be connected to the wiring 112 described in Embodiments 1 and 2. In this manner, since backward bias can be applied to the transistor 305, deterioration of characteristics of the transistor 305 can be suppressed. However, this embodiment is not limited to this example.

Figure 14B:
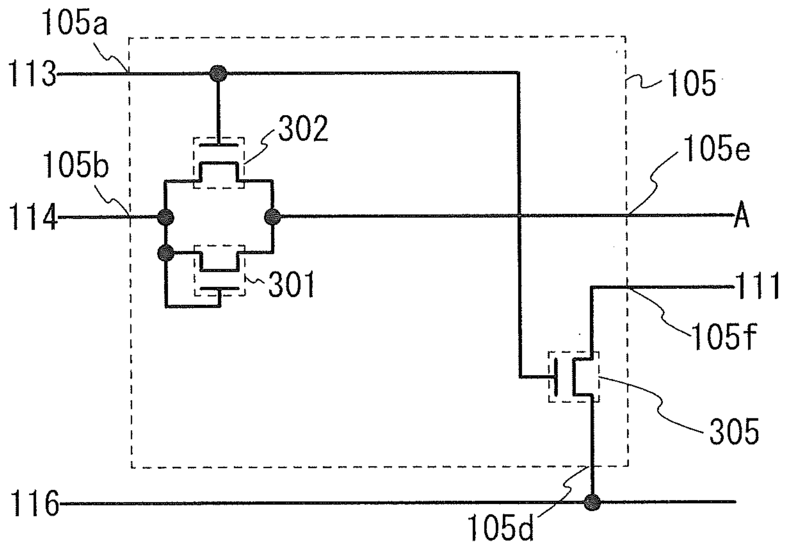

Note that as shown in FIG. 14B, the transistor 303 and the transistor 304 can be eliminated. In this manner, the number of transistors can be reduced. Therefore, reduction in a layout area, improvement in yield, or the like can be achieved. However, this embodiment is not limited to this example. Only one of the transistor 303 and the transistor 304 can be eliminated.

Note that like in FIG. 14B, the transistor 303 and/or the transistor 304 can be eliminated in FIG. 14A.

Figure 14C:
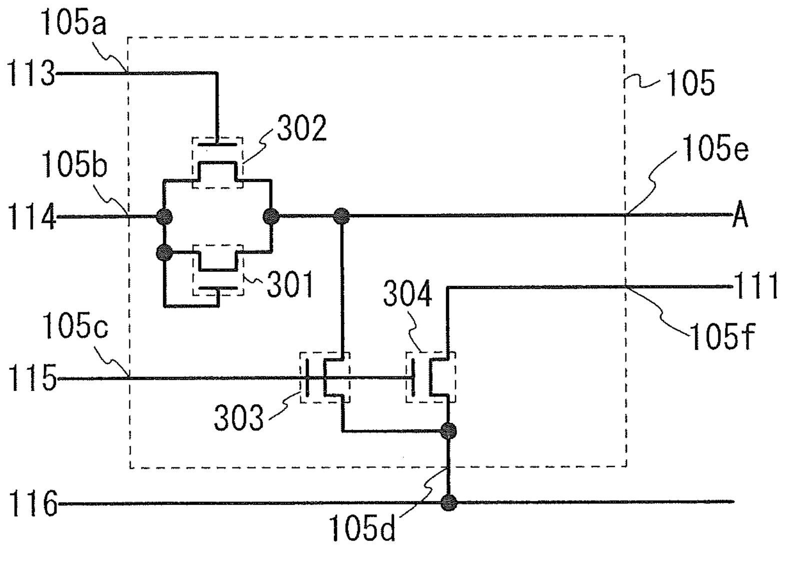

Note that as shown in FIG. 14C, the transistor 305 can be eliminated. In this manner, the number of transistors can be reduced. Therefore, reduction in a layout area, improvement in yield, or the like can be achieved. However, this embodiment is not limited to this example.

Note that like in FIG. 14C, the transistor 305 can be eliminated in FIGS. 14A and 14B.

Figure 15A:
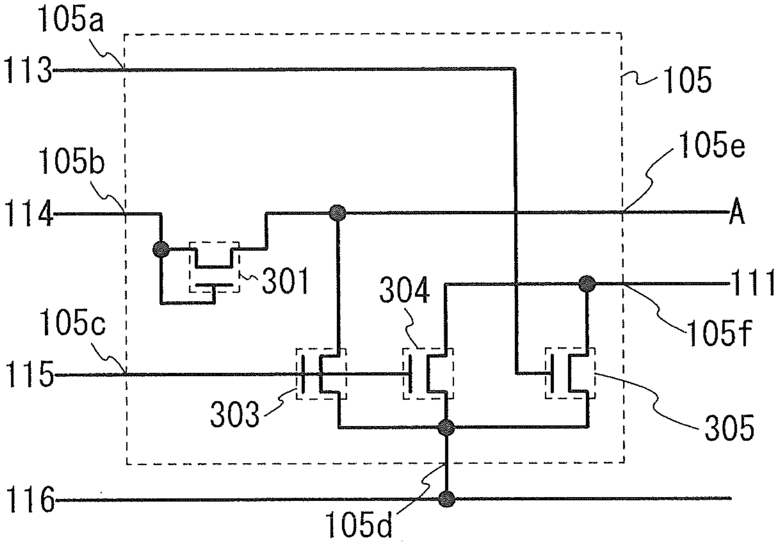
FIGS. 15A and 15B are circuit diagrams of a semiconductor device.

Note that as shown in FIG. 15A, the transistor 302 can be eliminated. In this manner, the number of transistors can be reduced. Therefore, reduction in a layout area, improvement in yield, or the like can be achieved. However, this embodiment is not limited to this example.

Note that like in FIG. 15A, the transistor 302 can be eliminated in FIGS. 14A to 14C.

Figure 15B:
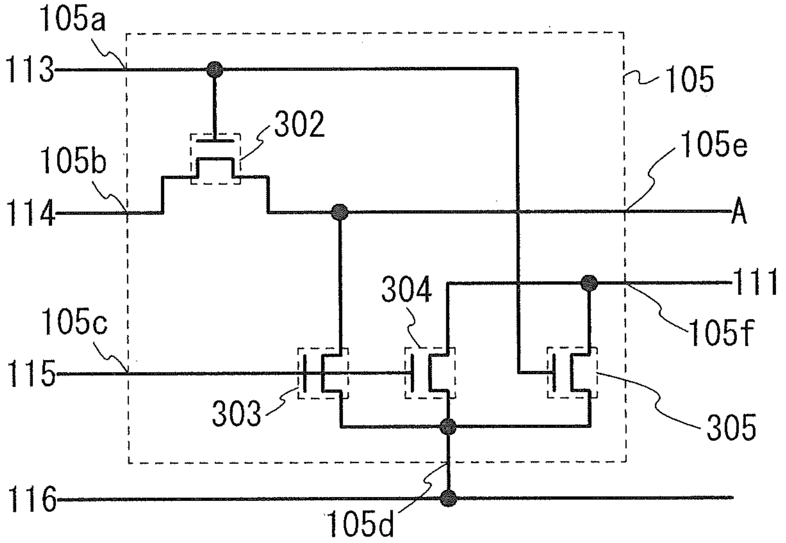

Note that as shown in FIG. 15B, the transistor 301 can be eliminated. In this manner, the number of transistors can be reduced. Therefore, reduction in a layout area, improvement in yield, or the like can be achieved. However, this embodiment is not limited to this example.

Note that like in FIG. 15B, the transistor 301 can be eliminated in FIGS. 14A to 14C and FIG. 15A.

Figure 16A:
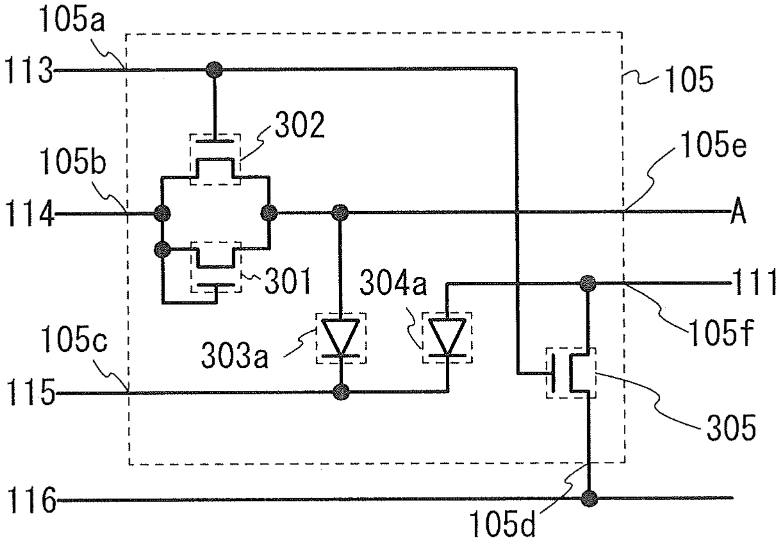
FIGS. 16A and 16B are circuit diagrams of a semiconductor device.

Note that as shown in FIG. 16A, the transistor 303 can be replaced with a diode 303*a* one terminal (also referred to as a positive electrode) of which is connected to the node A and the other terminal (also referred to as a negative electrode) of which is connected to the wiring 115. Alternatively, the transistor 304 can be replaced with a diode 304*a* one terminal (also referred to as a positive electrode) of which is connected to the wiring 111 and the other terminal (also referred to as a negative electrode) of which is connected to the wiring 115. However, this embodiment is not limited to this example. One of the transistor 303 and the transistor 304 can be replaced with a diode. Alternatively, the diode 303*a* and/or the diode 304*a* can be additionally provided.

Note that like in FIG. 16A, the transistor 303 can be replaced with the diode 303*a* one terminal of which is connected to the node A and the other terminal of which is connected to the wiring 115 in FIGS. 14A to 14C and FIGS. 15A and 15B. Alternatively, the transistor 304 can be replaced with the diode 304*a* one terminal of which is connected to the wiring 111 and the other terminal of which is connected to the wiring 115. Alternatively, the diode 303*a* and/or the diode 304*a* can be additionally provided.

Note that although not shown, in FIGS. 14A to 14C, FIGS. 15A and 15B, and FIG. 16A, the first terminal of the transistor 303 is connected to the wiring 115, the second terminal of the transistor 303 is connected to the node A, and the gate of the transistor 303 is connected to the node A, whereby the transistor 303 can be diode-connected. Alternatively, the first terminal of the transistor 304 is connected to the wiring 115, the second terminal of the transistor 304 is connected to the wiring 111, and the gate of the transistor 304 is connected to the wiring 111, whereby the transistor 304 can be diode-connected. However, this embodiment is not limited to this example. One of the transistor 303 and the transistor 304 can be diode-connected.

Figure 16B:
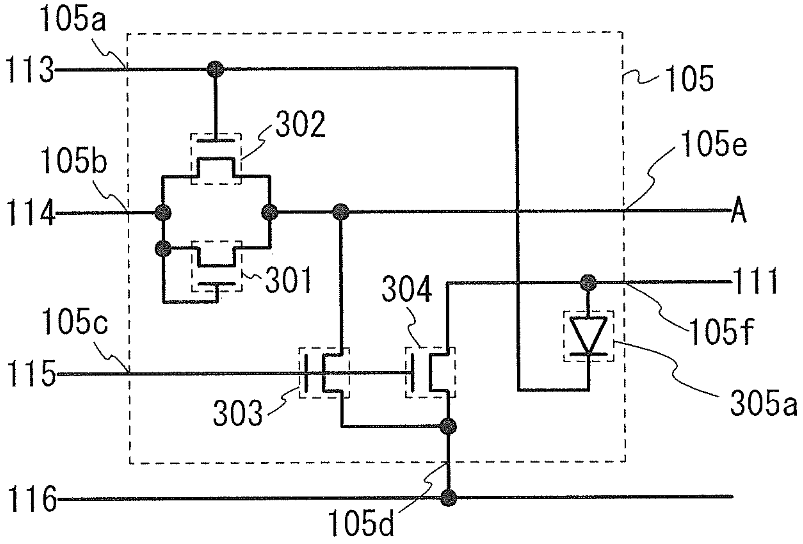

Note that as shown in FIG. 16B, the transistor 305 can be replaced with a diode 305*a* one terminal (also referred to as a positive electrode) of which is connected to the wiring 111 and the other terminal (also referred to as a negative electrode) of which is connected to the wiring 113. However, this embodiment is not limited to this example. The diode 305*a* can be additionally provided.

Note that like in FIG. 16B, the transistor 305 can be replaced with the diode 305*a* one terminal (also referred to as a positive electrode) of which is connected to the wiring 111 and the other terminal (also referred to as a negative electrode) of which is connected to the wiring 113 in FIGS. 14A to 14C, FIGS. 15A and 15B, and FIG. 16A. Alternatively, the diode 305*a* can be additionally provided.

Note that although not shown, in FIGS. 14A to 14C, FIGS. 15A and 15B, and FIGS. 16A and 16B, the first terminal of the transistor 305 is connected to the wiring 113, the second terminal of the transistor 305 is connected to the wiring 111, and the gate of the transistor 305 is connected to the wiring 111, whereby the transistor 305 can be diode-connected. However, this embodiment is not limited to this example.

Figure 17A:
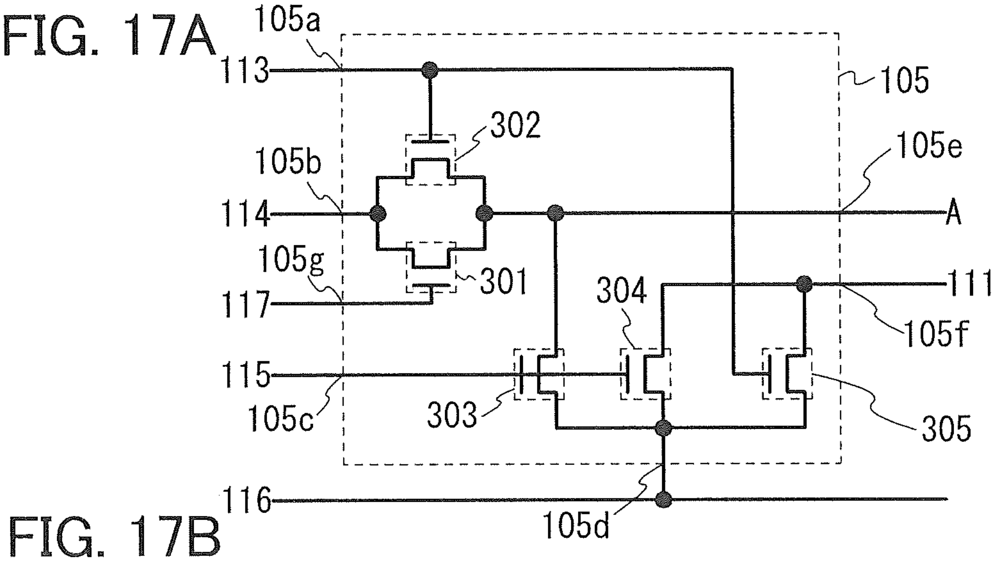
FIGS. 17A to 17C are circuit diagrams of a semiconductor device.

Note that as shown in FIG. 17A, the gate of the transistor 301 can be connected to a wiring 117. Therefore, the circuit 105 can additionally include a terminal 105*g*. In addition, the wiring 117 is connected to the gate of the transistor 301 through the terminal 105*g*. The voltage V2 is supplied to the wiring 117 and the wiring 117 can function as a power supply line. However, this embodiment is not limited to this example. The first terminal of the transistor 301 can be connected to the wiring 117 and the gate of the transistor 301 can be connected to the wiring 114. Alternatively, a signal which goes into an H level in the period T2 can be input to the wiring 117 and the wiring 117 can function as a signal line. For example, the signal IN2 can be input to the wiring 117 and the wiring 117 can be connected to the wiring 113. Alternatively, a variety of signals, voltages, or currents other than above can be input to the wiring 117.

Note that like in FIG. 17A, the gate of the transistor 301 or the first terminal of the transistor 301 can be connected to the wiring 117 in FIGS. 14A to 14C, FIGS. 15A and 15B, and FIGS. 16A and 16B.

Figure 17B:
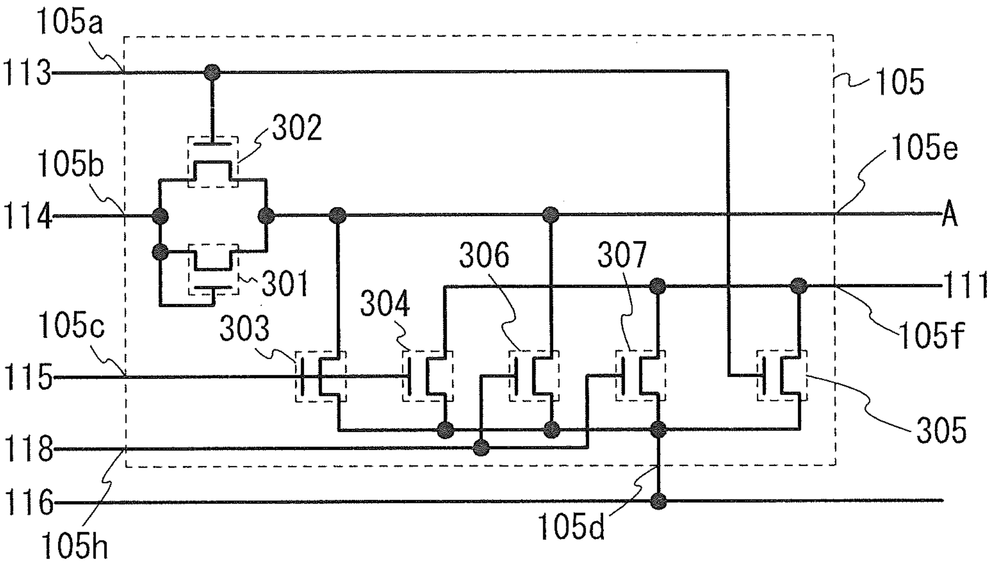

Note that as shown in FIG. 17B, a transistor 306 and a transistor 307 can be additionally provided. For example, the transistor 306 and the transistor 307 have the same polarity as the transistors 301 to 305 in many cases and are n-channel transistors. A first terminal of the transistor 306 is connected to the wiring 116, a second terminal of the transistor 306 is connected to the node A, and a gate of the transistor 306 is connected to a wiring 118. A first terminal of the transistor 307 is connected to the wiring 116, a second terminal of the transistor 307 is connected to the wiring 111, and a gate of the transistor 307 is connected to the wiring 118. For example, the signal IN5 is input to the wiring 118 and the wiring 118 can function as a signal line. The transistor 306 has a function of controlling timing when the voltage V1 is supplied to the node A by controlling the electrical conduction state of the wiring 116 and the node A in accordance with the signal IN5 or the potential of the wiring 115 and can function as a switch. The transistor 307 has a function of controlling timing when the voltage V1 is supplied to the wiring 111 by controlling the electrical conduction state of the wiring 116 and the wiring 111 in accordance with the signal IN5 or the potential of the wiring 115 and can function as a switch. For example, the signal IN5 functions as an all-stages-reset signal in many cases. However, this embodiment is not limited to this example. Only one of the transistor 306 and the transistor 307 can be additionally provided.

Note that as shown in FIG. 17B, the transistor 306 and/or the transistor 307 can be additionally provided in FIGS. 14A to 14C, FIGS. 15A and 15B, FIGS. 16A and 16B, and FIG. 17A. The first terminal of the transistor 306 is connected to the wiring 116, the second terminal of the transistor 306 is connected to the node A, and the gate of the transistor 306 is connected to a wiring 118. The first terminal of the transistor 307 is connected to the wiring 116, the second terminal of the transistor 307 is connected to the wiring 111, and the gate of the transistor 307 is connected to the wiring 118.

Figure 17C:
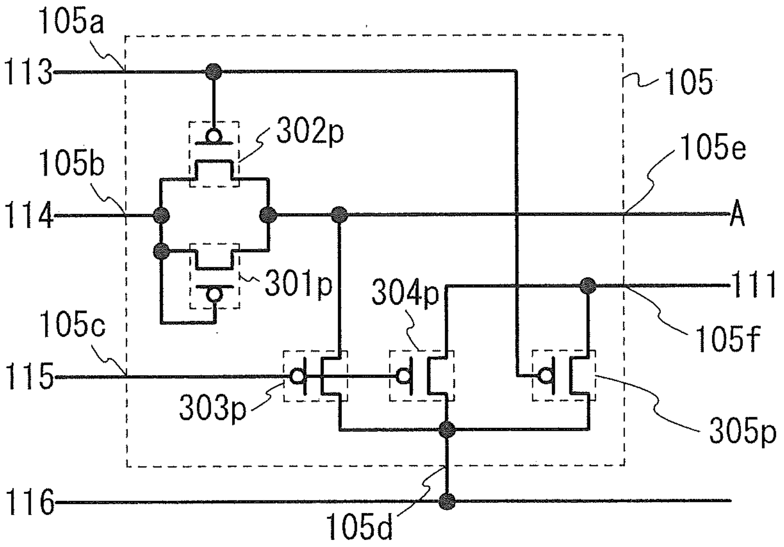

Note that as shown in FIG. 17C, p-channel transistors can be used as the transistors 301 to 305. Specifically in the case where p-channel transistors are used as the transistors 101 to 103 in Embodiment 1 and the transistors 201 to 204 in Embodiment 2, p-channel transistors are preferably used as the transistors 301 to 305. A transistor 301*p*, a transistor 302*p*, a transistor 303*p*, a transistor 304*p*, and a transistor 305*p* correspond to the transistor 301, the transistor 302, the transistor 303, the transistor 304, and the transistor 305, respectively.

Note that like in FIG. 17C, p-channel transistors can be used as the transistors 301 to 305 in FIGS. 14A to 14C, FIGS. 15A and 15B, FIGS. 16A and 16B, and FIGS. 17A and 17B.

Figure 18A:
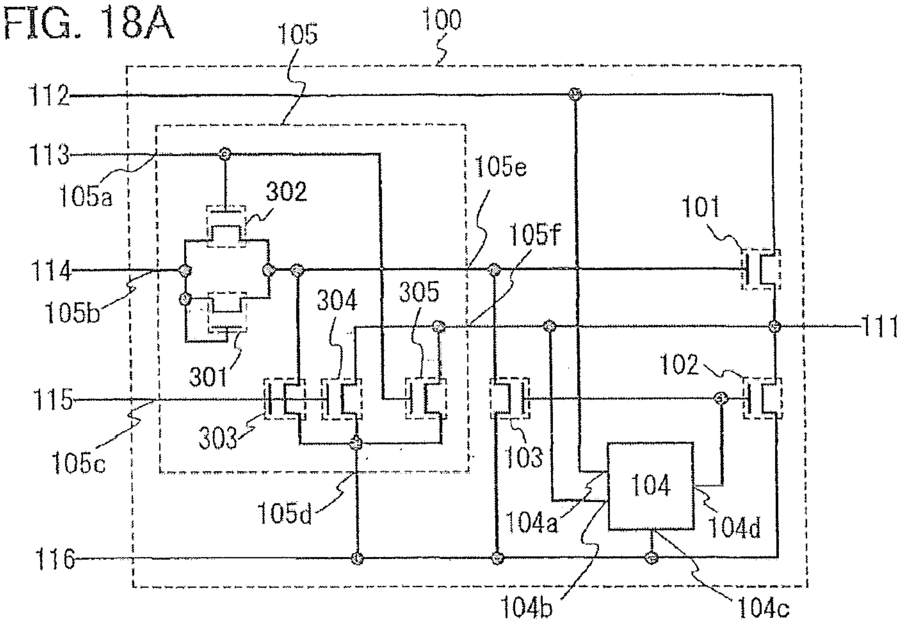
FIGS. 18A and 18B are circuit diagrams of a semiconductor device.
Figure 18B:
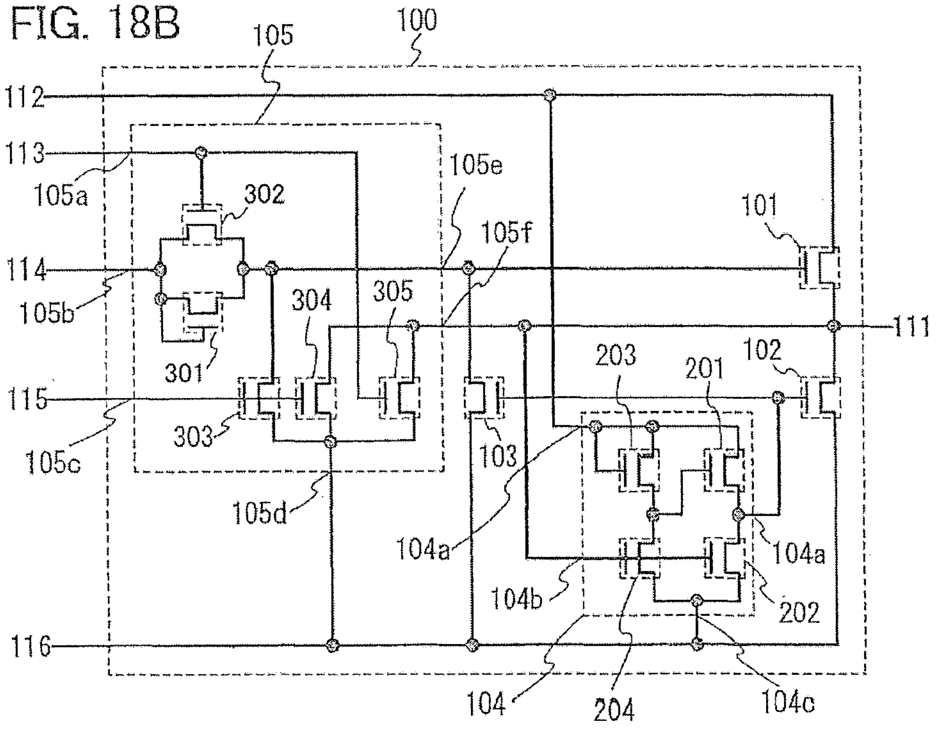

Note that as described above, the structure of the circuit 105 in this embodiment can be applied to the circuit 105 included in the circuit 100 described in Embodiment 1. FIG. 18A illustrates a structure in the case where one example of the circuit 105 in FIG. 12A is applied to the circuit 105 included in the circuit 100 in FIG. 1A, for example. In addition, FIG. 18B illustrates a structure in the case where one example of the circuit 105 in FIG. 12A is applied to the circuit 105 included in the circuit 100 in FIG. 1A and one example of the circuit 104 in FIG. 9A is applied to the circuit 104 included in the circuit 100 in FIG. 1A, for example. However, this embodiment is not limited to this example. The circuit 105 in the case of FIG. 12A, FIG. 14A, FIG. 14B, FIG. 14C, FIG. 15A, FIG. 15B, FIG. 16A, FIG. 16B, FIG. 17A, FIG. 17B, or FIG. 17C, or a combination thereof can be used as the circuit 105 included in the circuit 100 in the case of FIG. 1A, FIG. 5A, FIG. 5B, FIG. 6A, FIG. 6B, FIG. 6C, FIG. 7A, FIG. 7B, or FIG. 8A, or a combination thereof.

Embodiment 4

In this embodiment, one example of a shift register is described. The shift register in this embodiment can include the semiconductor device in Embodiments 1 to 3. Note that the shift register can be referred to as a semiconductor device or a gate driver. Note that description of the content described in Embodiments 1 to 3 is omitted. Note that the content described in Embodiments 1 to 3 can be freely combined with a content described in this embodiment.

First, one example of the shift register is described with reference to FIG. 19. A shift register 400 includes a plurality of flip-flops of flip-flops 401_1 to 401_N (N is a natural number).

Note that the flip-flops 401_1 to 401_N each correspond to the semiconductor device described in Embodiments 1 to 3. One example in FIG. 19 shows the case where the semiconductor device in FIG. 1A is used as each of the flip-flops 401_1 to 401_N. However, this embodiment is not limited to this example. As the flip-flops 401_1 to 401_N, the semiconductor device described in Embodiments 1 to 3 or a variety of semiconductor devices or circuits can be used other than the semiconductor device in FIG. 1A.

Next, connection relations of the shift register are described. The shift register 400 is connected to wirings 411_1 to 411_N, a wiring 412, a wiring 413, a wiring 414, and a wiring 415. In addition, in the flip-flop 401_*i* (i is any one of 1 to N), the wiring 111 is connected to the wiring 411_*i*, the wiring 112 is connected to one of the wirings 412 and 413, the wiring 113 is connected to the other of the wirings 412 and 413, the wiring 114 is connected to the wiring 411_*i*−1, the wiring 115 is connected to the wiring 411_*i*+1, and the wiring 116 is connected to the wiring 416. Here, the wirings to which the wiring 112 and the wiring 113 are connected in flip-flops of the odd-numbered stages are reversed in flip-flops of the even-numbered stages in many cases. For example, in the case where the wirings 112 are connected to the wiring 412 and the wirings 113 are connected to the wiring 413 in the flip-flops of the odd-numbered stages, the wirings 112 are connected to the wiring 413 and the wirings 113 are connected to the wiring 412 in the flip-flops of the even-numbered stages in many cases. On the other hand, in the case where the wirings 112 in the flip-flops of the odd-numbered stages are connected to the wiring 413 and the wirings 113 in the flip-flops of the odd-numbered stages are connected to the wiring 412, the wirings 112 in the flip-flops of the even-numbered stages are connected to the wiring 412 and the wirings 113 in the flip-flops of the even-numbered stages are connected to the wiring 413 in many cases. However, this embodiment is not limited to this example. A variety of connection relations other than above can be employed.

Note that the wiring 114 in the flip-flop 401_1 is connected to the wiring 414 in many cases. In addition, the wiring 115 in the flip-flop 401_N is connected to the wiring 415 in many cases.

Note that the wirings 411_1 to 411_N each correspond to the wiring 111 described in Embodiments 1 to 3. The wiring 412 corresponds to the wiring 112 or the wiring 113 described in Embodiments 1 to 3. The wiring 413 corresponds to the wiring 112 or the wiring 113 described in Embodiments 1 to 3. The wiring 414 corresponds to the wiring 114 described in Embodiments 1 to 3. The wiring 415 corresponds to the wiring 115 described in Embodiments 1 to 3. The wiring 416 corresponds to the wiring 116 described in Embodiments 1 to 3.

Next, one example of a signal or voltage input or output to/from each of the wirings 411_1 to 411_N, the wiring 412, the wiring 413, the wiring 414, the wiring 415, and the wiring 416 is described. For example, signals GOUT_1 to GOUT_N are output from the wirings 411_1 to 411_N, respectively. The signals GOUT_1 to GOUT_N are output signals from the flip-flops 401_1 to 401_N, respectively. In addition, the signals GOUT_1 to GOUT_N each correspond to the signal OUT described in Embodiments 1 to 3 and each can function as an output signal, a selection signal, a transfer signal, a start signal, a reset signal, a gate signal, or a scan signal. For example, a signal GCK is input to the wiring 412. The signal GCK corresponds to the signal IN1 or the signal IN2 described in Embodiments 1 to 3 and can function as a clock signal. For example, a signal GCKB is input to the wiring 413. The signal GCKB corresponds to the signal IN1 or the signal IN2 described in Embodiments 1 to 3 and can function as an inverted clock signal. For example, a signal GSP is input to the wiring 414. The signal GSP corresponds to the signal IN3 described in Embodiments 1 to 3 and can function as a start signal or a vertical synchronization signal. For example, a signal GRE is input to the wiring 415. The signal GRE corresponds to the signal IN4 described in Embodiments 1 to 3 and can function as a reset signal. For example, the voltage V1 is input to the wiring 416. However, this embodiment is not limited to this example. A variety of signals, currents, or voltages other than above can be input to each of the wirings 411_1 to 411_N, the wiring 412, the wiring 413, the wiring 414, the wiring 415, and/or the wiring 416. For example, voltage such as the voltage V1 or the voltage V2 can be supplied to the wiring 412, the wiring 413, the wiring 414, and/or the wiring 415. Alternatively, a signal such as the signals GOUT_1 to GOUT_N, the signal GCK, the signal GCKB, the signal GSP, or the signal GRE can be input to the wiring 416. Alternatively, the wirings 411_1 to 411_N, the wiring 412, the wiring 413, the wiring 414, the wiring 415, and/or the wiring 416 can be made to go into a floating state without input of a signal, voltage, or the like.

Note that the wirings 411_1 to 411_N can each function as a signal line, a gate line, a scan line, or an output signal line. The wiring 412 can function as a signal line or a clock signal line. The wiring 413 can function as a signal line or a clock signal line. The wiring 414 can function as a signal line. The wiring 415 can function as a signal line. The wiring 416 can function as a power supply line or a ground line. However, this embodiment is not limited to this example. The wirings 411_1 to 411_N, the wiring 412, the wiring 413, the wiring 414, the wiring 415, and/or the wiring 416 can function as a variety of wirings other than above. For example, in the case where voltage is supplied to the wiring 412, the wiring 413, the wiring 414, and/or the wiring 415, these wirings can function as power supply lines. Alternatively, in the case where a signal is input to the wiring 416, the wiring 416 can function as a signal line.

Note that as described above, polyphase clock signals or unbalanced clock signals can be input to the shift register.

Note that a signal, voltage, or the like is input to the wiring 412, the wiring 413, the wiring 414, the wiring 415, and the wiring 416 from a circuit 420. The circuit 420 has a function of controlling the shift register 400 by supplying a signal, voltage, or the like to the shift register 400 and can function as a control circuit, a controller, or the like. In this embodiment, for example, the circuit 420 supplies the signal GCK, the signal GCKB, the signal GSP, the signal GRE, and the voltage V1 to the wiring 412, the wiring 413, the wiring 414, the wiring 415, and the wiring 416, respectively. However, this embodiment is not limited to this example. The circuit 420 can control not only the shift register 400 but also a variety of circuits (e.g., a signal line driver circuit, a scan line driver circuit, and/or a pixel) other than above by supplying a signal or voltage to the circuit.

Note that the circuit 420 includes a circuit 421 and a circuit 422, for example. The circuit 421 has a function of generating power supply voltage such as positive power supply voltage, negative power supply voltage, ground voltage, or reference voltage and can function as a power supply circuit or a regulator. The circuit 422 has a function of generating a variety of signals such as a clock signal, an inverted clock signal, a start signal, a reset signal, and/or a video signal and can function as a timing generator. However, this embodiment is not limited to this example. The circuit 420 can include a variety of circuits or elements other than the circuit 421 and the circuit 422. For example, the circuit 420 can include an oscillator, a level shift circuit, an inverter circuit, a buffer circuit, a DA converter circuit, an AD converter circuit, an operational amplifier, a shift register, a look-up table, a coil, a transistor, a capacitor, a resistor, a frequency divider, and/or the like.

Figure 19:
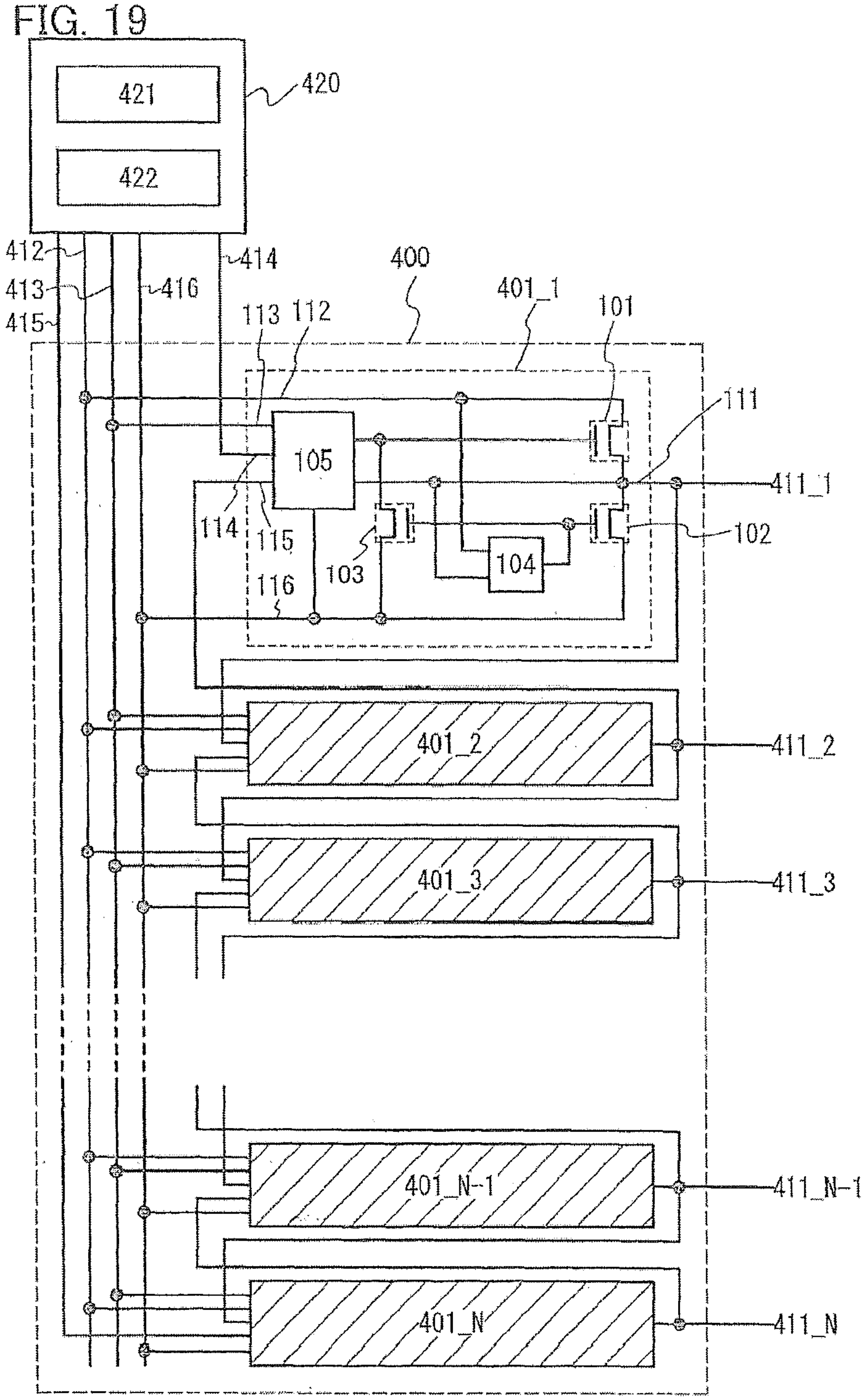
FIG. 19 is a circuit diagram of a shift register.
Figure 20:
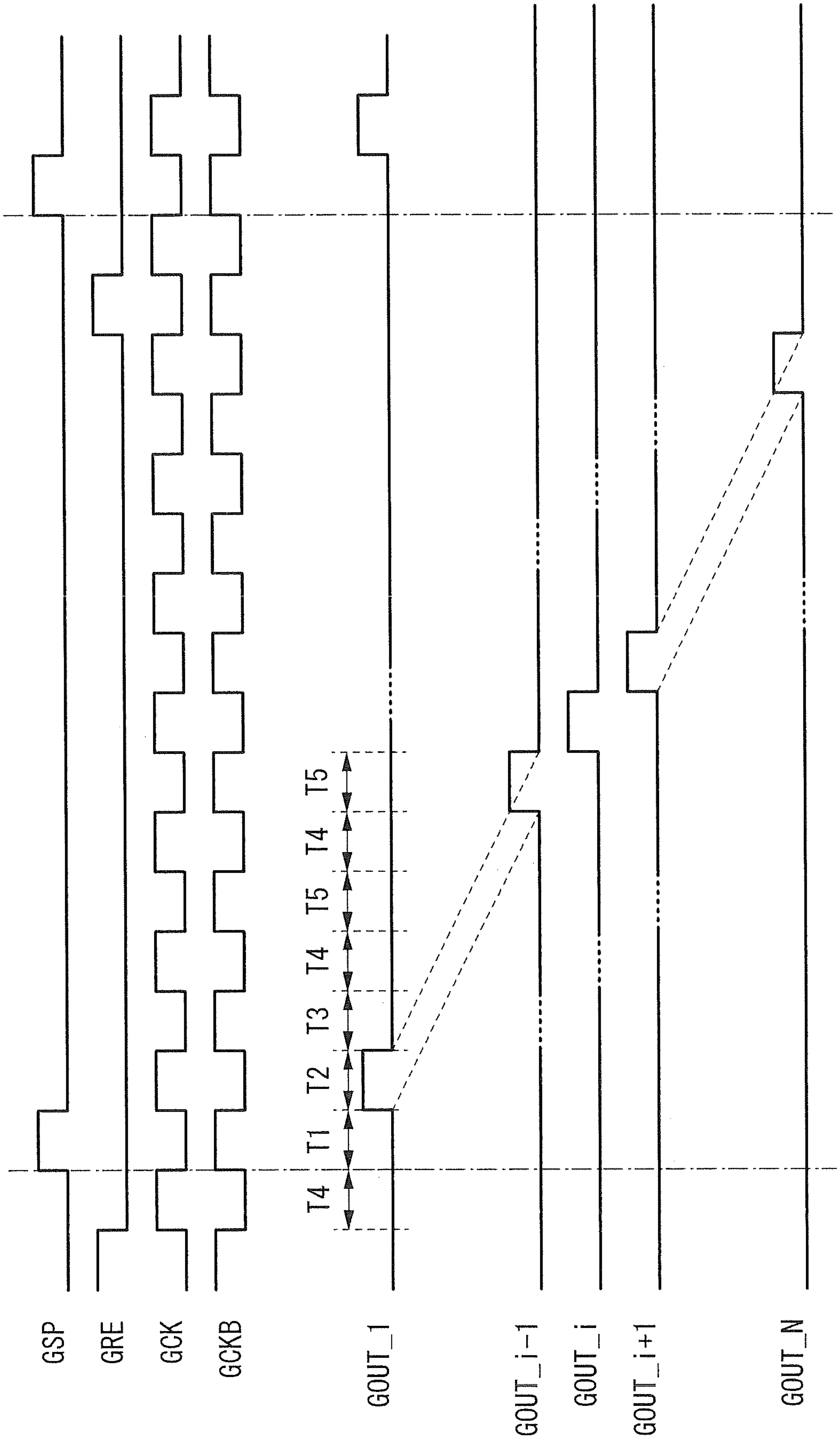
FIG. 20 is a timing chart illustrating a driving method of a shift register.

Next, operation of the shift register in FIG. 19 is described with reference to a timing chart in FIG. 20. FIG. 20 is one example of a timing chart for description of the operation of the shift register. FIG. 20 shows one example of each of the signal GSP, the signal GRE, the signal GCK, the signal GCKB, the signal GOUT_1, the signal GOUT_i−1, the signal GOUT_i, the signal GOUT_i+1, and the signal GOUT_N. Note that description of operation which is the same as that of the semiconductor device in Embodiments 1 to 3 is omitted.

Operation of the flip-flop 401_*i* is described. First, the signal GOUT_i−1 goes into an H level. Then, the flip-flop 401_*i* starts operation of a period T1 and the signal GOUT_i goes into an L level. After that, the signal GCK and the signal GCKB are inverted. Then, the flip-flop 401_*i* starts operation of a period T2 and the signal GOUT_i goes into an H level. The signal GOUT_i is input to the flip-flop 401_*i*−1 as a reset signal and input to the flip-flop 401_*i*+1 as a start signal. Therefore, the flip-flop 401_*i*−1 starts operation of a period T3 and the flip-flop 401_*i*+1 starts operation of the period T1. After that, the signal GCK and the signal GCKB are inverted again. Then, the flip-flop 401_*i*+1 starts operation of the period T2 and the signal GOUT_i+1 goes into an H level. The signal GOUT_i+1 is input to the flip-flop 401_*i* as a reset signal. Accordingly, since the flip-flop 401_*i* starts operation of the period T3, the signal GOUT_i goes into an L level. After that, until the signal GOUT_i−1 goes into the H level again, the flip-flop 401_*i* alternately perform operations of a period T4 and a period T5 every time the signal GCK and the signal GCKB are inverted.

Note that the signal GSP is input to the flip-flop 401_1 from the circuit 420 through the wiring 414 instead of an output signal from a flip-flop of the previous stage. Therefore, when the signal GSP goes into an H level, the flip-flop 401_1 starts operation of the period T1.

Note that the signal GRE is input to the flip-flop 401_N from the circuit 420 through the wiring 415 instead of an output signal from a flip-flop of the next stage. Therefore, when the signal GRE goes into an H level, the flip-flop 401_N starts operation of the period T3.

The above is the description of the operation of the shift register in this embodiment. By using the semiconductor device in Embodiments 1 to 3, the shift register in this embodiment can obtain a similar advantage to the semiconductor device.

Note that as described in Embodiments 1 to 3, the relation between the signal GCK and the signal GCKB can be unbalanced. For example, as shown in a timing chart in FIG. 21A, a period in which the signal GCK and the signal GCKB are in an H level can be shorter than a period in which the signal GCK and the signal GCKB are in in an L level. In this manner, even if delay or distortion occurs in the signals GOUT_1 to GOUT_N, these signals can be prevented from going into a period of an H level. Therefore, in the case where the shift register in this embodiment is used for a display device, selection of a plurality of rows at one time can be prevented. However, this embodiment is not limited to this example. The period in which the signal GCK and/or the signal GCKB are in the H level can be longer than the period in which the signal GCK and/or the signal GCKB are in the L level.

Note that as described in Embodiments 1 to 3, polyphase clock signals can be used. For example, as shown in a timing chart in FIG. 21B, M-phase (M is a natural number) clock signals can be used. In that case, periods in which the signals GOUT_1 to GOUT_N are in an H level in one stage can overlap with periods in which the signals GOUT_1 to GOUT_N are in an H level in the previous stage and the next stage. Accordingly, in the case where this embodiment is applied to a display device, a plurality of rows is selected at one time. Therefore, a video signal for pixels in a different row can be used as precharge voltage.

Figure 21A:
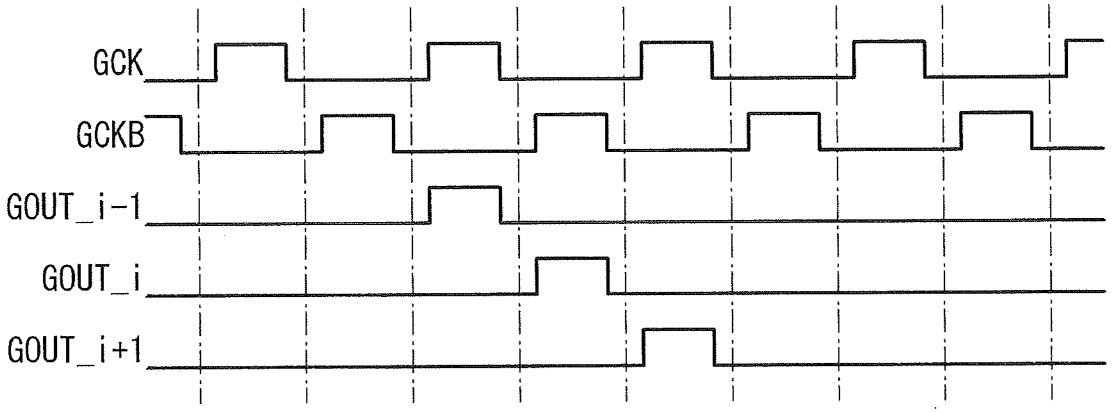
FIGS. 21A and 21B are timing charts each illustrating a driving method of a shift register.
Figure 21B:
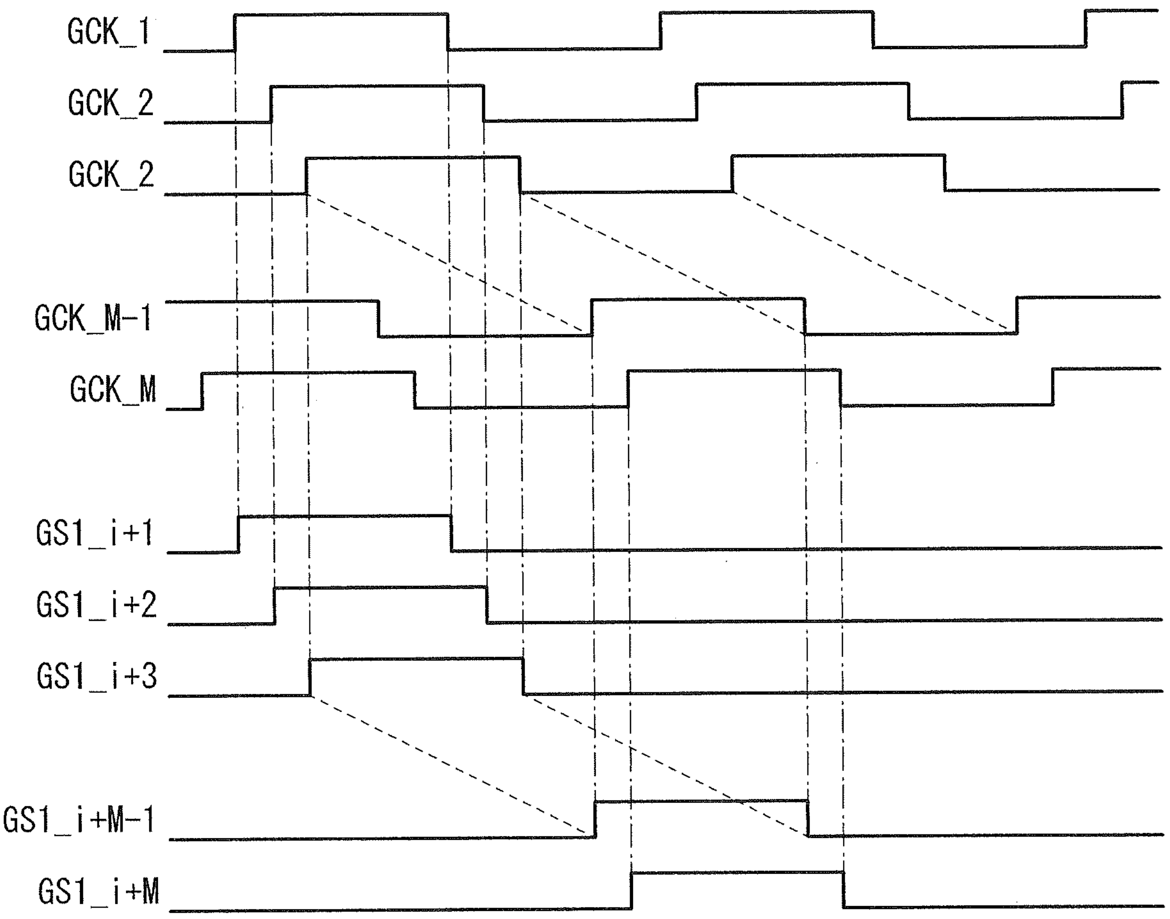

Note that in FIG. 21B, it is preferable that M is less than or equal to 8. More preferably, M is less than or equal to 6. Further preferably, M is less than or equal to 4. This is because, in the case where the shift register is used for a scan line driver circuit of a display device, if M is too large a number, a plural kinds of video signals are written to a pixel; then, since a period in which a wrong video signal is written to the pixel becomes long, display quality deteriorates in some cases.

Note that like in FIG. 21B, polyphase clock signals can be used in the timing chart in FIG. 21A.

Note that the wiring 415 and another wiring (e.g., the wiring 412, the wiring 413, the wiring 414, or the wiring 416) can be brought together into one wiring; that is, the number of wirings can be reduced. In that case, the wiring 415 is eliminated and the wiring 115 in the flip-flop 401_N can be connected to the wiring 412, the wiring 413, the wiring 414, or the wiring 416. In another example, the wiring 415 can be eliminated. In that case, like in FIG. 14B, the transistor 303 and the transistor 304 included in the circuit 105 in the flip-flop 401_N can be eliminated.

Note that a wiring can be additionally provided depending on the structure of the flip-flops 401_1 to 401_N. For example, in the case where a signal which can function as the voltage V2 or an all-stages reset signal is required like in FIG. 17A or 17B, a wiring can be additionally provided. In addition, a signal, voltage, or the like can be supplied to the additionally provided wiring from the circuit 420.

Figure 22:
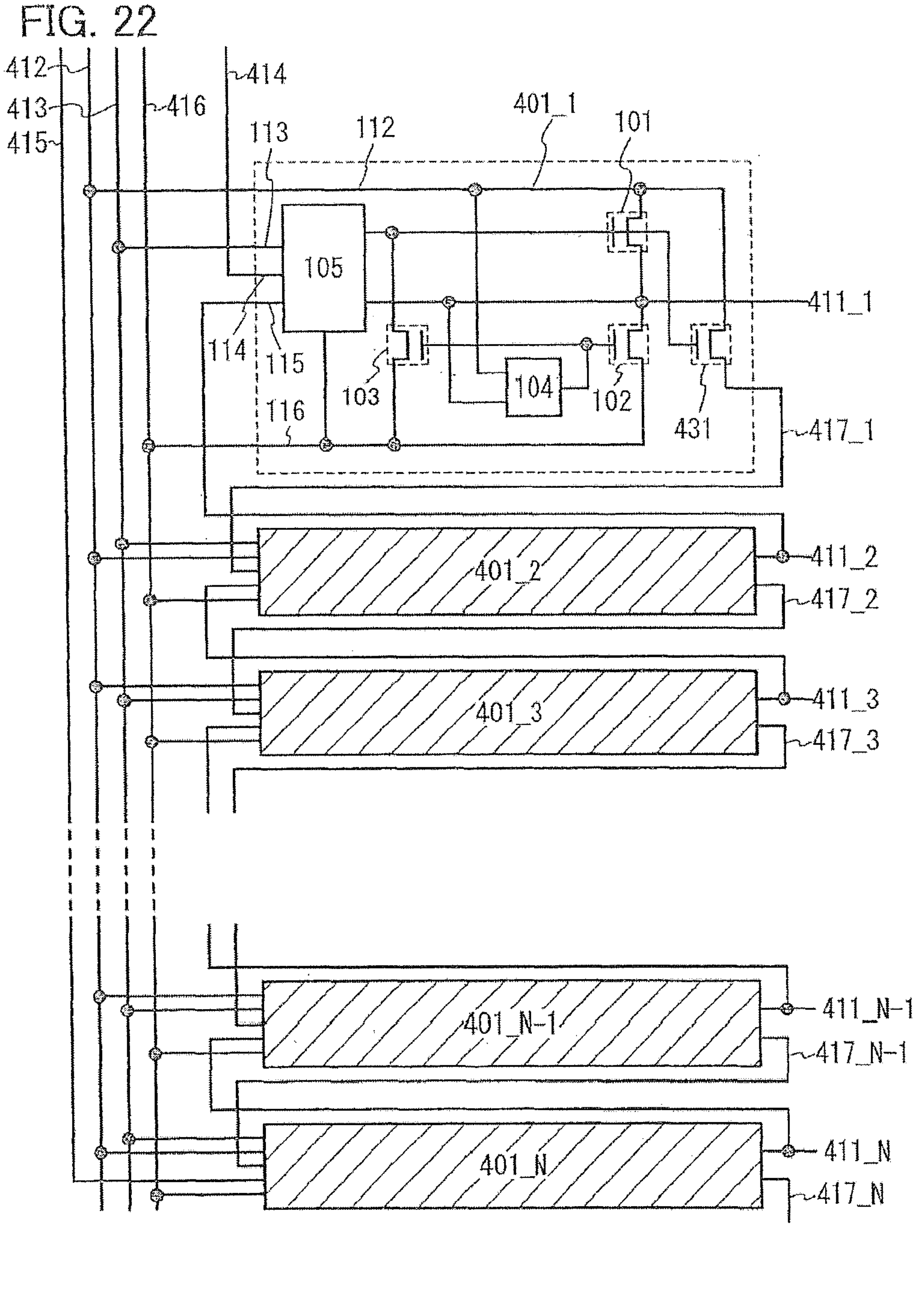
FIG. 22 is a circuit diagram of a shift register.

Note that as shown in FIG. 22, a transistor 431 can be added to each of the flip-flops 401_1 to 401_N. The transistor 431 preferably has the same polarity as the transistor 101 and is an n-channel transistor in many cases. However, this embodiment is not limited to this example. The transistor 431 can be a p-channel transistor. In the flip-flop 401_*i*, a first terminal of the transistor 431 is connected to the wiring 112, a second terminal of the transistor 431 is connected to a wiring 417_*i*, and a gate of the transistor 431 is connected to the node A. Further, the wiring 111 in the flip-flop 401_*i* is connected to the wiring 411_*i*, the wiring 112 in the flip-flop 401_*i* is connected to one of the wiring 412 and the wiring 413, the wiring 113 in the flip-flop 401_*i* is connected to the other of the wiring 412 and the wiring 413. The wiring 114 in the flip-flop 401_*i* is connected to a wiring 417_*i*−1. The wiring 115 in the flip-flop 401_*i* is connected to the wiring 411_*i*+1. The wiring 116 in the flip-flop 401_*i* is connected to the wiring 416. Accordingly, even in the case where a load such as a pixel or a gate line is connected to the wirings 411_1 to 411_N, distortion, delay, or the like does not occur in a transfer signal for driving a flip-flop of the next stage. Therefore, adverse effect due to delay of the shift register can be suppressed. However, this embodiment is not limited to this example. The wiring 114 can be connected to the wiring 411_*i*−1. Alternatively, the wiring 115 can be connected to a wiring 417_*i*+1. Alternatively, a transistor for maintaining the potential of wirings 417_1 to 417_N as V1 can be additionally provided.

Note that in FIG. 22, the signal GCK and the signal GCKB can be unbalanced like in FIG. 21A. Alternatively, like in FIG. 21B, polyphase clock signals can be used.

Embodiment 5

In this embodiment, an example of a display device is described.

First, an example of a system block of a liquid crystal display device is described with reference to FIG. 23A. The liquid crystal display device includes a circuit 5361, a circuit 5362, a circuit 5363_1, a circuit 5363_2, a pixel portion 5364, a circuit 5365, and a lighting device 5366. A plurality of wirings 5371 which are extended from the circuit 5362 and a plurality of wirings 5372 which are extended from the circuit 5363_1 and the circuit 5363_2 are provided in the pixel portion 5364. In addition, pixels 5367 which include display elements such as liquid crystal elements are provided in a matrix in respective regions where the plurality of wirings 5371 and the plurality of wirings 5372 intersect with each other.

The circuit 5361 has a function of supplying a signal, voltage, current, or the like to the circuit 5362, the circuit 5363_1, the circuit 5363_2, and the circuit 5365 in response to a video signal 5360 and can serve as a controller, a control circuit, a timing generator, a power supply circuit, a regulator, or the like. In this embodiment, for example, the circuit 5361 supplies a signal line driver circuit start signal (SSP), a signal line driver circuit clock signal (SCK), an inverted signal line driver circuit clock signal (SCKB), video signal data (DATA), or a latch signal (LAT) to the circuit 5362. Alternatively, for example, the circuit 5361 supplies a scan line driver circuit start signal (GSP), a scan line driver circuit clock signal (GCK), or an inverted scan line driver circuit clock signal (GCKB) to the circuit 5363_1 and the circuit 5363_2. Alternatively, the circuit 5361 supplies a backlight control signal (BLC) to the circuit 5365. Note that this embodiment is not limited to this example. The circuit 5361 can supply a variety of signals, voltages, currents, or the like to the circuit 5362, the circuit 5363_1, the circuit 5363_2, and the circuit 5365.

The circuit 5362 has a function of outputting video signals to the plurality of wirings 5371 in response to a signal supplied from the circuit 5361 (e.g., SSP, SCK, SCKB, DATA, or LAT) and can serve as a signal line driver circuit. The circuit 5363_1 and the circuit 5363_2 each have a function of outputting scan signals to the plurality of wirings 5372 in response to a signal supplied from the circuit 5361 (e.g., GSP, GCK, or GCKB) and can serve as a scan line driver circuit. The circuit 5365 has a function of controlling the luminance (or average luminance) of the lighting device 5366 by controlling the amount of electric power supplied to the lighting device 5366, time to supply the electric power to the lighting device 5366, or the like in response to the signal (BLC) supplied from the circuit 5361 and can serve as a power supply circuit.

Note that in the case where video signals are input to the plurality of wirings 5371, the plurality of wirings 5371 can serve as signal lines, video signal lines, source lines, or the like. In the case where scan signals are input to the plurality of wirings 5372, the plurality of wirings 5372 can serve as signal lines, scan lines, gate lines, or the like. Note that one example of this embodiment is not limited to this example.

Note that in the case where the same signal is input to the circuit 5363_1 and the circuit 5363_2 from the circuit 5361, scan signals output from the circuit 5363_1 to the plurality of wirings 5372 and scan signals output from the circuit 5363_2 to the plurality of wirings 5372 have approximately the same timings in many cases. Therefore, load caused by driving of the circuit 5363_1 and the circuit 5363_2 can be reduced. Accordingly, the display device can be made larger. Alternatively, the display device can have higher definition. Alternatively, since the channel width of transistors included in the circuit 5363_1 and the circuit 5363_2 can be reduced, a display device with a narrower frame can be obtained. Note that this embodiment is not limited to this example. The circuit 5361 can supply different signals to the circuit 5363_1 and the circuit 5363_2.

Note that one of the circuit 5363_1 and the circuit 5363_2 can be eliminated.

Note that a wiring such as a capacitor line, a power supply line, or a scan line can be additionally provided in the pixel portion 5364. Then, the circuit 5361 can output a signal, voltage, or the like to such a wiring. Alternatively, a circuit which is similar to the circuit 5363_1 or the circuit 5363_2 can be additionally provided. The additionally provided circuit can output a signal such as a scan signal to the additionally provided wiring.

Note that the pixel 5367 can include a light-emitting element such as an EL element as a display element. In this case, as illustrated in FIG. 23B, since the display element can emit light, the circuit 5365 and the lighting device 5366 can be eliminated. In addition, in order to supply electric power to the display element, a plurality of wirings 5373 which can serve as power supply lines can be provided in the pixel portion 5364. The circuit 5361 can supply power supply voltage called voltage (ANO) to the wirings 5373. The wirings 5373 can be separately connected to the pixels in accordance with color elements or connected to all the pixels.

Note that FIG. 23B illustrates an example in which the circuit 5361 supplies different signals to the circuit 5363_1 and the circuit 5363_2. The circuit 5361 supplies a signal such as a scan line driver circuit start signal (GSP1), a scan line driver circuit clock signal (GCK1), or an inverted scan line driver circuit clock signal (GCKB1) to the circuit 5363_1. In addition, the circuit 5361 supplies a signal such as a scan line driver circuit start signal (GSP2), a scan line driver circuit clock signal (GCK2), or an inverted scan line driver circuit clock signal (GCKB2) to the circuit 5363_2. In this case, the circuit 5363_1 can scan only wirings in odd-numbered rows of the plurality of wirings 5372 and the circuit 5363_2 can scan only wirings in even-numbered rows of the plurality of wirings 5372. Thus, the driving frequency of the circuit 5363_1 and the circuit 5363_2 can be lowered, so that power consumption can be reduced. Alternatively, an area in which a flip-flop of one stage can be laid out can be made larger. Therefore, a display device can have higher definition. Alternatively, a display device can be made larger. Note that this embodiment is not limited to this example. As in FIG. 23A, the circuit 5361 can supply the same signal to the circuit 5363_1 and the circuit 5363_2.

Figure 23A:
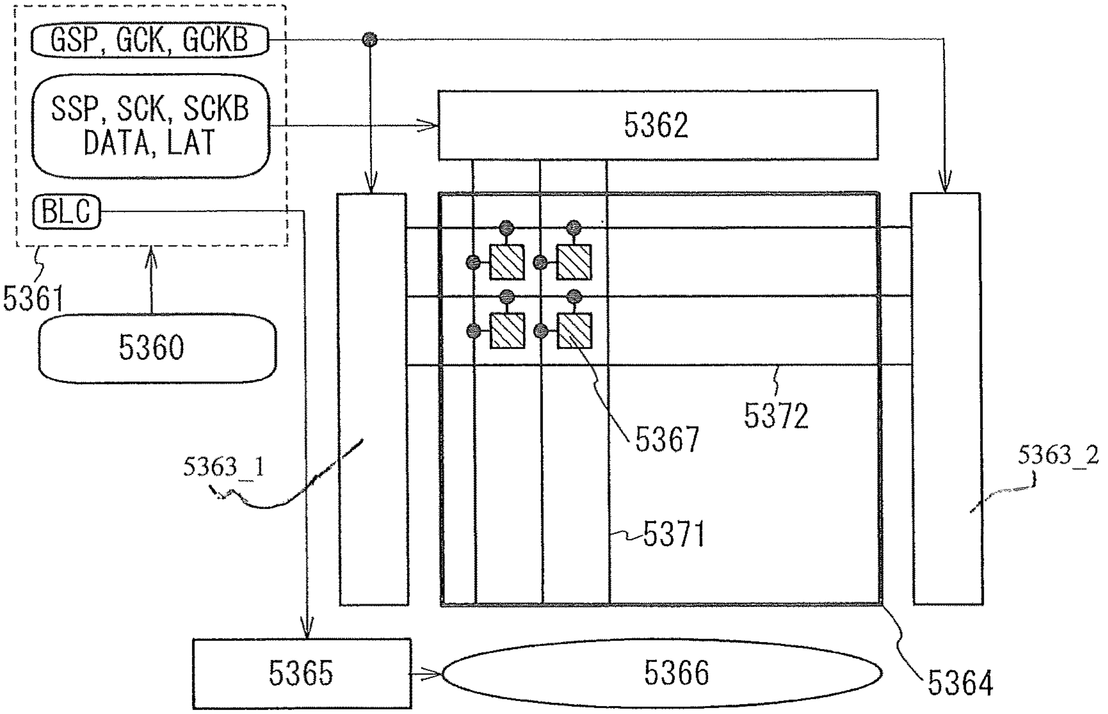
FIGS. 23A and 23B are system block diagrams of a display device.
Figure 23B:
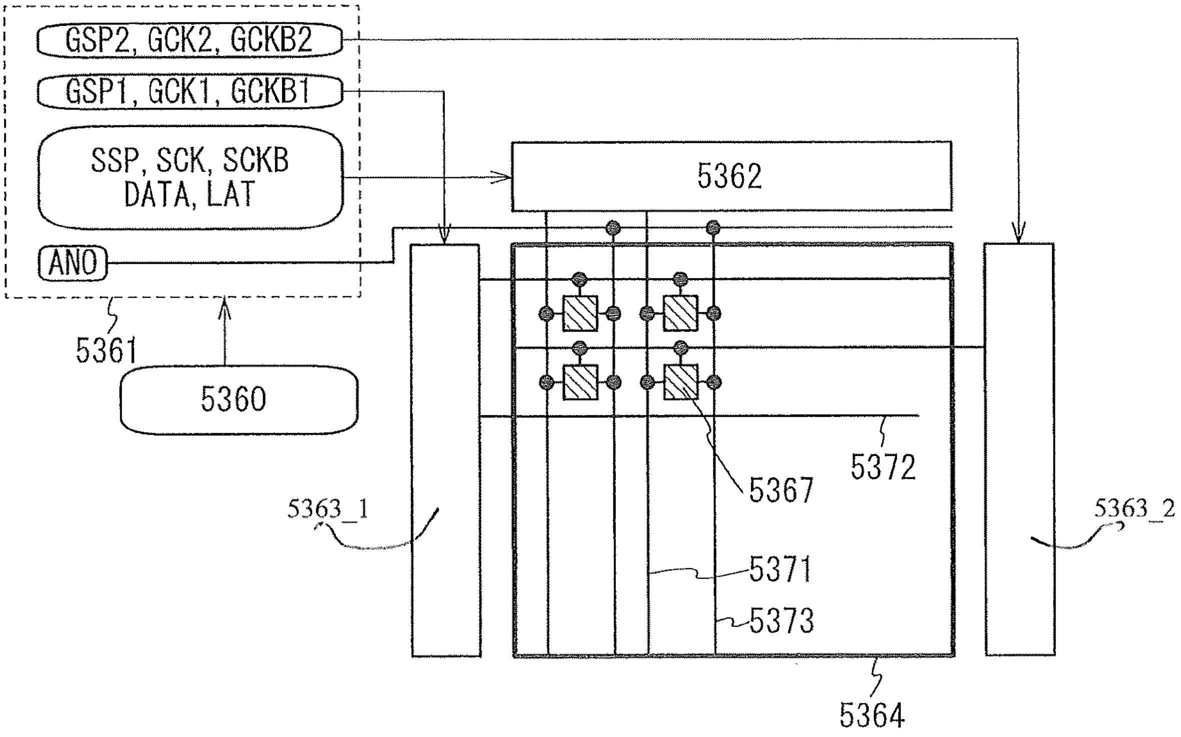

Note that as in FIG. 23B, the circuit 5361 can supply different signals to the circuit 5363_1 and the circuit 5363_2 in FIG. 23A.

Thus far, the example of a system block of a display device is described.

Next, examples of structures of the display devices are described with reference to FIGS. 24A to 24E.

Figure 24A:
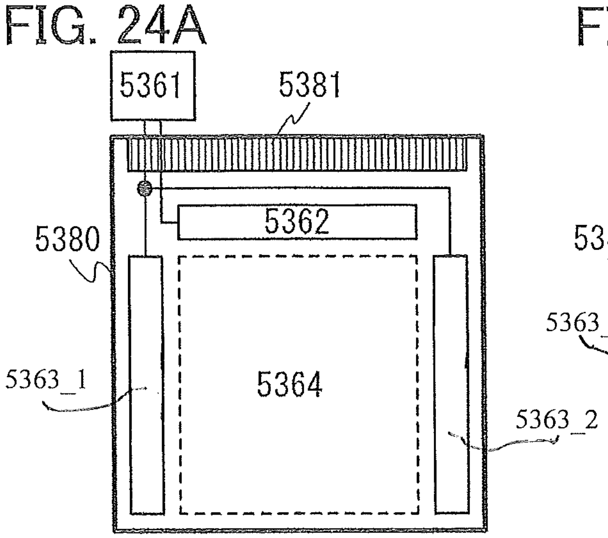
FIGS. 24A to 24E are diagrams each illustrating a structure of a display device.

In FIG. 24A, circuits which have a function of outputting signals to the pixel portion 5364 (e.g., the circuit 5362, the circuit 5363_1, and the circuit 5363_2) are formed over the same substrate 5380 as the pixel portion 5364. In addition, the circuit 5361 is formed over a different substrate from the pixel portion 5364. In this manner, since the number of external components is reduced, reduction in cost can be achieved. Alternatively, since the number of signals or voltages input to the substrate 5380 is reduced, the number of connections between the substrate 5380 and the external component can be reduced. Therefore, improvement in reliability or the increase in yield can be achieved.

Note that in the case where the circuit is formed over a different substrate from the pixel portion 5364, the substrate can be mounted on an FPC (flexible printed circuit) by TAB (tape automated bonding). Alternatively, the substrate can be mounted on the same substrate 5380 as the pixel portion 5364 by COG (chip on glass).

Note that in the case where the circuit is formed over a different substrate from the pixel portion 5364, a transistor formed using a single crystal semiconductor can be formed on the substrate. Therefore, the circuit formed over the substrate can have advantages such as improvement in driving frequency, improvement in driving voltage, and suppression of variations in output signals.

Note that a signal, voltage, current, or the like is input from an external circuit through an input terminal 5381 in many cases.

Figure 24B:
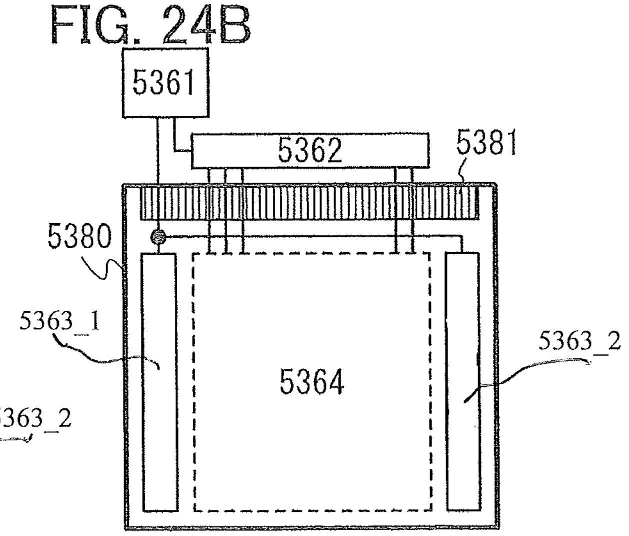

In FIG. 24B, circuits with low driving frequency (e.g., the circuit 5363_1 and the circuit 5363_2) are formed over the same substrate 5380 as the pixel portion 5364. In addition, the circuit 5361 and the circuit 5362 are formed over a different substrate from the pixel portion 5364. In this manner, since the circuit formed over the substrate 5380 can be formed using a transistor with low mobility, a non-single-crystal semiconductor, an amorphous semiconductor, a microcrystalline semiconductor, an organic semiconductor, an oxide semiconductor, or the like can be used for a semiconductor layer of the transistor. Accordingly, the increase in the size of the display device, reduction in the number of steps, reduction in cost, improvement in yield, or the like can be achieved.

Figure 24C:
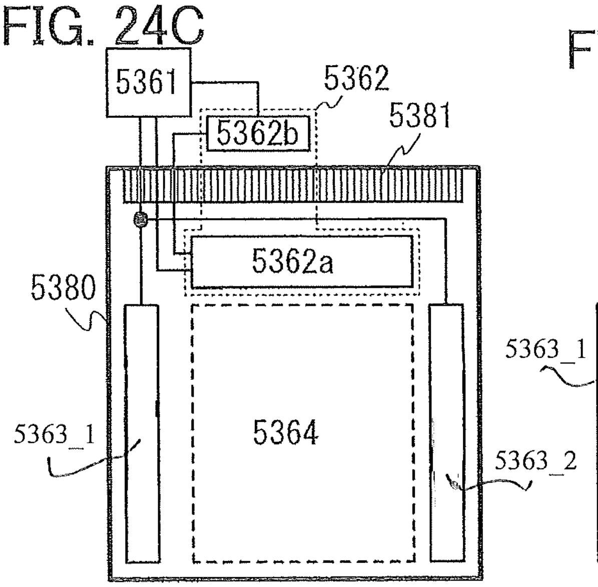

Note that as illustrated in FIG. 24C, part of the circuit 5362 (a circuit 5362*a*) can be formed over the same substrate 5380 as the pixel portion 5364 and the other part of the circuit 5362 (a circuit 5362*b*) can be formed over a different substrate from the pixel portion 5364. The circuit 5362*a* includes a circuit which can be formed using a transistor with low mobility (e.g., a shift register, a selector, or a switch) in many cases. In addition, the circuit 5362*b* includes a circuit which is preferably formed using a transistor with high mobility and few variations in characteristics (e.g., a shift register, a latch circuit, a buffer circuit, a DA converter circuit, or an AD converter circuit) in many cases. In this manner, as in FIG. 24B, a non-single-crystal semiconductor, an amorphous semiconductor, a microcrystalline semiconductor, an organic semiconductor, an oxide semiconductor, or the like can be used for a semiconductor layer of the transistor. Further, reduction in external components can be achieved.

Figure 24D:
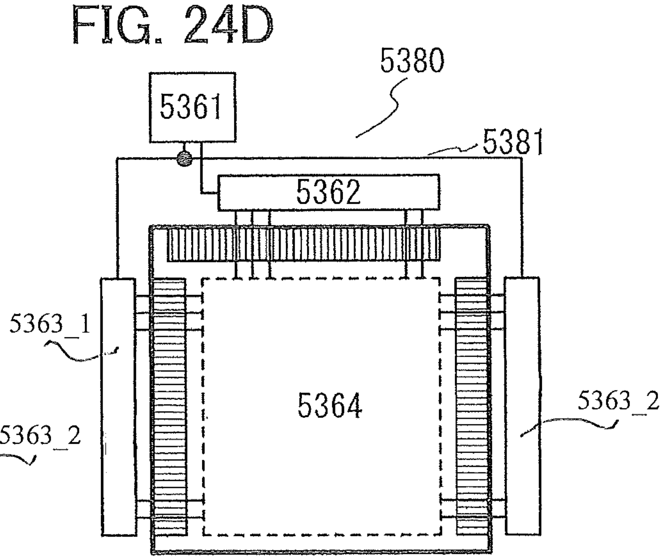

In FIG. 24D, circuits which have a function of outputting signals to the pixel portion 5364 (e.g., the circuit 5362, the circuit 5363_1, and the circuit 5363_2) and a circuit which has a function of controlling these circuits (e.g., the circuit 5361) are formed over a different substrate from the pixel portion 5364. In this manner, since the pixel portion and peripheral circuits thereof can be formed over different substrates, improvement in yield can be achieved.

Note that as in FIG. 24D, the circuit 5363_1 and the circuit 5363_2 can be formed over a different substrate from the pixel portion 5364 in FIGS. 24A to 24C.

Figure 24E:
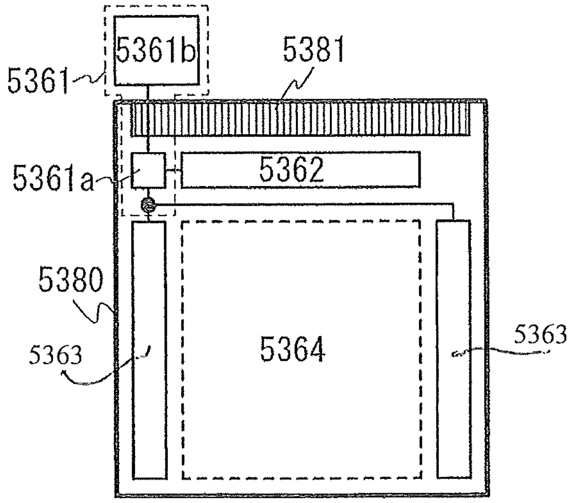

In FIG. 24E, part of the circuit 5361 (a circuit 5361*a*) is formed over the same substrate 5380 as the pixel portion 5364 and the other part of the circuit 5361 (a circuit 5361*b*) is formed over a different substrate from the pixel portion 5364. The circuit 5361*a* includes a circuit which can be formed using a transistor with low mobility (e.g., a switch, a selector, or a level shift circuit) in many cases. In addition, the circuit 5361*b* includes a circuit which is preferably formed using a transistor with high mobility and few variations (e.g., a shift register, a timing generator, an oscillator, a regulator, or an analog buffer) in many cases.

Note that also in FIGS. 24A to 24D, the circuit 5361*a* can be formed over the same substrate as the pixel portion 5364 and the circuit 5361*b* can be formed over a different substrate from the pixel portion 5364.

The above is the description of the display device in this embodiment. As each of the circuit 5363_1 and the circuit 5363_2, the semiconductor device or the shift register in Embodiments 1 to 4 can be used. In that case, since the circuit 5363_1, the circuit 5363_2, and the pixel portion are formed over one substrate, all the transistors formed over the substrate can be n-channel transistors or all the transistors formed over the substrate can be p-channel transistors. Accordingly, reduction in the number of steps, improvement in yield, improvement in reliability, or reduction in cost can be achieved. Specifically, if all the transistors are n-channel transistors, non-single-crystal semiconductors, microcrystalline semiconductors, organic semiconductors, oxide semiconductors, or the like can be used for semiconductor layers of the transistors. Accordingly, increase in the size of the display device, reduction in cost, improvement in yield, or the like can be achieved.

Note that deterioration of characteristics such as increase in threshold voltage or decrease in mobility is caused in a transistor in which a non-single-crystal semiconductor, a microcrystalline semiconductor, an organic semiconductor, an oxide semiconductor, or the like is used as a semiconductor layer in many cases. However, since deterioration of characteristics of the transistor in the semiconductor device or the shift register in Embodiments 1 to 4 can be suppressed, the life of a display device can be made longer.

Note that as part of the circuit 5362, the semiconductor device or the shift register in Embodiments 1 to 4 can be used. For example, the circuit 5362*a* can include the semiconductor device or the shift register in Embodiments 1 to 4.

Embodiment 6

In this embodiment, one example of a signal line driver circuit will be described. Note that the signal line driver circuit can be referred to as a semiconductor device or a signal generation circuit.

One example of the signal line driver circuit is described with reference to FIG. 25A. The signal line driver circuit includes a plurality of circuits of circuits 502_1 to 502_N (N is a natural number), a circuit 500, and a circuit 501. In addition, the circuits 502_1 to 502_N each include a plurality of transistors of transistors 503_1 to 503_*k* (k is a natural number). The transistors 503_1 to 503_*k* are n-channel transistors. However, this embodiment is not limited to this example. The transistors 503_1 to 503_*k* can be p-channel transistors or CMOS switches.

A connection relation of the signal line driver circuit will be described by using the circuit 502_1 as an example. First terminals of the transistors 503_1 to 503_*k* are connected to the wiring 505_1. Second terminals of the transistors 503_1 to 503_*k* are connected to wirings S1 to Sk, respectively. Gates of the transistors 503_1 to 503_*k* are connected to wirings 504_1 to 504_*k*, respectively. For example, the first terminal of the transistor 503_1 is connected to the wiring 505_1, the second terminal of the transistor 503_1 is connected to the wiring S1, and the gate of the transistor 503_1 is connected to the wiring 504_1.

The circuit 500 has a function of supplying a signal to the circuits 502_1 to 502_N through the wirings 504_1 to 504_*k* and can function as a shift register, a decoder, or the like. The signal is a digital signal in many cases and can function as a selection signal. In addition, the wirings 504_1 to 504_*k* can function as signal lines.

The circuit 501 has a function of outputting a signal to the circuits 502_1 to 502_N and can function as a video signal generation circuit or the like. For example, the circuit 501 supplies the signal to the circuit 502_1 through the wiring 505_1. At the same time, the circuit 501 supplies the signal to the circuit 502_2 through the wiring 505_2. The signal is an analog signal in many cases and can function as a video signal. In addition, the wirings 505_1 to 505_N can function as signal lines.

The circuits 502_1 to 502_N each have a function of selecting a wiring to which an output signal from the circuit 501 is output and can function as a selector circuit. For example, the circuit 502_1 has a function of selecting one of the wirings S1 to Sk to output a signal to be output from the circuit 501 to the wiring 505_1.

The transistors 503_1 to 503_*k* have a function of controlling the electric conduction state between the wiring 505_1 and the wirings S1 to Sk in accordance with the output signal from the circuit 500 and function as switches.

Figure 25A:
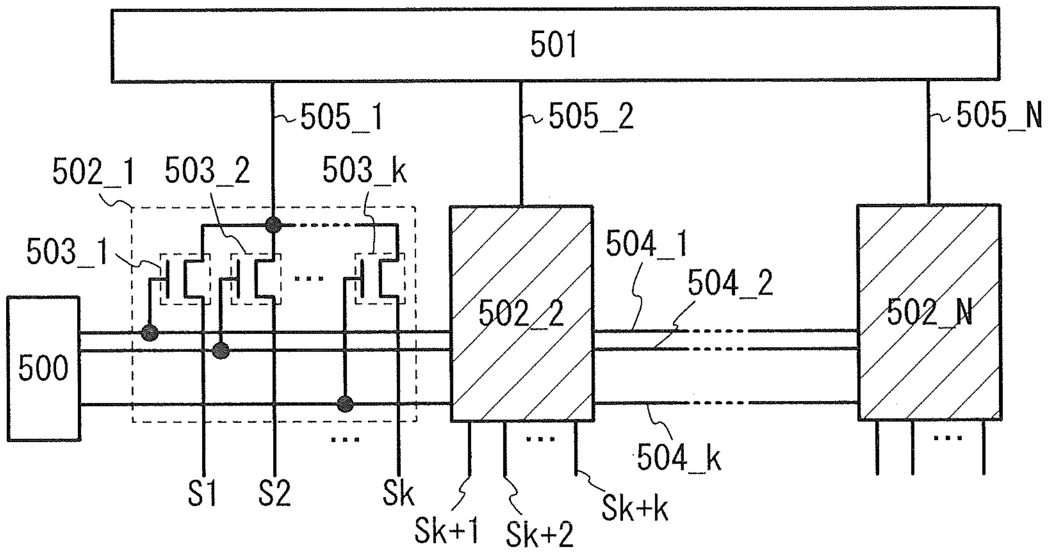
FIG. 25A is a circuit diagram of a signal line driver circuit and FIG. 25B is a timing chart illustrating a driving method of the signal line driver circuit.
Figure 25B:
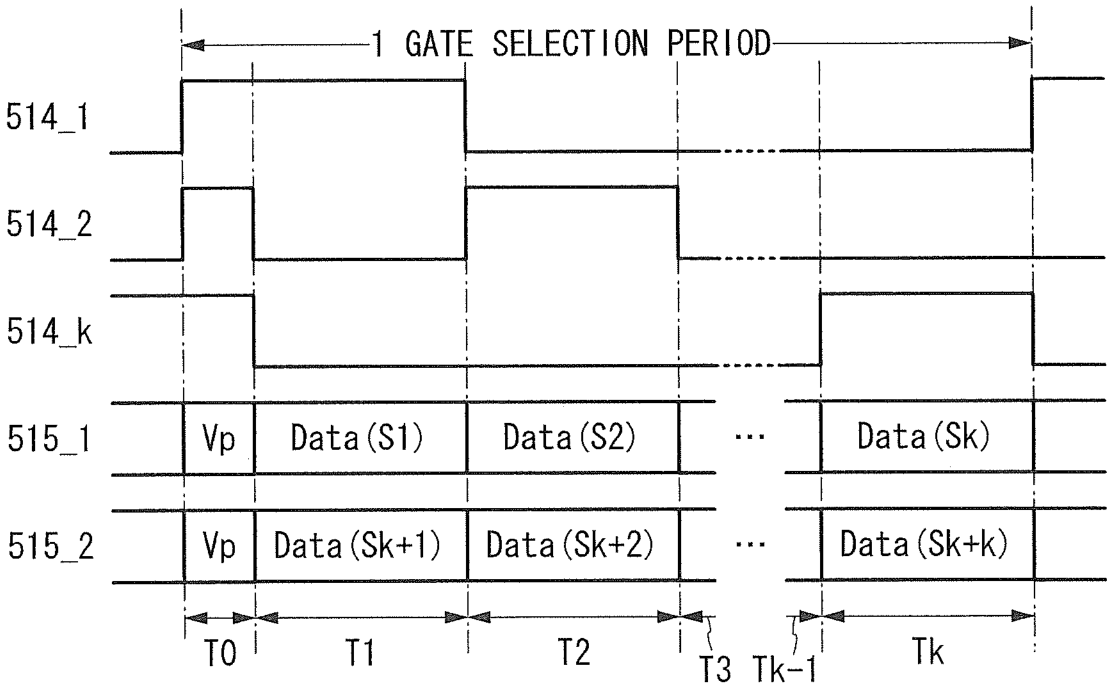

Next, operation of the signal line driver circuit shown in FIG. 25A is described with reference to a timing chart in FIG. 25B. FIG. 25B shows examples of a signal 514_1 input to the wiring 504_1, a signal 514_2 input to the wiring 504_2, a signal 514_*k* input to the wiring 504_*k*, a signal 515_1 input to the wiring 505_1, and a signal 515_2 input to the wiring 505_2.

Note that one operation period of the signal line driver circuit corresponds to one gate selection period in a display device. One gate selection period is a period in which a pixel which belongs to one row is selected and a video signal can be written to the pixel.

Note that one gate selection period is divided into a period TO and a period T1 to a period Tk. The period TO is a period for applying voltage for precharge on pixels which belong to a selected row at the same time and can be used as a precharge period. Each of the periods T1 to Tk is a period in which a video signal is written to pixels which belong to the selected row and can be used as a writing period.

Note that for simplicity, operation of the signal line driver circuit is described by using operation of the circuit 502_1 as an example.

First, during the period TO, the circuit 500 outputs a signal in an H level to the wirings 504_1 to 504_*k*. Then, the transistors 503_1 to 503_*k* are turned on, whereby the wiring 505_1 and the wirings S1 to Sk are brought into electrical conduction. At that time, the circuit 501 supplies precharge voltage Vp to the wiring 505_1, so that the precharge voltage Vp is output to the wirings S1 to Sk through the transistors 503_1 to 503_*k*, respectively. Then, the precharge voltage Vp is written to the pixels which belong to the selected row, whereby the pixels which belong to the selected row are precharged.

Next, during the period T1, the circuit 500 outputs a signal in an H level to the wirings 504_1. Then, the transistor 503_1 is turned on, whereby the wiring 505_1 and the wiring S1 are brought into electrical conduction. Then, the wiring 505_1 and the wirings S2 to Sk are brought out of electrical conduction. At that time, the circuit 501 supplies a signal Data (S1) to the wiring 505_1, so that the signal Data (S1) is output to the wiring S1 through the transistors 503_1. In this manner, the signal Data (S1) is written to, of the pixels connected to the wiring S1, the pixels which belong to the selected row.

Next, during the period T2, the circuit 500 outputs a signal in an H level to the wirings 504_2. Then, the transistor 503_2 is turned on, whereby the wiring 505_2 and the wiring S2 are brought into electrical conduction. Then, the wiring 505_1 and the wirings S1 are brought out of electrical conduction while the wiring 505_1 and the wirings S3 to Sk are kept out of electrical conduction. At that time, when the circuit 501 outputs a signal Data (S2) to the wiring 505_1, the signal Data (S2) is output to the wiring S2 through the transistors 503_2. In this manner, the signal Data (S2) is written to, of the pixels connected to the wiring S2, the pixels which belong to the selected row.

After that, since the circuit 500 sequentially outputs signals in an H level to the wirings 504_1 to 504_*k* until the end of the period Tk, the circuit 500 sequentially outputs the signal in the H level to the wirings 504_3 to 504_*k* from the period T3 to the period Tk, as in the period T1 and the period T2. Therefore, since the transistors 503_3 to 503_*k* are sequentially turned on, the transistors 503_1 to 503_*k* are sequentially turned on. Accordingly, a signal output from the circuit 501 is sequentially output to the wirings S1 to Sk. In this manner, the signal can be sequentially written to the pixels which belong to the selected row.

The above is the description of the one example of the signal line driver circuit. Since the signal line driver circuit in this embodiment includes the circuit which functions as a selector, the number of signals or wirings can be reduced. Alternatively, since voltage for precharging is written to the pixel before a video signal is written to the pixel (during period TO), a writing time of the video signal can be shortened. Accordingly, increase in the size of a display device and higher resolution of the display device can be achieved. However, this embodiment is not limited to this example. It is acceptable that the period TO is eliminated, so that the pixel is not precharged.

Note that if k is too large a number, a writing time of the pixel is shortened, whereby writing of a video signal to the pixel is not completed in the writing time in some cases. Accordingly, it is preferable that k≤6. It is more preferable that k≤3. It is further preferable that k=2.

Specifically, in the case where a color element of a pixel is divided into n (n is a natural number), it can be acceptable that k=n. For example, in the case where a color element of a pixel is divided into red (R), green (G), and blue (B), it can be acceptable that k=3. In that case, one gate selection period is divided into a period TO, a period T1, a period T2, and a period T3. Then, a video signal can be written to the pixel of red (R), the pixel of green (G), and the pixel of blue (B) during the period T1, the period T2, and the period T3, respectively. However, this embodiment is not limited to this example. The order of the period T1, the period T2, and the period T3 can be appropriately set.

Specifically, in the case where a pixel is divided into n (n is a natural number) sub-pixels, it can be acceptable that k=n. For example, in the case where the pixel is divided into two sub-pixels, it can be acceptable that k=2. In that case, one gate selection period is divided into the period TO, the period T1, and the period T2. Then, a video signal can be written to one of the two sub-pixels during the period T1, and a video signal can be written to the other of the two sub-pixels during the period T2.

Note that since the driving frequencies of the circuit 500 and the circuits 502_1 to 502_N are low in many cases, the circuit 500 and the circuits 502_1 to 502_N can be formed over the same substrate as a pixel portion. In this manner, since the number of connections between the substrate over which the pixel portion is formed and an external circuit can be reduced, increase in yield, improvement in reliability, or the like can be achieved. Further, as shown in FIG. 24C, by also forming a scan line driver circuit over the same substrate as the pixel portion, the number of connections between the substrate over which the pixel portion is formed and the external circuit can be further reduced.

Note that the semiconductor device or shift register described in Embodiments 1 to 4 can be used as the circuit 500. In that case, all transistors in the circuit 500 can be n-channel transistors or all the transistors in the circuit 500 can be p-channel transistors. Accordingly, reduction in the number of steps, increase in yield, or reduction in cost can be achieved.

Note that not only all the transistors included in the circuit 500 but also all transistors in the circuits 502_1 to 502_N can be n-channel transistors or all the transistors in the circuits 502_1 to 502_N can be p-channel transistors. Therefore, in the case where the circuit 500 and the circuits 502_1 to 502_N are formed over the same substrate as the pixel portion, reduction in the number of steps, increase in yield, or reduction in cost can be achieved. Specifically, by using n-channel transistors as all the transistors, non-single-crystal semiconductors, amorphous semiconductors, microcrystalline semiconductors, organic semiconductors, or oxide semiconductors can be used as semiconductor layers of the transistors. This is because the driving frequencies of the circuit 500 and the circuits 502_1 to 502_N are low in many cases.

Embodiment 7

In this embodiment, a pixel structure and operation of a pixel which can be applied to a liquid crystal display device are described.

Figure 26A:
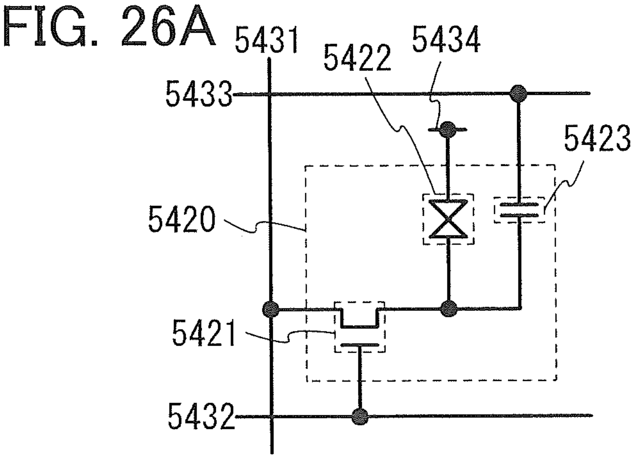
FIG. 26A is a circuit diagram of a pixel and FIGS. 26B and 26C are timing charts each illustrating a driving method of the pixel.

FIG. 26A illustrates an example of a pixel. A pixel 5420 includes a transistor 5421, a liquid crystal element 5422, and a capacitor 5423. A first terminal of the transistor 5421 is connected to a wiring 5431, a second terminal of the transistor 5421 is connected to one electrode of the liquid crystal element 5422 and one electrode of the capacitor 5423, and a gate of the transistor 5421 is connected to a wiring 5432. The other electrode of the liquid crystal element 5422 is connected to an electrode 5434 and the other electrode of the capacitor 5423 is connected to a wiring 5433.

A video signal can be input to the wiring 5431, for example. A scan signal, a selection signal, or a gate signal can be input to the wiring 5432, for example. A constant voltage can be supplied to the wiring 5433, for example. A constant voltage can be supplied to the electrode 5434, for example. However, this embodiment is not limited to this example. A writing time of a video signal can be shortened by supply of precharge voltage to the wiring 5431. Alternatively, voltage applied to the liquid crystal element 5422 can be controlled by input of a signal to the wiring 5433. Alternatively, frame inversion driving can be achieved by input of a signal to the electrode 5434.

Note that the wiring 5431 can function as a signal line, a video signal line, or a source line. The wiring 5432 can function as a signal line, a scan line, or a gate line. The wiring 5433 can function as a power supply line or a capacitor line. The electrode 5434 can function as a common electrode or a counter electrode. However, this embodiment is not limited to this example. In the case where voltage is supplied to the wiring 5431 and the wiring 5432, these wirings can function as power supply lines. Alternatively, in the case where a signal is input to the wiring 5433, the wiring 5433 can function as a signal line.

The transistor 5421 has a function of controlling timing when a video signal is written to a pixel by controlling the electrical conduction state of the wiring 5431 and the one electrode of the liquid crystal element 5422 and can function as a switch. The capacitor 5423 has a function of keeping voltage applied to the liquid crystal element 5422 as a stable value by storing the potential difference between the one electrode of the liquid crystal element 5422 and the wiring 5433 and functions as a storage capacitor. However, this embodiment is not limited to this example.

Figure 26B:
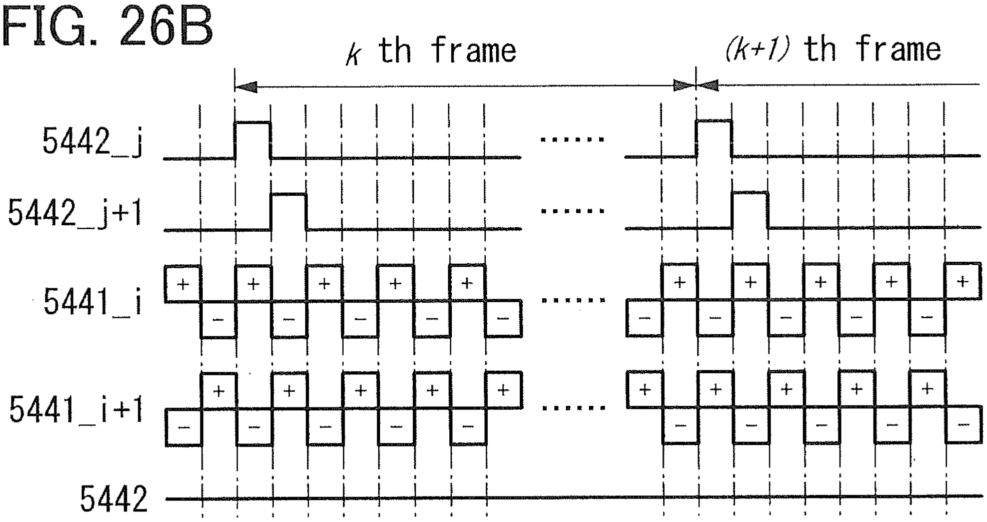

FIG. 26B shows an example of a timing chart for illustrating the operation of the pixel in FIG. 26A. FIG. 26B shows a signal 5442_*j* (j is a natural number), a signal 5442_*j*+1, a signal 5441_*i* (i is a natural number), a signal 5441_*i*+1, and a voltage 5442. In addition, FIG. 26B shows a kth (k is a natural number) frame and a (k+1)th frame. Note that the signal 5442_*j*, the signal 5442_*j*+1, the signal 5441_*i*, the signal 5441_*i*+1, and the voltage 5442 are examples of a signal input to the wiring 5432 in a jth row, a signal input to the wiring 5432 in a (j+1)th row, a signal input to the wiring 5431 in an ith column, a signal input to the wiring 5431 in an (i+1)th column, and voltage supplied to the wiring 5432, respectively.

Operation of the pixel 5420 in the jth row and the ith column is described. When the signal 5442_j goes into an H level, the transistor 5421 is turned on. Accordingly, since the wiring 5431 in the ith column and the one electrode of the liquid crystal element 5422 are brought into electrical conduction, the signal 5441_j is input to the one electrode of the liquid crystal element 5422 through the transistor 5421. Then, the capacitor 5423 keeps the potential difference between the one electrode of the liquid crystal element 5422 and the wiring 5433. Therefore, after that, voltage applied to the liquid crystal element 5422 is constant until the signal 5422_j goes into the H level again. Then, the liquid crystal element 5422 expresses gray levels corresponding to the applied voltage.

Note that FIG. 26B shows an example of the case where a positive signal and a negative signal are alternately input to the wiring 5431 every one selection period. The positive signal is a signal whose potential is higher than a reference value (e.g., the potential of the electrode 5434). The negative signal is a signal whose potential is lower than a reference value (e.g., the potential of the electrode 5434). However, this embodiment is not limited to this example. Signals with the same polarity can be input to the wiring 5431 in one frame period.

Note that FIG. 26B shows an example of the case where the polarity of the signal 5441_i and the polarity of the signal 5441_i+1 are different from each other. However, this embodiment is not limited to this example. The polarity of the signal 5441_i and the polarity of the signal 5441_i+1 can be the same.

Figure 26C:
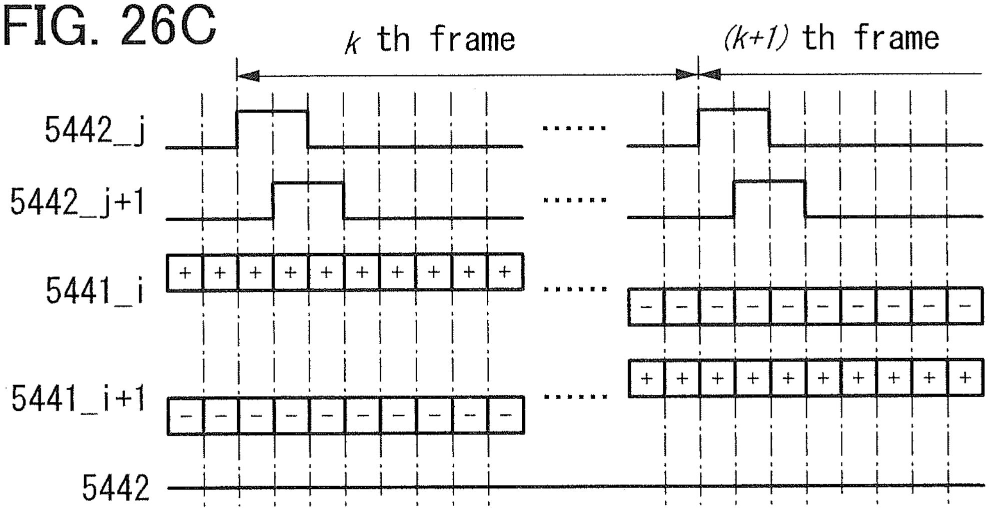

Note that FIG. 26B shows an example of the case where a period in which the signal 5442_j is in an H level and a period in which the signal 5442_j+1 is in an H level do not overlap with each other. However, this embodiment is not limited to this example. As shown in FIG. 26C, the period in which the signal 5442_j is in the H level and the period in which the signal 5442_j+1 is in the H level can overlap with each other. In that case, signals of the same polarity are preferably supplied to the wiring 5431 in one frame period. In this manner, pixels in a (j+1)th row can be precharged by using the signal 5441_j written to pixels in the jth row. Accordingly, a writing time of a video signal to a pixel can be shortened. Therefore, a high-definition display device can be obtained. Alternatively, a display portion of the display device can be made large. Alternatively, since the signals of the same polarity are input to the wiring 5431 in one frame period, power consumption can be reduced.

Figure 27A:
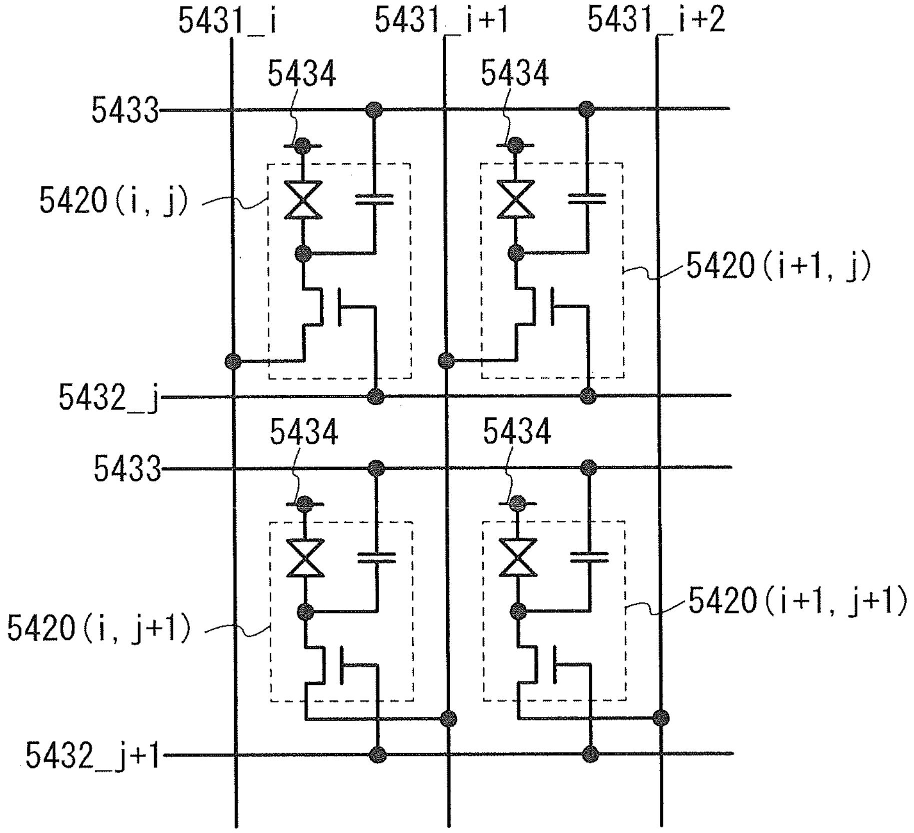
FIGS. 27A to 27C are circuit diagrams of a pixel.

Note that by a combination of a pixel structure in FIG. 27A and the timing chart in FIG. 26C, dot inversion driving can be achieved. In the pixel structure in FIG. 27A, a pixel 5420 (i,j) is connected to a wiring 5431_i. On the other hand, a pixel 5420 (i, j+1) is connected to a wiring 5431_i+1. In other words, pixels in the ith column are alternately connected to the wiring 5431_i and the wiring 5431_i+1 row-by-row. In this manner, since a positive signal and a negative signal are alternately written to the pixels in the ith column row-by-row, dot inversion driving can be achieved. However, this embodiment is not limited to this example. The pixels, which are in the ith column, of every plural rows (e.g., two rows or three rows) can be alternately connected to the wiring 5431_i and the wiring 5431_i+1.

Figure 27B:
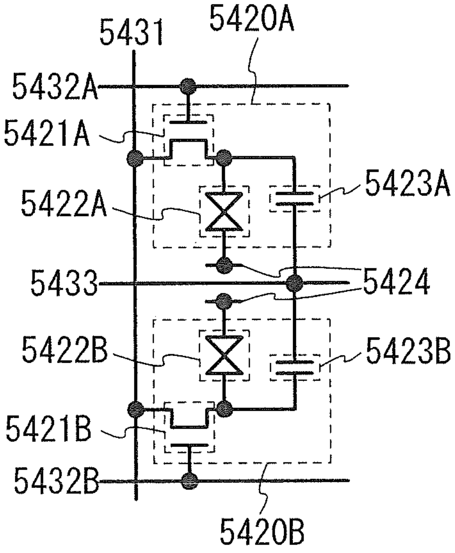
Figure 27C:
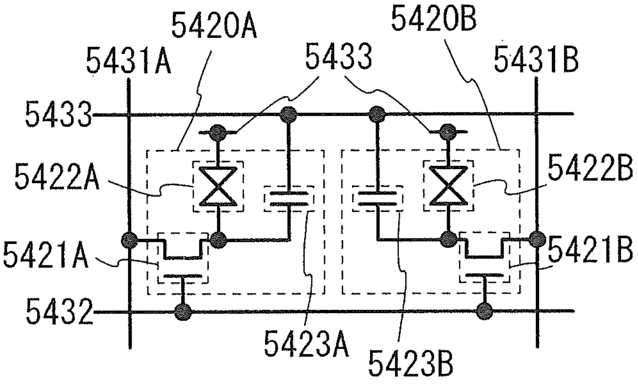

Note that a sub-pixel structure can be used as the pixel structure. FIGS. 27B and 27C each show a structure in the case where a pixel is divided into two sub-pixels. In addition, FIG. 27B shows a sub-pixels structure called 1S+2G and FIG. 27C shows a sub-pixel structure called 2S+1G. A sub-pixel 5420A and a sub-pixel 5420B correspond to the pixel 5420. A transistor 5421A and a transistor 5421B correspond to the transistor 5421. A liquid crystal element 5422A and a liquid crystal element 5422B correspond to the liquid crystal element 5422. A capacitor 5423A and a capacitor 5423B correspond to the capacitor 5423. A wiring 5431A and a wiring 5431B correspond to the wiring 5431. A wiring 5432A and a wiring 5432B correspond to the wiring 5432.

The above is the description of the pixel structure and the driving method of the pixel in this embodiment. By a combination of the pixel in this embodiment and any of the semiconductor device, the shift register, the display device, and the signal line driver circuit which are described in Embodiments 1 to 6, a variety of advantages can be obtained. For example, in the case where a sub-pixel structure is employed for the pixel, the number of signals required for driving a display device is increased. Therefore, the number of gate lines or source lines is increased. As a result, the number of connections between a substrate over which a pixel portion is formed and an external circuit is greatly increased in some cases. However, even if the number of gate lines is increased, the scan line driver circuit can be formed over a substrate over which the pixel portion is formed, as described in Embodiment 5. Therefore, the pixel with the sub-pixel structure can be used without greatly increasing the number of connections between the substrate over which the pixel portion is formed and the external circuit. Alternatively, even if the number of source lines is increased, the signal line driver circuit in Embodiment 6 can be formed over a substrate over which the pixel portion is formed. Therefore, the pixel with the sub-pixel structure can be used without greatly increasing the number of connections between the substrate over which the pixel portion is formed and the external circuit.

Alternatively, in the case where a signal is input to a capacitor line, the number of connections between the substrate over which the pixel portion is formed and the external circuit is greatly increased in some cases. For that case, a signal can be supplied to the capacitor line by using any of the semiconductor device and the shift register in Embodiments 1 to 4. In addition, the semiconductor device or the shift register in Embodiments 1 to 4 can be formed over the substrate over which the pixel portion is formed. Therefore, a signal can be input to the capacitor line without greatly increasing the number of connections between the substrate over which the pixel portion is formed and the external circuit.

Alternatively, in the case where alternate-current driving is employed, a time for writing a video signal to the pixel is short. As a result, shortage of the time for writing the video signal to the pixel is caused in some cases. Similarly, in the case where the pixel with the sub-pixel structure is used, the time for writing the video signal to the pixel is short. As a result, shortage of the time for writing the video signal to the pixel is caused in some cases. For that case, the video signal can be written to the pixel by using the signal line driver circuit in Embodiment 6. In that case, since voltage for precharge is written to the pixel before the video signal is written to the pixel, the video signal can be written to the pixel in a short time. Alternatively, as shown in FIG. 21B, by overlap of a period in which one row is selected with a period in which a different row is selected, a video signal for the different row can be used as the voltage for precharge.

Embodiment 8

In this embodiment, an example of a cross-sectional structure of a display device will be described with reference to FIGS. 29A to 29C.

Figure 29A:
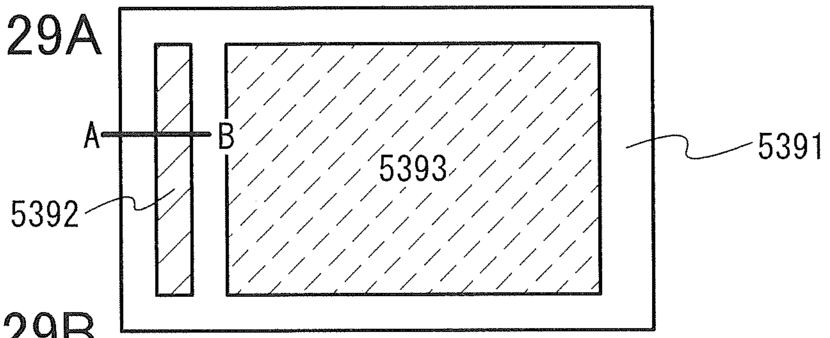
FIG. 29A is a top view of a display device and FIGS. 29B and 29C are cross-sectional views of the display device.

FIG. 29A illustrates an example of a top view of a display device. A driver circuit 5392 and a pixel portion 5393 are formed over a substrate 5391. An example of the driver circuit 5392 is a scan line driver circuit or a signal line driver circuit.

Figure 29B:
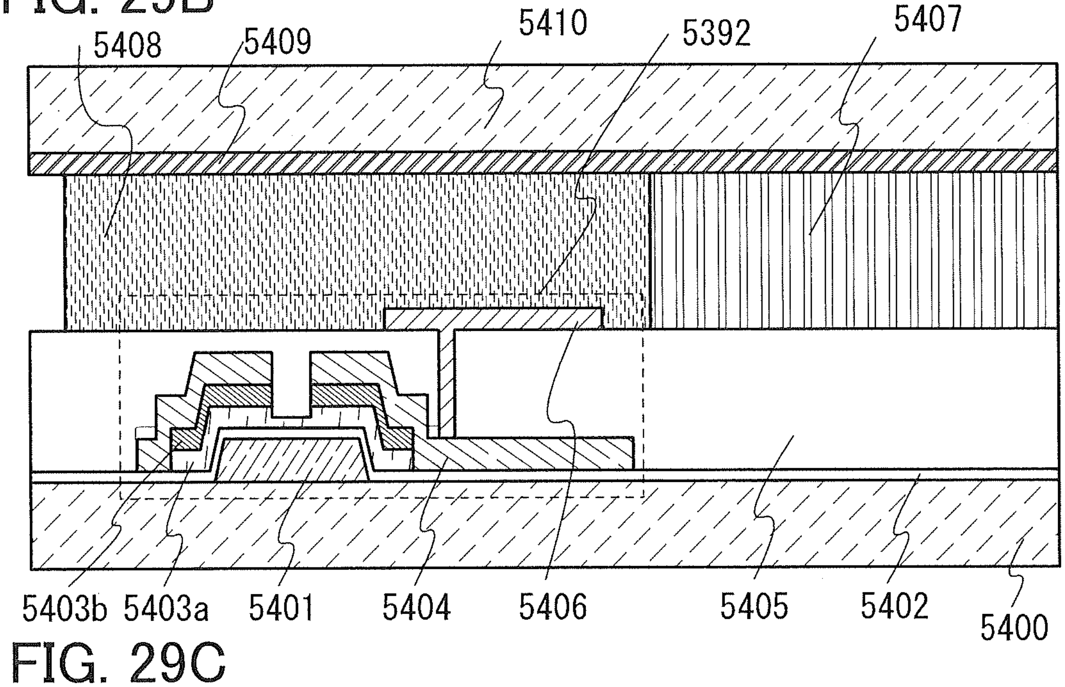

FIG. 29B illustrates an example of the A-B cross section of FIG. 29A. FIG. 29B illustrates a substrate 5400, a conductive layer 5401 formed over the substrate 5400, an insulating layer 5402 formed so as to cover the conductive layer 5401, a semiconductor layer 5403*a* formed over the conductive layer 5401 and the insulating layer 5402, a semiconductor layer 5403*b* formed over the semiconductor layer 5403*a*, a conductive layer 5404 formed over the semiconductor layer 5403*b* and the insulating layer 5402, an insulating layer 5405 formed over the insulating layer 5402 and the conductive layer 5404 and having an opening portion, a conductive layer 5406 formed over the insulating layer 5405 and in the opening portion in the insulating layer 5405, an insulating layer 5408 provided over the insulating layer 5405 and the conductive layer 5406, a liquid crystal layer 5407 formed over the insulating layer 5405, a conductive layer 5409 formed over the liquid crystal layer 5407 and the insulating layer 5408, and a substrate 5410 provided over the conductive layer 5409.

The conductive layer 5401 can function as a gate electrode. The insulating layer 5402 can function as a gate insulating film. The conductive layer 5404 can function as a wiring, an electrode of a transistor, an electrode of a capacitor, or the like. The insulating layer 5405 can function as an interlayer film or a planarization film. The conductive layer 5406 can function as a wiring, a pixel electrode, or a reflective electrode. The insulating layer 5408 can function as a sealing material. The conductive layer 5409 can function as a counter electrode or a common electrode.

Here, parasitic capacitance is sometimes generated between the driver circuit 5392 and the conductive layer 5409. Thus, an output signal from the driver circuit 5392 or a potential of each node is distorted or delayed, or power consumption is increased. However, when the insulating layer 5408 which can serve as the sealing material is formed over the driver circuit 5392 as illustrated in FIG. 29B, parasitic capacitance generated between the driver circuit 5392 and the conductive layer 5409 can be reduced. This is because the dielectric constant of the sealing material is often lower than that of the liquid crystal layer. Accordingly, distortion or delay of the output signal from the driver circuit 5392 or the potential of each node can be reduced. Alternatively, power consumption of the driver circuit 5392 can be reduced.

Figure 29C:
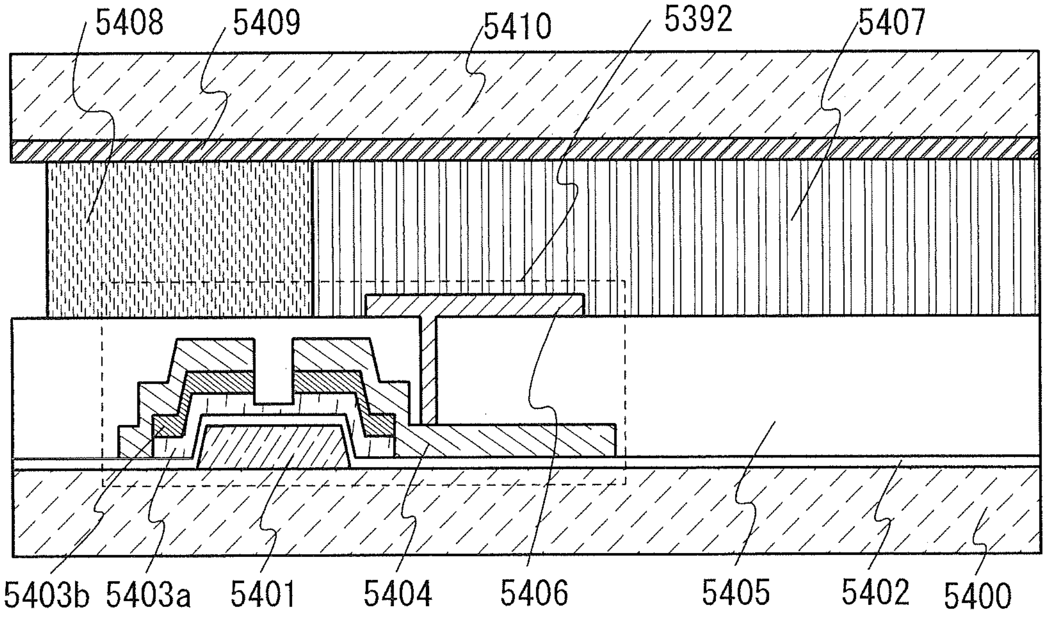

Note that as illustrated in FIG. 29C, the insulating layer 5408 which can function as the sealing material can be formed over part of the driver circuit 5392. In such a case also, parasitic capacitance generated between the driver circuit 5392 and the conductive layer 5409 can be reduced; thus, distortion or delay of the output signal from the driver circuit 5392 or distortion or delay of the potential of each node can be reduced. Note that this embodiment is not limited thereto, and it is acceptable that the insulating layer 5408, which can function as the sealing material, is not formed over the driver circuit 5392.

Note that a display element is not limited to a liquid crystal element, and a variety of display elements such as an EL element or an electrophoretic element can be used.

As above, this embodiment describes one example of the cross-sectional structure of the display device. Such a structure can be combined with the semiconductor device or the shift register in Embodiments 1 to 4. For example, when a non-single-crystal semiconductor, an amorphous semiconductor, a microcrystalline semiconductor, an organic semiconductor, an oxide semiconductor, or the like is used for a semiconductor layer of a transistor, the channel width of the transistor is often increased. However, by reducing parasitic capacitance of the driver circuit as in this embodiment, the channel width of the transistor can be reduced. Accordingly, the layout area can be reduced, so that the frame of the display device can be reduced. Alternatively, the resolution of the display device can be increased.

Embodiment 9

In this embodiment, examples of structures of transistors are described with reference to FIGS. 30A, 30B, and 30C.

Figure 30A:
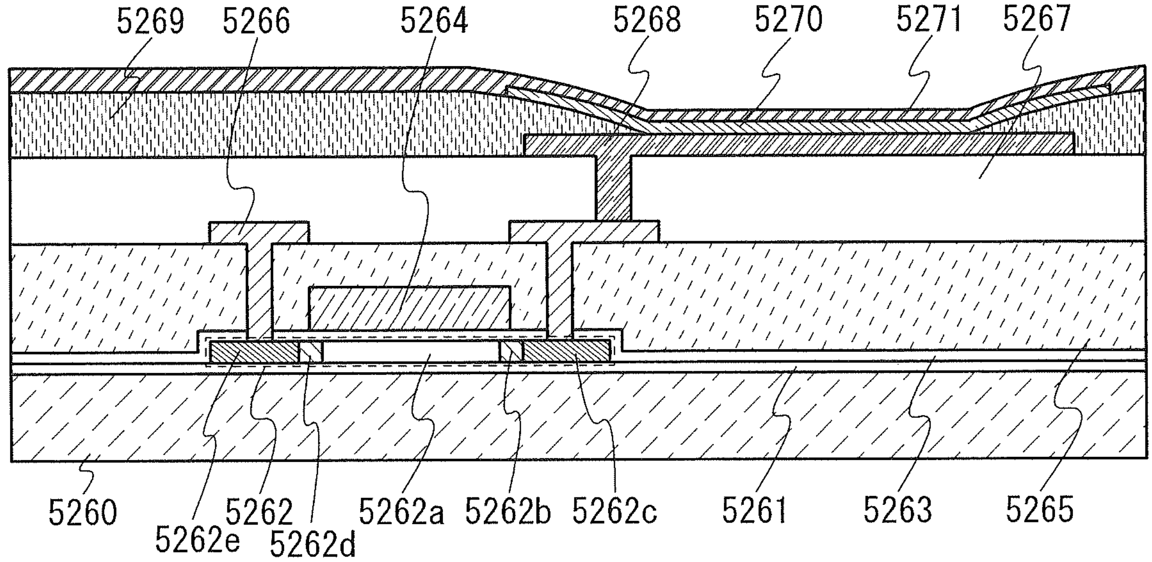
FIGS. 30A to 30C are cross-sectional views of a transistor.

FIG. 30A illustrates an example of a structure of a top-gate transistor. FIG. 30B illustrates an example of a structure of a bottom-gate transistor. FIG. 30C illustrates an example of a structure of a transistor formed using a semiconductor substrate.

FIG. 30A illustrates a substrate 5260; an insulating layer 5261 formed over the substrate 5260; a semiconductor layer 5262 which is formed over the insulating layer 5261 and is provided with a region 5262*a*, a region 5262*b*, a region 5262*c*, a region 5262*d*, and a region 5262*e*; an insulating layer 5263 formed so as to cover the semiconductor layer 5262; a conductive layer 5264 formed over the semiconductor layer 5262 and the insulating layer 5263; an insulating layer 5265 which is formed over the insulating layer 5263 and the conductive layer 5264 and is provided with openings; a conductive layer 5266 which is formed over the insulating layer 5265 and in the openings formed in the insulating layer 5265; an insulating layer 5267 which is formed over the conductive layer 5266 and the insulating layer 5265 and is provided with an opening; a conductive layer 5268 which is formed over the insulating layer 5267 and in the opening formed in the insulating layer 5267; an insulating layer 5269 which is formed over the insulating layer 5267 and the conductive layer 5268 and is provided with the opening; a light-emitting layer 5270 which is formed over the insulating layer 5269 and in the opening formed in the insulating layer 5269; and a conductive layer 5271 formed over the insulating layer 5269 and the light-emitting layer 5270.

Figure 30B:
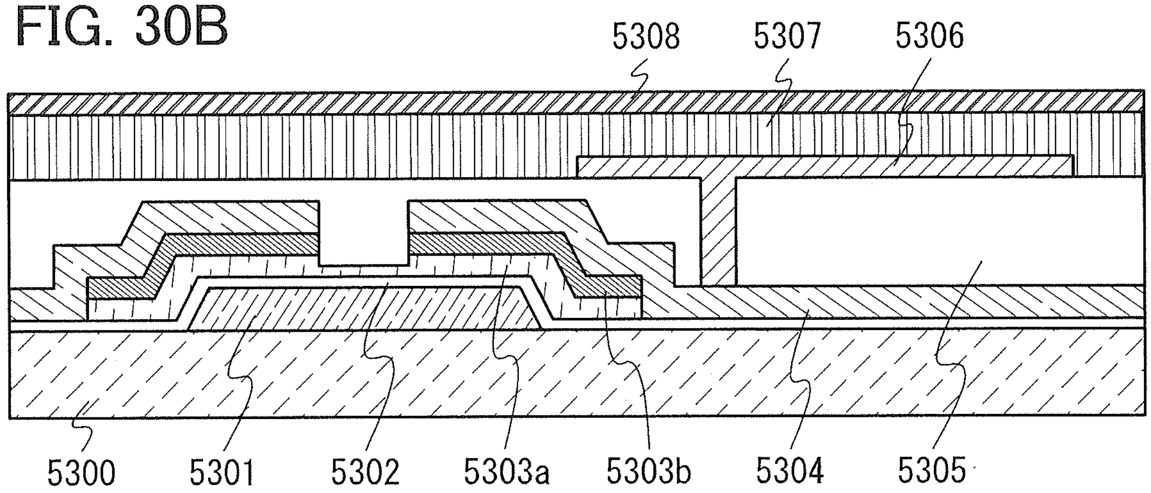

FIG. 30B illustrates a substrate 5300; a conductive layer 5301 formed over the substrate 5300; an insulating layer 5302 formed so as to cover the conductive layer 5301; a semiconductor layer 5303*a* formed over the conductive layer 5301 and the insulating layer 5302; a semiconductor layer 5303*b* formed over the semiconductor layer 5303*a*; a conductive layer 5304 formed over the semiconductor layer 5303*b* and the insulating layer 5302; an insulating layer 5305 which is formed over the insulating layer 5302 and the conductive layer 5304 and is provided with an opening; a conductive layer 5306 which is formed over the insulating layer 5305 and in the opening formed in the insulating layer 5305; a liquid crystal layer 5307 formed over the insulating layer 5305 and the conductive layer 5306; and a conductive layer 5308 formed over the liquid crystal layer 5307.

Figure 30C:
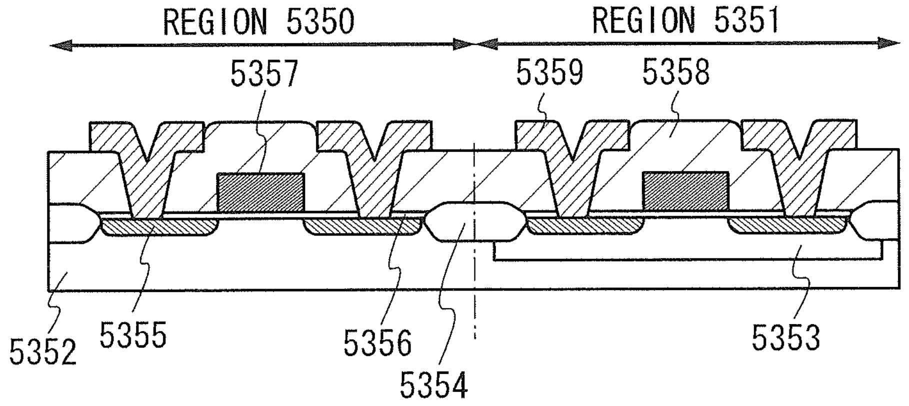

FIG. 30C illustrates a semiconductor substrate 5352 including a region 5353 and a region 5355; an insulating layer 5356 formed over the semiconductor substrate 5352; an insulating layer 5354 formed over the semiconductor substrate 5352; a conductive layer 5357 formed over the insulating layer 5356; an insulating layer 5358 which is formed over the insulating layer 5354, the insulating layer 5356, and the conductive layer 5357 and is provided with openings; and a conductive layer 5359 which is formed over the insulating layer 5358 and in the openings formed in the insulating layer 5358. Thus, a transistor is formed in each of a region 5350 and a region 5351.

The insulating layer 5261 can serve as a base film. The insulating layer 5354 serves as an element isolation layer (e.g., a field oxide film). Each of the insulating layer 5263, the insulating layer 5302, and the insulating layer 5356 can serve as a gate insulating film. Each of the conductive layer 5264, the conductive layer 5301, and the conductive layer 5357 can serve as a gate electrode. Each of the insulating layer 5265, the insulating layer 5267, the insulating layer 5305, and the insulating layer 5358 can serve as an interlayer film or a planarization film. Each of the conductive layer 5266, the conductive layer 5304, and the conductive layer 5359 can serve as a wiring, an electrode of a transistor, an electrode of a capacitor, or the like. Each of the conductive layer 5268 and the conductive layer 5306 can serve as a pixel electrode, a reflective electrode, or the like. The insulating layer 5269 can serve as a partition. Each of the conductive layer 5271 and the conductive layer 5308 can serve as a counter electrode, a common electrode, or the like.

As each of the substrate 5260 and the substrate 5300, a glass substrate, a quartz substrate, a silicon substrate (or a single crystal substrate), an SOI substrate, a plastic substrate, a metal substrate, a stainless steel substrate, a substrate including stainless steel foil, a tungsten substrate, a substrate including tungsten foil, a flexible substrate, or the like can be used, for example. As a glass substrate, a barium borosilicate glass substrate, an aluminoborosilicate glass substrate, or the like can be used, for example. For a flexible substrate, a flexible synthetic resin such as plastics typified by polyethylene terephthalate (PET), polyethylene naphthalate (PEN), and polyether sulfone (PES), or acrylic can be used, for example. Alternatively, an attachment film (formed using polypropylene, polyester, vinyl, polyvinyl fluoride, polyvinyl chloride, or the like), paper of a fibrous material, a base material film (formed using polyester, polyamide, an inorganic vapor deposition film, paper, or the like), or the like can be used.

As the semiconductor substrate 5352, for example, a single crystal silicon substrate having n-type or p-type conductivity can be used. Note that this embodiment is not limited to this example, and a substrate which is similar to the substrate 5260 can be used. For example, the region 5353 is a region where an impurity is added to the semiconductor substrate 5352 and serves as a well. For example, in the case where the semiconductor substrate 5352 has p-type conductivity, the region 5353 has n-type conductivity and serves as an n-well. On the other hand, in the case where the semiconductor substrate 5352 has n-type conductivity, the region 5353 has p-type conductivity and serves as a p-well. For example, the region 5355 is a region where an impurity is added to the semiconductor substrate 5352 and serves as a source region or a drain region. Note that an LDD region can be formed in the semiconductor substrate 5352.

For the insulating layer 5261, an insulating film or a layered structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y) can be used, for example. In an example in the case where the insulating film 5261 has a two-layer structure, a silicon nitride film and a silicon oxide film can be formed as a first insulating film and a second insulating film, respectively. In an example in the case where the insulating film 5261 has a three-layer structure, a silicon oxide film, a silicon nitride film, and a silicon oxide film can be formed as a first insulating film, a second insulating film, and a third insulating film, respectively.

For each of the semiconductor layer 5262, the semiconductor layer **5303*a*, and the semiconductor layer 5303*b***, for example, a non-single-crystal semiconductor (e.g., amorphous silicon, polycrystalline silicon, or microcrystalline silicon), a single crystal semiconductor, a compound semiconductor or an oxide semiconductor (e.g., ZnO, InGaZnO, SiGe, GaAs, IZO, ITO, SnO, TiO, or AlZnSnO (AZTO)), an organic semiconductor, a carbon nanotube, or the like can be used.

Note that for example, the region **5262*a* is an intrinsic region where an impurity is not added to the semiconductor layer 5262 and serves as a channel region. However, a slight amount of impurities can be added to the region 5262*a*. The concentration of the impurity added to the region 5262*a* is preferably lower than the concentration of an impurity added to the region 5262*b*, the region 5262*c*, the region 5262*d*, or the region 5262*e*. Each of the region 5262*b* and the region 5262*d* is a region to which an impurity is added at low concentration and serves as an LDD (lightly doped drain) region. Note that the region 5262*b* and the region 5262*d* can be eliminated. Each of the region 5262*c* and the region 5262*e*** is a region to which an impurity is added at high concentration and serves as a source region or a drain region.

Note that the semiconductor layer **5303*b* is a semiconductor layer to which phosphorus or the like is added as an impurity element and has n-type conductivity. Note that in the case where an oxide semiconductor or a compound semiconductor is used for the semiconductor layer 5303*a*, the semiconductor layer 5303*b*** can be eliminated.

For each of the insulating layer 5263, the insulating layer 5302, and the insulating layer 5356, a film containing oxygen or nitrogen, such as silicon oxide ($SiO_x$), silicon nitride ($SiN_x$), silicon oxynitride ($SiO_xN_y$) (x>y), silicon nitride oxide ($SiN_xO_y$) (x>>), or a layered structure thereof can be used, for example.

As each of the conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359, for example, a conductive film having a single-layer structure or a layered structure, or the like can be used. For example, for the conductive film, a single-layer film containing one element selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), phosphorus (P), boron (B), arsenic (As), gallium (Ga), indium (In), tin (Sn), oxygen (O), zirconium (Zr), and cerium (Ce); a compound containing one or more elements selected from the above group; or the like can be used. For example, the compound is an alloy containing one or more elements selected from the above group (e.g., an alloy material such as indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—Ta), aluminum-zirconium (Al—Zr), aluminum-titanium (Al—Ti), aluminum-cerium (Al—Ce), magnesium-silver (Mg—Ag), molybdenum-niobium (Mo—Nb), molybdenum-tungsten (Mo—W), or molybdenum-tantalum (Mo—Ta)); a compound containing nitrogen and one or more elements selected from the above group (e.g., a nitride film containing titanium nitride, tantalum nitride, molybdenum nitride, or the like); or a compound containing silicon and one or more elements selected from the above group (e.g., a silicide film containing tungsten silicide, titanium silicide, nickel silicide, aluminum silicon, or molybdenum silicon); or the like. Alternatively, a nanotube material such as a carbon nanotube, an organic nanotube, an inorganic nanotube, or a metal nanotube can be used.

Note that silicon (Si) can contain an n-type impurity (e.g., phosphorus) or a p-type impurity (e.g., boron).

Note that in the case where copper is used for the conductive layer, a layered structure is preferably used in order to improve adhesion.

Note that for a conductive layer which is in contact with an oxide semiconductor or silicon, molybdenum or titanium is preferably used.

Note that by using an alloy material containing neodymium and aluminum for the conductive layer, aluminum does not easily cause hillocks.

Note that in the case where a semiconductor material such as silicon is used for the conductive layer, the semiconductor material such as silicon can be formed at the same time as a semiconductor layer of a transistor.

Note that since ITO, IZO, ITSO, ZnO, Si, SnO, CTO, a carbon nanotube, or the like has light-transmitting properties, such a material can be used for a portion through which light passes, such as a pixel electrode, a counter electrode, or a common electrode. Note that by using a layered structure containing a low-resistance material (e.g., aluminum), wiring resistance can be lowered.

Note that by using a layered structure where a low heat-resistance material (e.g., aluminum) is interposed between high heat-resistance materials (e.g., molybdenum, titanium, or neodymium), advantages of the low heat-resistance material can be effectively utilized and heat resistance of a wiring, an electrode, or the like can be increased.

Note that a material whose properties are changed by reaction with a different material can be interposed between or covered with materials which do not easily react with the different material. For example, in the case where ITO and aluminum are connected to each other, titanium, molybdenum, or an alloy of neodymium can be interposed between ITO and aluminum. For example, in the case where silicon and aluminum are connected to each other, titanium, molybdenum, or an alloy of neodymium can be interposed between silicon and aluminum. Note that such a material can be used for a wiring, an electrode, a conductive layer, a conductive film, a terminal, a via, a plug, or the like.

For each of the insulating layer 5265, the insulating layer 5267, the insulating layer 5269, the insulating layer 5305, and the insulating layer 5358, an insulating film having a single-layer structure or a layered structure, or the like can be used, for example. For example, as the insulating film, an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as diamond-like carbon (DLC); an organic material such as a siloxane resin, epoxy, polyimide, polyamide, polyvinyl phenol, benzocyclobutene, or acrylic; or the like can be used.

For the light-emitting layer 5270, an organic EL element, an inorganic EL element, or the like can be used, for example. For the organic EL element, for example, a single-layer structure or a layered structure of a hole injection layer formed using a hole injection material, a hole transport layer formed using a hole transport material, a light-emitting layer formed using a light-emitting material, an electron transport layer formed using an electron transport material, an electron injection layer formed using an electron injection material, or a layer in which a plurality of these materials are mixed can be used.

Note that an insulating layer which serves as an alignment film, an insulating layer which serves as a protrusion portion, or the like can be formed over the insulating layer 5305 and the conductive layer 5306.

Note that an insulating layer or the like which serves as a color filter, a black matrix, or a protrusion portion can be formed over the conductive layer 5308. An insulating layer which serves as an alignment film can be formed below the conductive layer 5308.

Note that the insulating layer 5269, the light-emitting layer 5270, and the conductive layer 5271 can be eliminated in the cross-sectional structure in FIG. 30A, and the liquid crystal layer 5307 and the conductive layer 5308 which are illustrated in FIG. 30B can be formed over the insulating layer 5267 and the conductive layer 5268.

Note that the liquid crystal layer 5307 and the conductive layer 5308 can be eliminated in the cross-sectional structure in FIG. 30B, and the insulating layer 5269, the light-emitting layer 5270, and the conductive layer 5271 which are illustrated in FIG. 30A can be formed over the insulating layer 5305 and the conductive layer 5306.

Note that in the cross-sectional structure in FIG. 30C, the insulating layer 5269, the light-emitting layer 5270, and the conductive layer 5271 which are illustrated in FIG. 30A can be formed over the insulating layer 5358 and the conductive layer 5359.

Alternatively, the liquid crystal layer 5307 and the conductive layer 5308 which are illustrated in FIG. 30B can be formed over the insulating layer 5267 and the conductive layer 5268.

The above is the description of one example of the structure of the transistor in this embodiment. The transistor in this embodiment can be applied to Embodiments 1 to 8. Specifically, in the case where a non-single-crystal semiconductor, a microcrystalline semiconductor, an organic semiconductor, an oxide semiconductor, or the like is used as the semiconductor layer in FIG. 30B, the transistor deteriorates in some cases. However, deterioration of the transistor in the semiconductor device, the shift register, or the display device in Embodiments 1 to 8 can be suppressed, which is advantageous.

Embodiment 10

In this embodiment, a layout view (hereinafter also referred to as a top view) of a shift register will be described. In this embodiment, for example, a layout view of the shift register in Embodiment 4 will be described. Note that a content described in this embodiment can be applied to the semiconductor device, the shift register, or the display device in Embodiments 1 to 9 in addition to the shift register in Embodiment 4. Note that the layout view in this embodiment is one example and this embodiment is not limited to this example.

Figure 31:
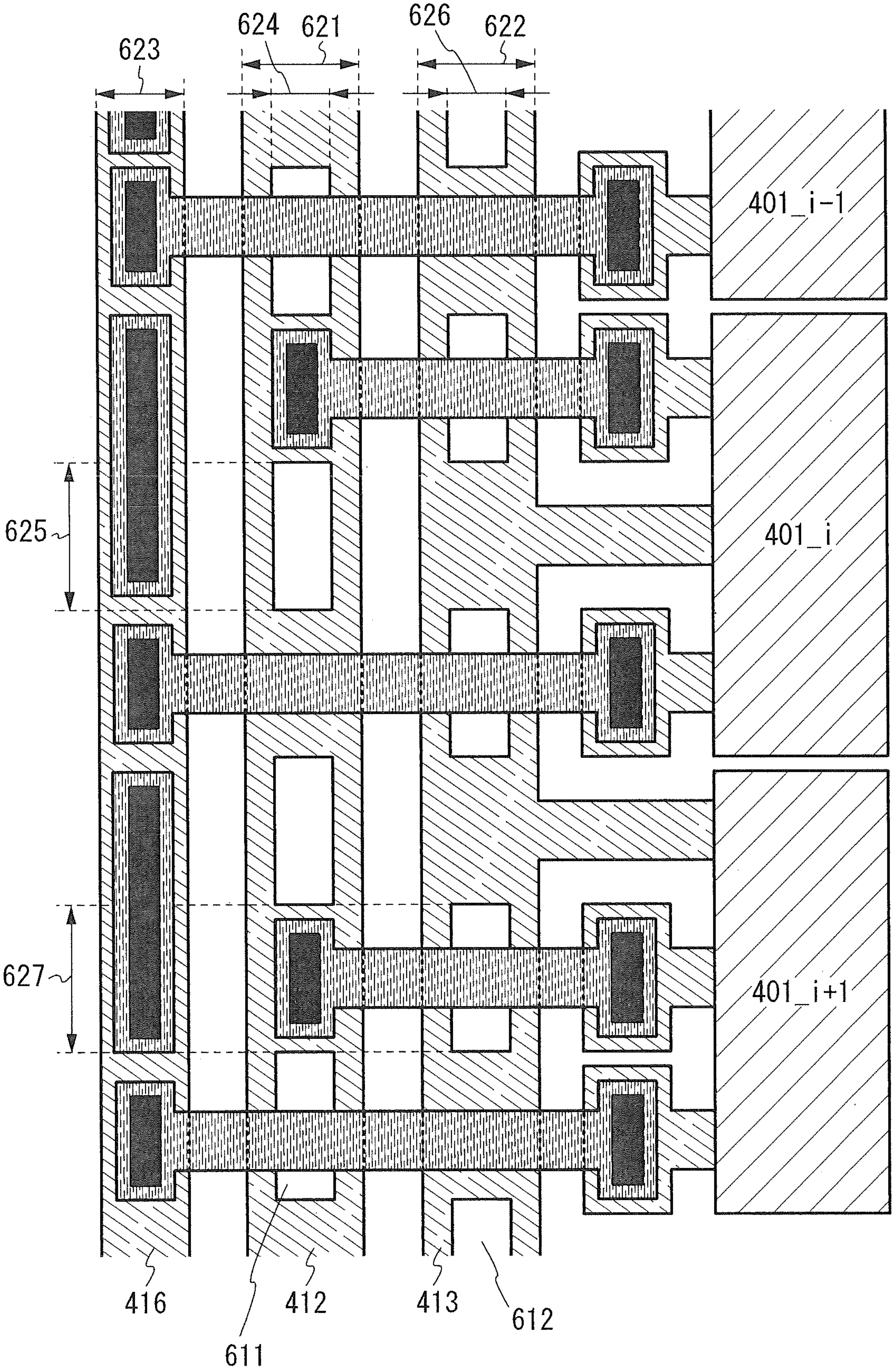
FIG. 31 is a layout view of a shift register.
Figure 32:
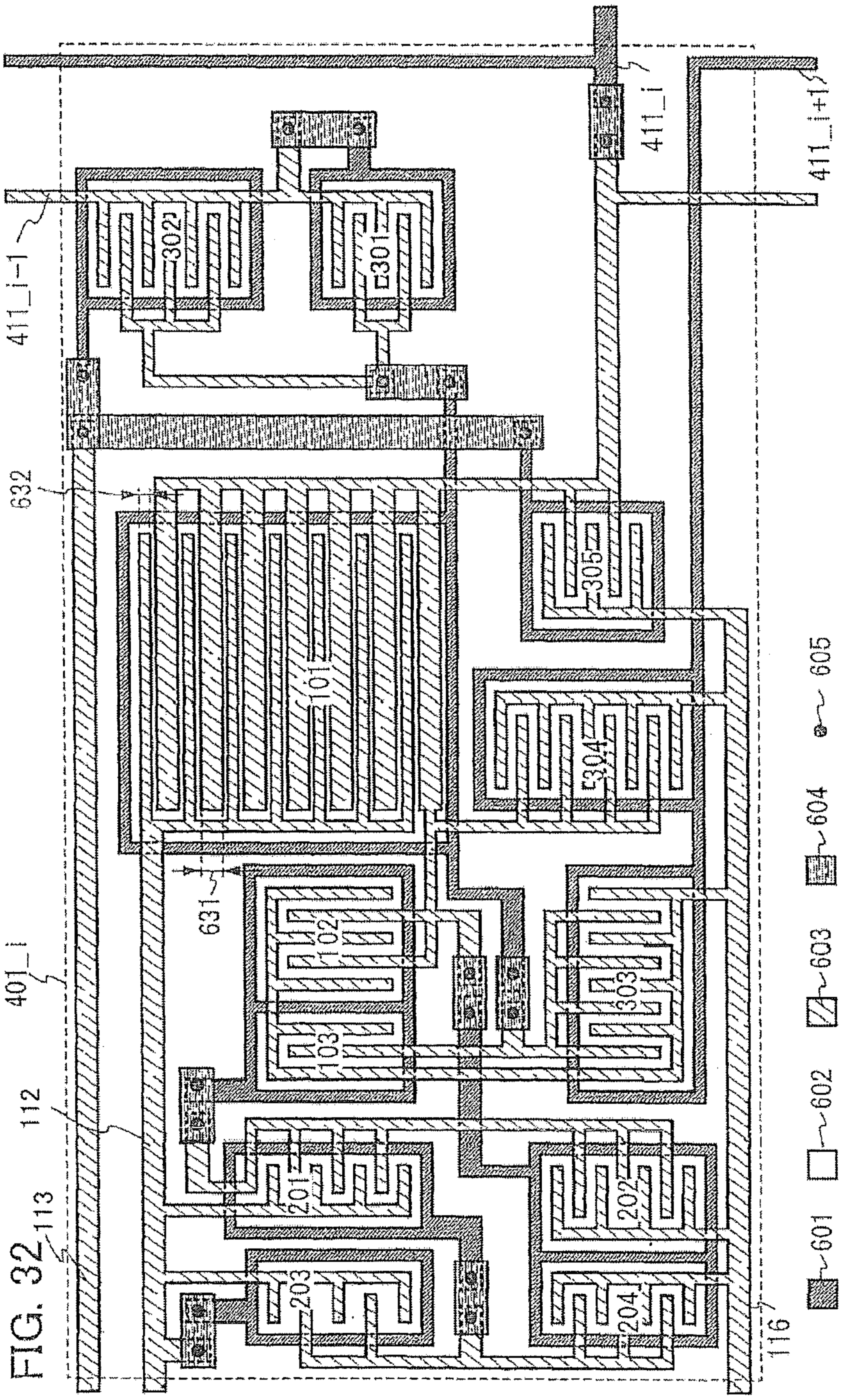
FIG. 32 is a layout view of a shift register.

The layout view in this embodiment is described with reference to FIG. 31 and FIG. 32. FIG. 31 illustrates one example of a layout view of part of the shift register. FIG. 32 illustrates a layout view of the flip-flop 401_*i*, for example.

A transistor, a wiring, and the like shown in FIG. 31 and FIG. 32 each include a conductive layer 601, a semiconductor layer 602, a conductive layer 603, a conductive layer 604, and a contact hole 605. However, this embodiment is not limited to this example. A different conductive layer, insulating film, or a different contact hole can be newly formed. For example, a contact hole which connects the conductive layer 601 to the conductive layer 603 can be additionally provided.

The conductive layer 601 can include a portion which functions as a gate electrode or a wiring. The semiconductor layer 602 can include a portion which functions as a semiconductor layer of the transistor. The conductive layer 603 can include a portion which functions as a wiring or a source or drain. The conductive layer 604 can include a portion which functions as a transparent electrode, a pixel electrode, or a wiring. The contact hole 605 has a function of connecting the conductive layer 601 and the conductive layer 604 with each other or connecting the conductive layer 603 and the conductive layer 604 with each other.

In the example in FIG. 31, the wiring 412 includes an opening portion 611 and the wiring 413 includes an opening portion 612. In this manner, since the wiring 412 and the wiring 413 include the opening portions, parasitic capacitance can be reduced. Alternatively, the breakdown of the transistor due to electrostatic discharge can be suppressed. However, this embodiment is not limited to this example. As in the case of the wiring 416, the opening portion 611 or the opening portion 612 can be eliminated. Alternatively, like in the case of the wiring 412 or the wiring 413, an opening portion can be provided for the wiring 416.

In the example in FIG. 31, by provision of an opening portion in part of an intersection portion of the wiring 412 or the wiring 413 and a different wiring, the cross-over capacitance of the wiring can be reduced. Accordingly, reduction in noise or reduction in delay or distortion of a signal can be achieved.

In the example in FIG. 31, the conductive layer 604 is formed over part of the conductive layer 603 which the wiring 416 includes. In addition, the conductive layer 604 is connected to the conductive layer 603 through the contact hole 605. In this manner, since wiring resistance can be made low, suppression of voltage drop or reduction in delay or distortion of a signal can be achieved. However, this embodiment is not limited to this example. The conductive layer 604 and the contact hole 605 can be eliminated. Alternatively, like in the case of the wiring 416, the conductive layer 604 can be formed over part of the conductive layer 603 which the wiring 412 or the wiring 413 includes so that the conductive layer 604 can be connected to the conductive layer 603.

Here, in the example in FIG. 31, the width of the wiring 412, the width of the wiring 413, and the width of the wiring 416 are referred to as wiring width 621, wiring width 622, and width 623, respectively. Then, the width of the opening portion 611, the length of the opening portion 611, the width of the opening portion 612, and the length of the opening portion 612 are referred to as width 624, length 625, width 626, and length 627, respectively.

Note that signals input to the wiring 412 and the wiring 413 are inverted signals of each other in many cases. Therefore, the wiring resistance or the parasitic capacitance of the wiring 412 is preferably set so as to be approximately equal to that of the wiring 413. Accordingly, the wiring 412 preferably includes a portion whose width is approximately equal to the wiring width 622. Alternatively, the opening portion 611 preferably includes a portion whose width is approximately equal to the width 626 of the opening portion 612 or a portion whose length is approximately equal to the length 627 of the opening portion 612. However, this embodiment is not limited to this example. The wiring width 621, the wiring width 622, the width 624 of the opening portion 611, the length 625 of the opening portion 611, or the length 627 of the opening portion 612 can have a variety of values. For example, when the cross-over capacitance of the wiring 412 and a different wiring is higher than that of the wiring 413 and a different wiring, delay or distortion of signals input to the wiring 412 and the wiring 413 can be made approximately the same by decreasing the wiring resistance of the wiring 412. Therefore, the wiring 412 can include a portion which is wider than the wiring width 622. Alternatively, the opening portion 611 can include a portion which is narrower than the width 626 of the opening portion 612. Alternatively, the opening portion 611 can include a portion which is shorter than the length 627 of the opening portion 612. On the other hand, when the cross-over capacitance of the wiring 412 and a different wiring is lower than that of the wiring 413 and a different wiring, the wiring 412 can include a portion which is narrower than the wiring width 622. Alternatively, the opening portion 611 can include a portion which is wider than the width 626 of the opening portion 612. Alternatively, the opening portion 611 can include a portion which is longer than the length 627 of the opening portion 612.

In the case where the wiring 416 does not include the opening portion, the wiring 416 preferably includes a portion which is narrower than the wiring width 621 or the wiring width 622. This is because the wiring 416 does not include an opening portion, and the wiring resistance of the wiring 416 is low. However, this embodiment is not limited to this example. The wiring 416 can include a portion which is wider than the wiring width 621 or the wiring width 622.

In the example in FIG. 32, in the transistor 101, the transistor 102, the transistor 103, the transistor 201, the transistor 202, the transistor 203, the transistor 204, the transistor 301, the transistor 302, the transistor 303, the transistor 304, and/or the transistor 305, an area where the conductive layers 601 and the conductive layers 603 of the second terminals overlap with each other is preferably smaller than an area where the conductive layers 601 and the conductive layers 603 of the first terminals overlap with each other. In this manner, reduction in noise of the gate of the transistor 101 or the wiring 401_*i* can be achieved. Alternatively, since concentration of an electric field on the second terminal can be suppressed, deterioration of the transistor or the breakdown of the transistor can be suppressed.

The above is the description of one example of the layout view of the shift register. However, as described above, the layout view of this embodiment is one example and this embodiment is not limited to this example.

Note that the semiconductor layer 602 can be provided for a portion in which the conductive layer 601 and the conductive layer 603 overlap with each other. Accordingly, the parasitic capacitance between the conductive layer 601 and the conductive layer 603 can be reduced, whereby reduction in noise can be achieved. Because of a similar reason, the semiconductor layer 602 or the conductive layer 603 can be provided for a portion in which the conductive layer 601 and the conductive layer 604 overlap with each other.

Note that the conductive layer 604 can be formed over part of the conductive layer 601 and can be connected to the conductive layer 601 through the contact hole 605. Accordingly, wiring resistance can be reduced. Alternatively, the conductive layer 603 and the conductive layer 604 can be formed over part of the conductive layer 601, so that the conductive layer 601 is connected to the conductive layer 604 through the contact hole 605 and the conductive layer 603 can be connected to the conductive layer 604 through the different contact hole 605. In this manner, the wiring resistance can be further reduced.

Note that the conductive layer 604 can be formed over part of the conductive layer 603, so that the conductive layer 603 can be connected to the conductive layer 604 through the contact hole 605. In this manner, wiring resistance can be reduced.

Note that the conductive layer 601 or the conductive layer 603 can be formed under part of the conductive layer 604, so that the conductive layer 604 can be connected to the conductive layer 601 or the conductive layer 603 through the contact hole 605. In this manner, wiring resistance can be reduced.

Note that as described in Embodiment 1, the parasitic capacitance between the gate and the second terminal of the transistor 101 can be higher than the parasitic capacitance between the gate and the first terminal of the transistor 101. As shown in FIG. 32, the width of the conductive layer 603 which can function as a first electrode of the transistor 101 is referred to as width 631 and the width of the conductive layer 603 which can function as a second electrode of the transistor 101 is referred to as width 632. In addition, the width 631 can be larger than the width 632. In this manner, as described in Embodiment 1, the parasitic capacitance between the gate and the second terminal of the transistor 101 can be higher than the parasitic capacitance between the gate and the first terminal of the transistor 101. However, this embodiment is not limited to this example.

Embodiment 11

In this embodiment, examples of electronic devices are described.

FIGS. 33A to 33H and FIGS. 34A to 34D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 33A:
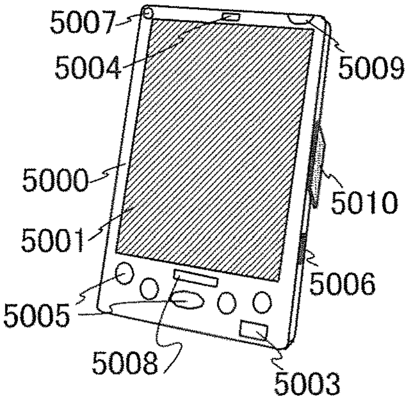
FIGS. 33A to 33H are diagrams illustrating electronic devices.
Figure 33B:
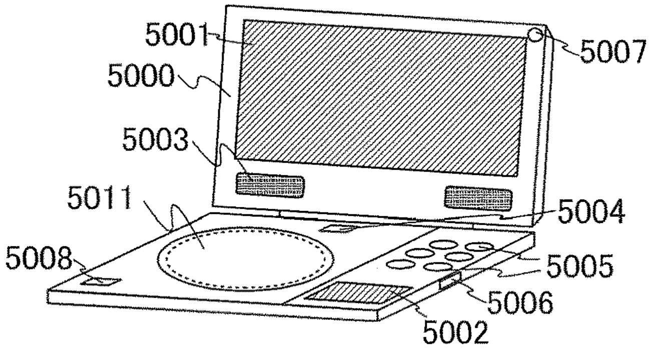
Figure 33C:
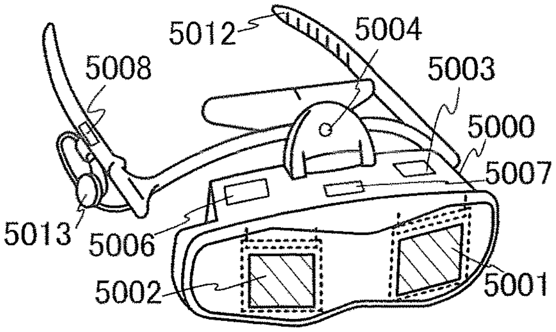
Figure 33D:
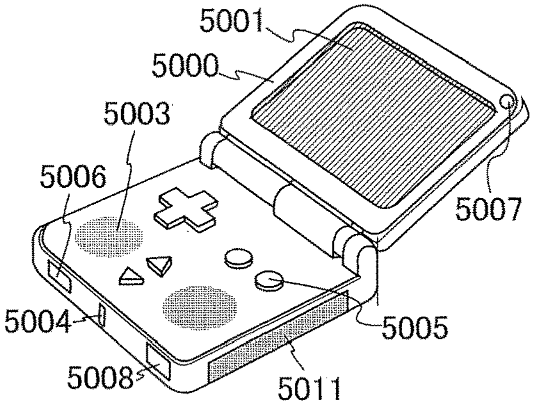
Figure 33E:
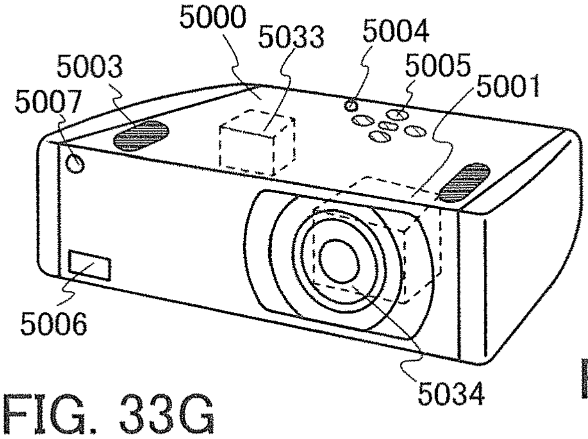
Figure 33F:
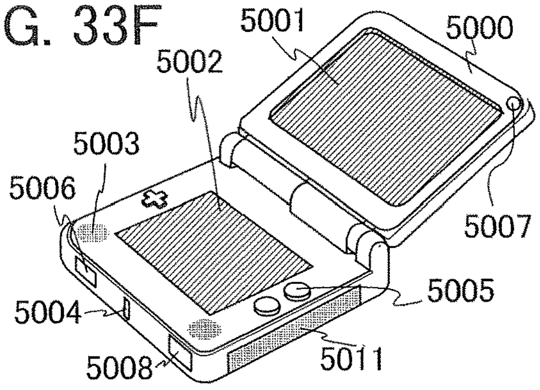
Figure 33G:
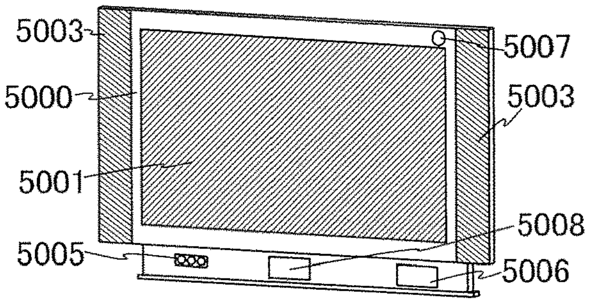
Figure 33H:
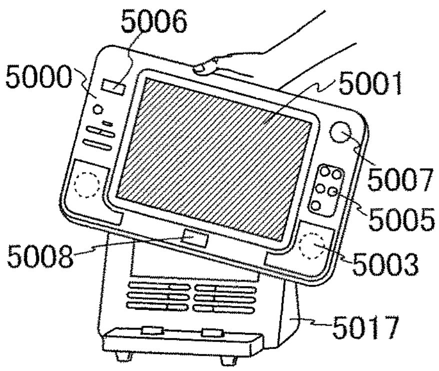
Figure 34A:
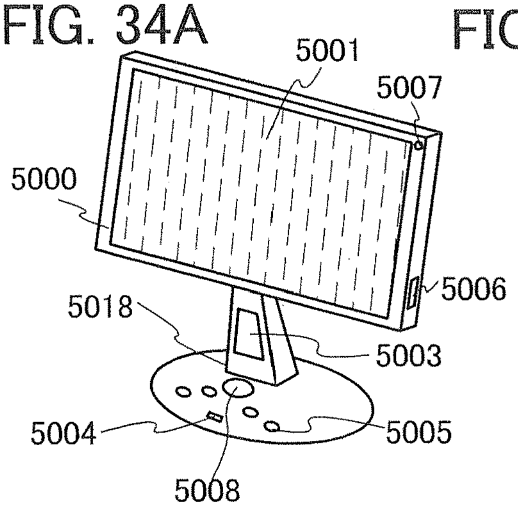
FIGS. 34A to 34H are diagrams illustrating electronic devices.
Figure 34B:
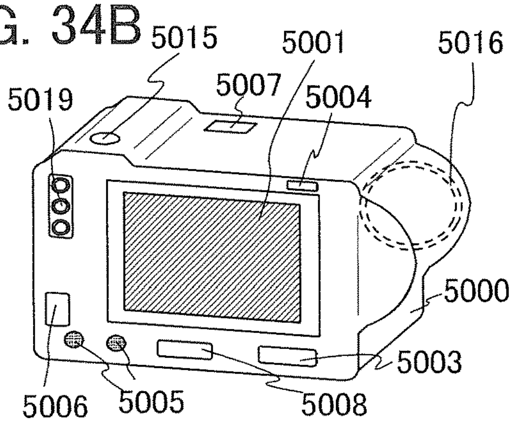
Figure 34C:
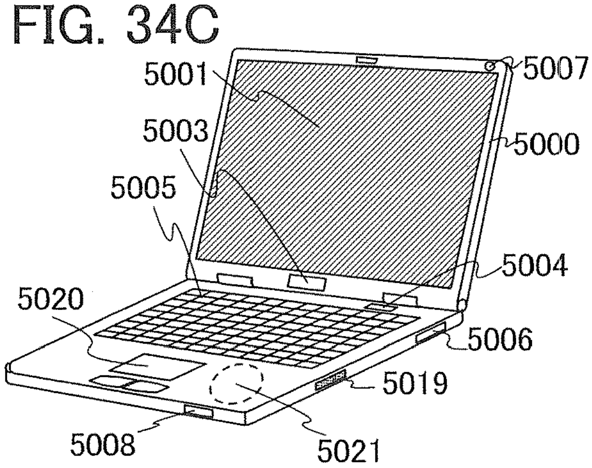
Figure 34D:
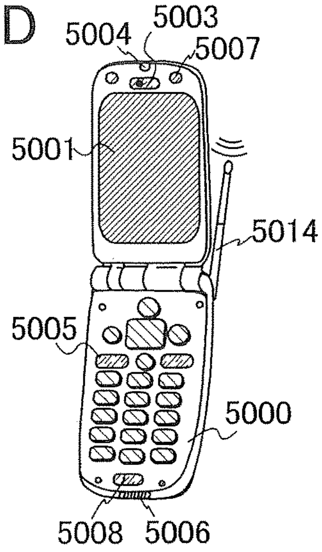

FIG. 33A illustrates a mobile computer, which can include a switch 5009, an infrared port 5010, and the like in addition to the above objects. FIG. 33B illustrates a portable image reproducing device provided with a memory medium (e.g., a DVD regenerating device), which can include a second display portion 5002, a memory medium reading portion 5011, and the like in addition to the above objects. FIG. 33C illustrates a goggle-type display, which can include the second display portion 5002, a support portion 5012, an earphone 5013, and the like in addition to the above objects. FIG. 33D illustrates a portable game machine, which can include the memory medium reading portion 5011 and the like in addition to the above objects. FIG. 33E illustrates a projector, which can include a light source 5033, a projector lens 5034, and the like in addition to the above objects. FIG. 33F illustrates a portable game machine, which can include the second display portion 5002, the memory medium reading portion 5011, and the like in addition to the above objects. FIG. 33G illustrates a television receiver, which can include a tuner, an image processing portion, and the like in addition to the above objects. FIG. 33H illustrates a portable television receiver, which can include a charger 5017 capable of transmitting and receiving signals and the like in addition to the above objects. FIG. 34A illustrates a display, which can include a support base 5018 and the like in addition to the above objects. FIG. 34B illustrates a camera, which can include an external connecting port 5019, a shutter button 5015, an image receiving portion 5016, and the like in addition to the above objects. FIG. 34C illustrates a computer, which can include a pointing device 5020, the external connecting port 5019, a reader/writer 5021, and the like in addition to the above objects. FIG. 34D illustrates a mobile phone, which can include an antenna 5014, a tuner of one-segment partial reception service for mobile phones and mobile terminals, and the like in addition to the above objects.

The electronic devices illustrated in FIGS. 33A to 33H and FIGS. 34A to 34D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; and a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 33A to 33H and FIGS. 34A to 34D are not limited to them, and the electronic devices can have a variety of functions.

The electronic devices described in this embodiment each include a display portion for displaying some kind of information. By a combination of the electronic device in this embodiment and the semiconductor device, the shift register, or the display device in Embodiments 1 to 9, improved reliability, improved yield, cost reduction, a large display portion, a display portion with high definition, or the like can be achieved.

Next, applications of semiconductor devices are described.

Figure 34E:
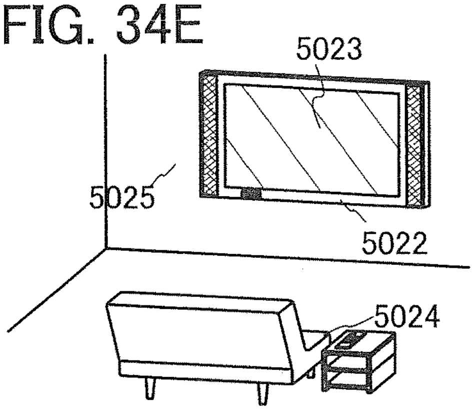

FIG. 34E illustrates an example in which a semiconductor device is incorporated in a building structure. FIG. 34E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 34F:
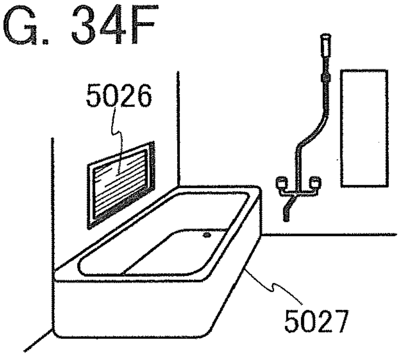

FIG. 34F illustrates another example in which a semiconductor device is incorporated in a building structure. A display panel 5026 is incorporated in a prefabricated bath unit 5027, so that a bather can view the display panel 5026.

Note that although this embodiment describes the wall and the prefabricated bath are given as examples of the building structures, this embodiment is not limited to them. The semiconductor devices can be provided in a variety of building structures.

Next, examples in which semiconductor devices are incorporated in moving objects are described.

Figure 34G:
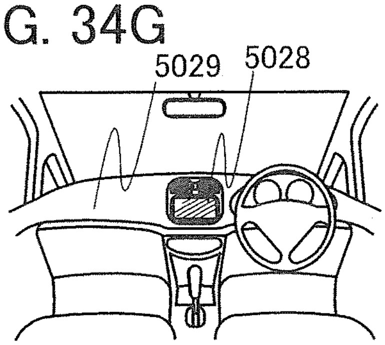

FIG. 34G illustrates an example in which a semiconductor device is incorporated in a car. A display panel 5028 is incorporated in a car body 5029 of the car and can display information related to the operation of the car or information input from inside or outside of the car on demand. Note that the display panel 5028 may have a navigation function.

Figure 34H:
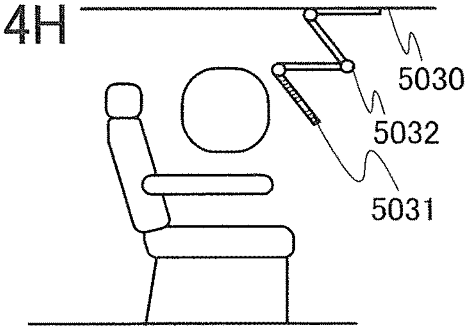

FIG. 34H illustrates an example in which a semiconductor device is incorporated in a passenger airplane. FIG. 34H illustrates a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are illustrated as examples of moving objects in this embodiment, this embodiment is not limited to them. The semiconductor device can be provided for a variety of objects such as two-wheeled vehicles, four-wheeled vehicles (including cars, buses, and the like), trains (including monorails, railroads, and the like), and vessels.

This application is based on Japanese Patent Application serial no. 2009-007419 filed with Japan Patent Office on Jan. 16, 2009, the entire contents of which are hereby incorporated by reference.

What is claimed is:

1. A semiconductor device comprising:

a first transistor, wherein one of a source electrode and a drain electrode of the first transistor is electrically connected to a scan line, wherein the other of the source electrode and the drain electrode of the first transistor is electrically connected to a clock signal line, wherein in a plan view, an area where a first conductive layer serving as the one of the source electrode and the drain electrode of the first transistor and a second conductive layer serving as a gate electrode of the first transistor overlapping with each other is larger than an area where a third conductive layer serving as the other of the source electrode and the drain electrode of the first transistor and the second conductive layer overlapping with each other, wherein in the plan view, the first conductive layer comprises a first region overlapping with the second conductive layer and sandwiched between regions of the third conductive layer, wherein in the plan view, the third conductive layer comprises a second region overlapping with the second conductive layer and sandwiched between regions of the first conductive layer, and wherein a width of the first conductive layer in the first region is larger than a width of the third conductive layer in the second region.

2. The semiconductor device according to claim 1, wherein the first conductive layer is electrically connected to the scan line through a transparent electrode.

3. The semiconductor device according to claim 2, wherein the first conductive layer comprises a third region overlapping with the transparent electrode, and wherein a width of the first conductive layer in the third region is larger than the width of the third conductive layer in the second region.

4. The semiconductor device according to claim 1, wherein a potential of the gate electrode of the first transistor can be higher than a high level potential of the clock signal line.

5. The semiconductor device according to claim 1, wherein a potential of the gate electrode of the first transistor can be lower than a low level potential of the clock signal line.

6. A semiconductor device comprising:

a first transistor; and a second transistor, wherein one of a source electrode and a drain electrode of the first transistor is electrically connected to a scan line, wherein one of a source electrode and a drain electrode of the second transistor is electrically connected to the scan line, wherein the other of the source electrode and the drain electrode of the first transistor is electrically connected to a clock signal line, wherein the other of the source electrode and the drain electrode of the second transistor is electrically connected to a power supply line, wherein in a plan view, an area where a first conductive layer serving as the one of the source electrode and the drain electrode of the first transistor and a second conductive layer serving as a gate electrode of the first transistor overlapping with each other is larger than an area where a third conductive layer serving as the other of the source electrode and the drain electrode of the first transistor and the second conductive layer overlapping with each other, wherein in the plan view, an area where the first conductive layer serving as the one of the source electrode and the drain electrode of the second transistor and a fourth conductive layer serving as a gate electrode of the second transistor overlapping with each other is smaller than an area where a fifth conductive layer serving as the other of the source electrode and the drain electrode and the fourth conductive layer overlapping with each other, wherein in the plan view, the first conductive layer comprises a first region overlapping with the second conductive layer and sandwiched between regions of the third conductive layer, wherein in the plan view, the third conductive layer comprises a second region overlapping with the second conductive layer and sandwiched between regions of the first conductive layer, and wherein a width of the first conductive layer in the first region is larger than a width of the third conductive layer in the second region.

7. The semiconductor device according to claim 6, wherein the first conductive layer is electrically connected to the scan line through a transparent electrode.

8. The semiconductor device according to claim 7, wherein the first conductive layer comprises a third region overlapping with the transparent electrode, and wherein a width of the first conductive layer in the third region is larger than the width of the third conductive layer in the second region.

9. The semiconductor device according to claim 6,
wherein in the plan view, the first conductive layer comprises a third region overlapping with the fourth conductive layer and sandwiched between regions of the fifth conductive layer,
wherein in the plan view, the fifth conductive layer comprises a fourth region overlapping with the fourth conductive layer and sandwiched between regions of the first conductive layer,
wherein the width of the first conductive layer in the first region is larger than a width of the first conductive layer in the third region, and
wherein the width of the first conductive layer in the first region is larger than a width of the fifth conductive layer in the fourth region.

10. The semiconductor device according to claim 9, wherein the first conductive layer is electrically connected to the scan line through a transparent electrode.

11. The semiconductor device according to claim 10,
wherein the first conductive layer comprises a fifth region overlapping with the transparent electrode, and
wherein a width of the first conductive layer in the fifth region is larger than the width of the third conductive layer in the second region.

12. The semiconductor device according to claim 11,
wherein the width of the first conductive layer in the fifth region is larger than a width of the third conductive layer in the first region, and
wherein the width of the first conductive layer in the fifth region is larger than the width of the fifth conductive layer in the fourth region.

13. The semiconductor device according to claim 6, wherein a potential of the gate electrode of the first transistor can be higher than a high level potential of the clock signal line.

14. The semiconductor device according to claim 6, wherein a potential of the gate electrode of the first transistor can be lower than a low level potential of the clock signal line.

* * * * *